(12) United States Patent
Yamazaki et al.

(10) Patent No.: US 7,786,482 B2
(45) Date of Patent: Aug. 31, 2010

(54) DIODE AND DISPLAY DEVICE INCLUDING DIODE

(75) Inventors: Shunpei Yamazaki, Setagaya (JP); Kunio Hosoya, Atsugi (JP); Yasutaka Suzuki, Atsugi (JP); Saishi Fujikawa, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 63 days.

(21) Appl. No.: 12/336,614

(22) Filed: Dec. 17, 2008

(65) Prior Publication Data

US 2009/0159885 A1    Jun. 25, 2009

(30) Foreign Application Priority Data

Dec. 21, 2007   (JP)   ............... 2007-330944

(51) Int. Cl.
  *H01L 29/04*   (2006.01)
(52) U.S. Cl. .............. 257/66; 257/72; 349/42
(58) Field of Classification Search ............ 257/66, 257/72; 349/42, 43
  See application file for complete search history.

(56) References Cited

U.S. PATENT DOCUMENTS

| | | | |
|---|---|---|---|
| 4,409,134 A | 10/1983 | Yamazaki | |
| 4,464,415 A | 8/1984 | Yamazaki | |
| 4,581,620 A | 4/1986 | Yamazaki et al. | |
| 5,091,334 A | 2/1992 | Yamazaki et al. | |
| 5,262,350 A | 11/1993 | Yamazaki et al. | |
| RE34,658 E | 7/1994 | Yamazaki et al. | |
| 5,453,858 A | 9/1995 | Yamazaki | |
| 5,514,879 A | 5/1996 | Yamazaki | |
| 5,591,987 A | 1/1997 | Yamazaki et al. | |
| 5,614,732 A | 3/1997 | Yamazaki | |
| 5,701,167 A | 12/1997 | Yamazaki | |
| 5,849,601 A | 12/1998 | Yamazaki | |
| 5,859,443 A | 1/1999 | Yamazaki et al. | |
| 5,859,445 A | 1/1999 | Yamazaki | |
| 6,011,277 A | 1/2000 | Yamazaki | |
| 6,023,075 A | 2/2000 | Yamazaki | |
| 6,252,249 B1 | 6/2001 | Yamazaki | |
| 6,281,520 B1 | 8/2001 | Yamazaki | |

(Continued)

FOREIGN PATENT DOCUMENTS

JP    58-092217    6/1983

(Continued)

*Primary Examiner*—Thomas L Dickey
(74) *Attorney, Agent, or Firm*—Eric J. Robinson; Robinson Intellectual Property Law Office, P.C.

(57) ABSTRACT

A thin film transistor which includes a microcrystalline semiconductor film over a gate electrode with a gate insulating film interposed therebetween to be in an inner region in which end portions of microcrystalline semiconductor film are in an inside of end portions of the gate electrode, an amorphous semiconductor film which covers top and side surfaces of the microcrystalline semiconductor film, and an impurity semiconductor film to which an impurity element imparting one conductivity is added, and which forms a source region and a drain region, wherein the microcrystalline semiconductor film includes an impurity element serving as a donor is provided to reduce off current of a thin film transistor, to reduce reverse bias current of a diode, and to improve an image quality of a display device using a thin film transistor.

13 Claims, 34 Drawing Sheets

U.S. PATENT DOCUMENTS

| | | |
|---|---|---|
| 6,306,213 B1 | 10/2001 | Yamazaki |
| 6,355,941 B1 | 3/2002 | Yamazaki et al. |
| 6,737,676 B2 | 5/2004 | Yamazaki |
| 6,900,463 B1 | 5/2005 | Yamazaki et al. |
| 7,067,844 B2 | 6/2006 | Yamazaki |
| 7,098,479 B1 | 8/2006 | Yamazaki |
| 7,115,902 B1 | 10/2006 | Yamazaki |
| 2007/0018165 A1 | 1/2007 | Yamazaki |

FOREIGN PATENT DOCUMENTS

| | | |
|---|---|---|
| JP | 04-242724 | 8/1992 |
| JP | 06-326312 | 11/1994 |
| JP | 2005-049832 | 2/2005 |

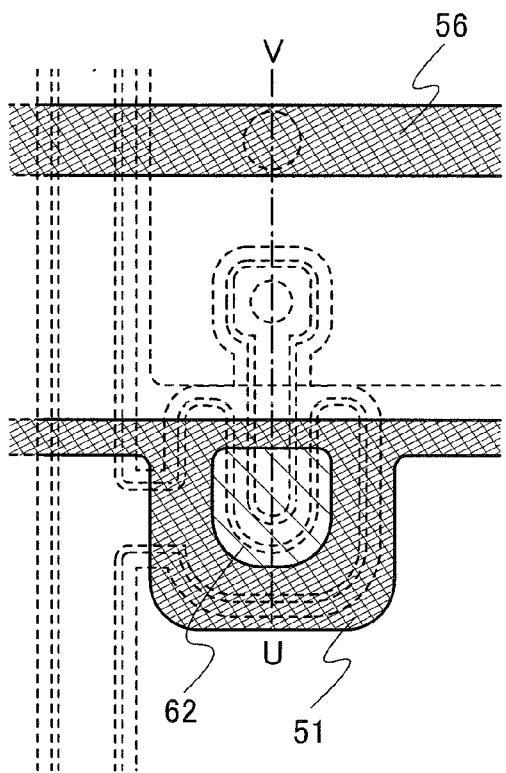
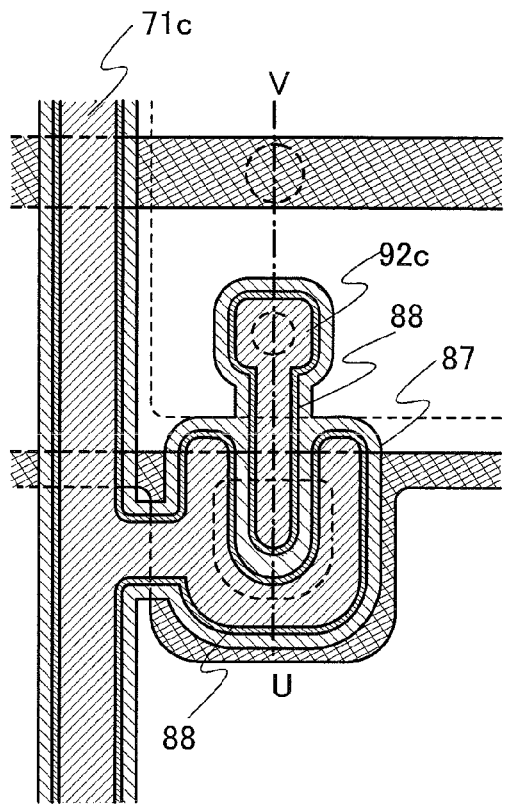
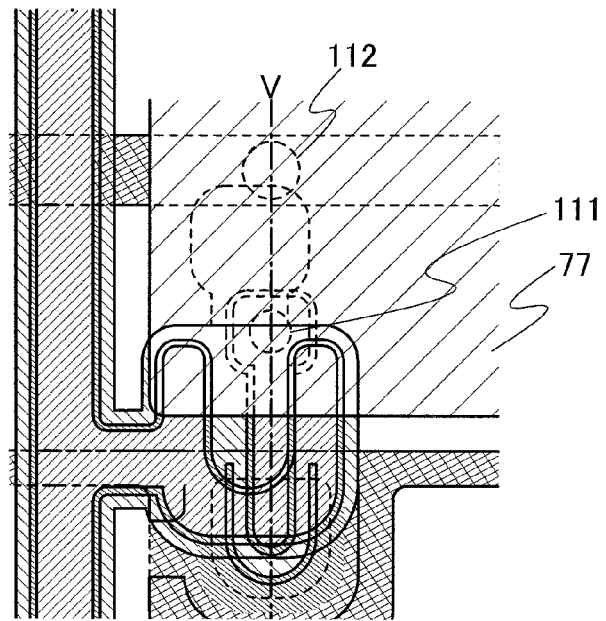

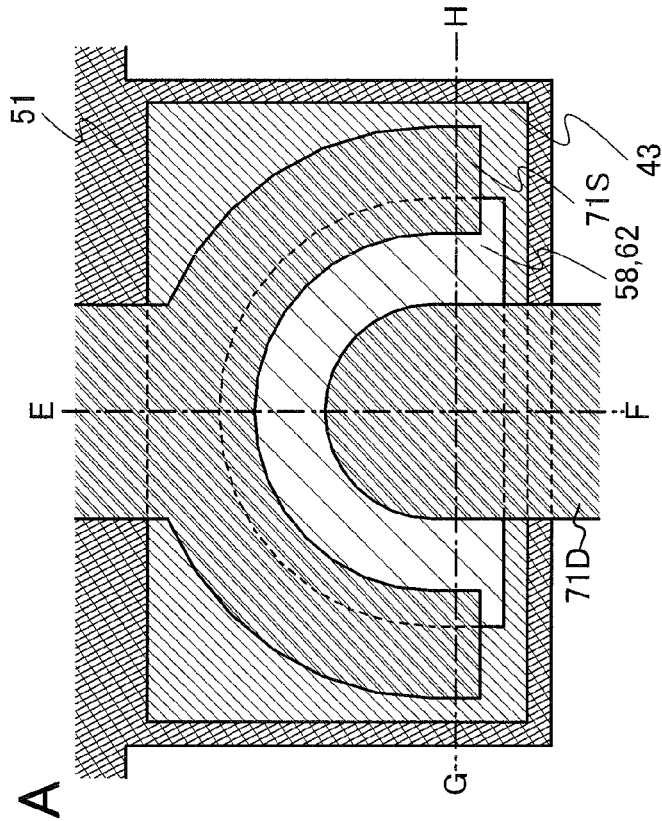
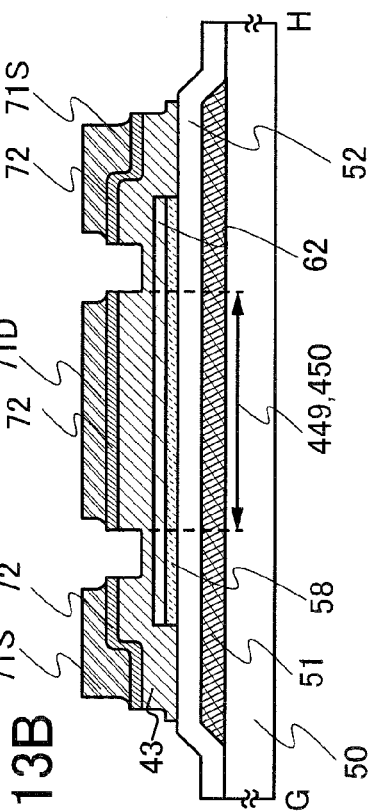
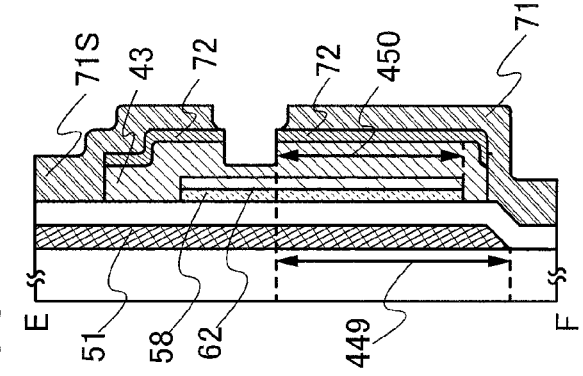
FIG. 13A
FIG. 13B
FIG. 13C

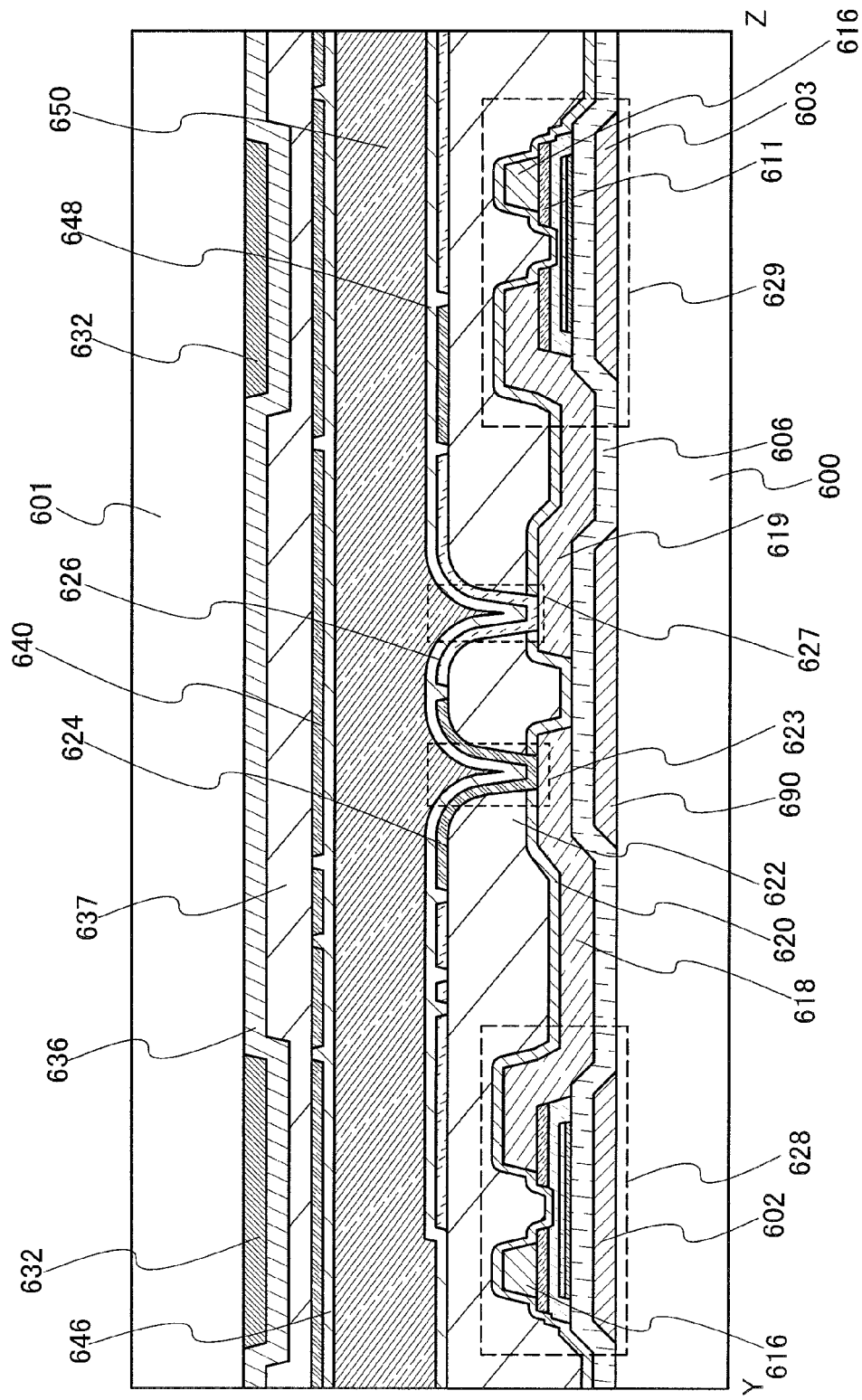

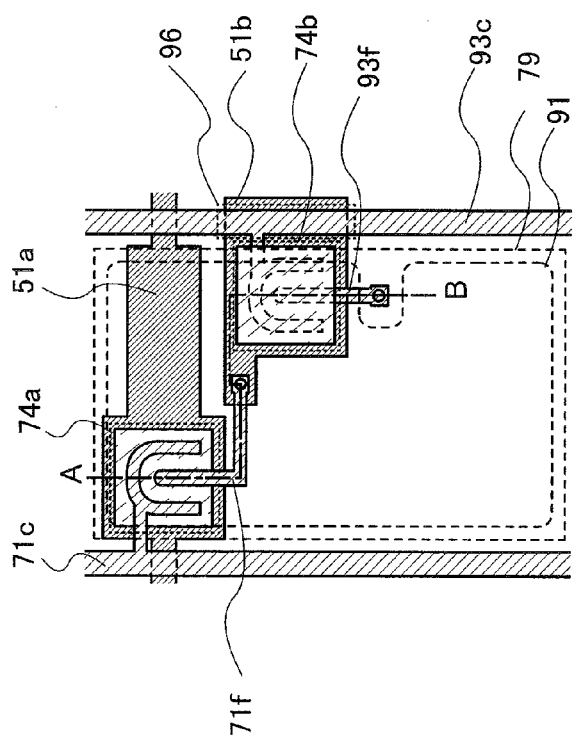
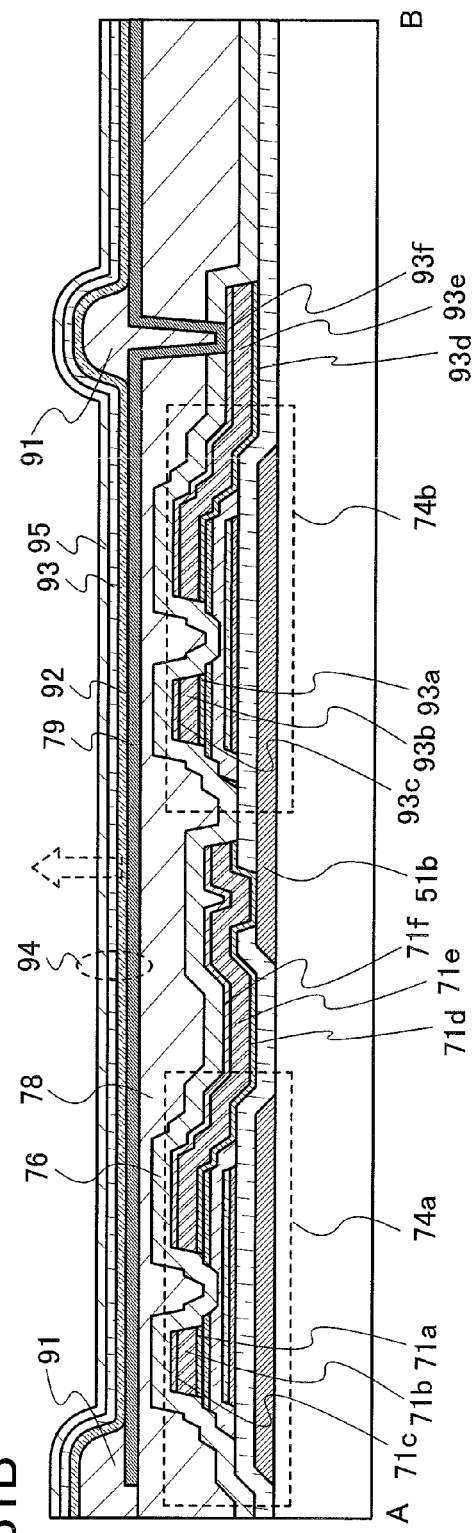
FIG. 31A
FIG. 31B

DIODE AND DISPLAY DEVICE INCLUDING DIODE

BACKGROUND OF THE INVENTION

1. Field of the Invention

The present invention relates to a diode and a display device including the diode.

2. Description of the Related Art

In recent years, techniques to form thin film transistors using a semiconductor thin film (with a thickness of approximately several tens to several hundreds of nanometers) which is formed over a substrate having an insulating surface have attracted attention. A thin film transistor is broadly applied to electronic devices such as an IC and an electrooptic device, and particularly, a thin film transistor as a switching element of an image display device is expected to be developed quickly.

A thin film transistor using an amorphous semiconductor film, a thin film transistor using a polycrystalline semiconductor film in which a diameter of the crystal grain is 100 nm or more, or the like is used as a switching element in an image display device. As a method of forming a polycrystalline semiconductor film, there is known a technique in which a pulsed excimer laser beam is shaped into a linear laser beam by an optical system and an amorphous silicon film is irradiated and scanned with the linear laser beam, so that the amorphous silicon film is crystallized.

Furthermore, as a switching element in an image display device, a thin film transistor using a microcrystalline semiconductor film in which a diameter of the crystal grain is about 1 nm to 100 nm is used (see Patent Document 1: Japanese Published Patent Application No. H4-242724 and Patent Document 2: Japanese Published Patent Application No. 2005-49832).

SUMMARY OF THE INVENTION

A thin film transistor using a polycrystalline semiconductor film has advantages in that its field effect mobility is two or more orders of magnitude greater than that of a thin film transistor using an amorphous semiconductor film and a pixel portion and a peripheral driver circuit of a semiconductor display device can be formed over one substrate. However, the thin film transistor using a polycrystalline semiconductor film requires a more complicated process than the thin film transistor using an amorphous semiconductor film because of crystallization of the semiconductor film. Thus, there are problems such as a reduction in yield and an increase in cost.

In addition, an inverted staggered thin film transistor using a microcrystalline semiconductor film for a channel formation region can have a larger amount of on current than an inverted staggered thin film transistor using an amorphous semiconductor film for a channel formation region; however, the inverted staggered thin film transistor using a microcrystalline semiconductor film for a channel formation region has a larger amount of off current, too. A display device which uses a thin film transistor having a large amount of off current has problems that contrast is decreased and power consumption is increased.

In view of the above problems, it is an object of the present invention to reduce off current of a thin film transistor. It is another object of the present invention to reduce reverse bias current of a diode. It is another object of the present invention to improve image quality of a display device.

One aspect of the present invention is a thin film transistor which includes a microcrystalline semiconductor film over a gate electrode with a gate insulating film interposed therebetween to be in an inner region in which end portions of the microcrystalline semiconductor film are in an inside of end portions of the gate insulating film, an amorphous semiconductor film which covers top and side surfaces of the microcrystalline semiconductor film, and an impurity semiconductor film to which an impurity element imparting one conductivity is added over the amorphous semiconductor film, and which forms a source region and a drain region, wherein the microcrystalline semiconductor film includes an impurity element serving as a donor.

End portions of a source region and a drain region of the microcrystalline semiconductor film may be overlapped with the amorphous semiconductor film and the impurity semiconductor film. Further, a part of an end portion of the microcrystalline semiconductor film may be covered with a source electrode or a drain electrode. Furthermore, end portions of the amorphous semiconductor film may be exposed in the outside of the source electrode and the drain electrode Another aspect of the present invention is a diode which includes a microcrystalline semiconductor film to which an impurity element serving as a donor is added over a gate electrode with a gate insulating film interposed therebetween to be in an inner region in which end portions of the microcrystalline semiconductor film are in an inside of end portions of the gate insulating film, an amorphous semiconductor film which covers top and side surfaces of the microcrystalline semiconductor film, an impurity semiconductor film to which an impurity element imparting one conductivity is added over the amorphous semiconductor film, and which forms a source region or a drain region, a wiring which is in contact with the impurity semiconductor film, and a common line, wherein the gate electrode and the wiring are connected with each other through a conductive film.

Another aspect of the present invention is a diode which includes a microcrystalline semiconductor film to which an impurity element serving as a donor is added over a gate electrode with a gate insulating film interposed therebetween to be in an inner region in which end portions of the microcrystalline semiconductor film are in an inside of end portions of the gate insulating film, an amorphous semiconductor film which covers top and side surfaces of the microcrystalline semiconductor film, an impurity semiconductor film to which an impurity element imparting one conductivity is added over the amorphous semiconductor film, and which forms a source region or a drain region, a wiring which is in contact with the impurity semiconductor film, and a common line, wherein the gate electrode and the wiring are connected with each other through a first conductive film, and the amorphous semiconductor film or the microcrystalline semiconductor film and the common line are connected to each other through a second conductive film.

Note that the end portion close to the source region or the drain region of the microcrystalline semiconductor film may be overlapped with the amorphous semiconductor film and the impurity semiconductor film. Further, a part of an end portion of the amorphous semiconductor film may be covered with a source electrode or a drain electrode. Furthermore, end portions of the source electrode and the drain electrode of the amorphous semiconductor film may be exposed in the outside of the source electrode and the drain electrode.

In the present invention, the amorphous semiconductor film may be provided to overlap with the microcrystalline semiconductor film.

In the present invention, a microcrystalline semiconductor film may be a microcrystalline silicon film, a microcrystalline germanium film, or a microcrystalline silicon germanium film. Further, the microcrystalline semiconductor film may have a stacked-layer structure of a microcrystalline silicon film and a microcrystalline germanium film. Further, the microcrystalline semiconductor film may be a film which includes crystal grains to which an impurity element serving as a donor is added and germanium which covers the crystal grains. Further, instead of the microcrystalline semiconductor film, an amorphous germanium film or an amorphous silicon germanium film may be used.

The impurity element serving as a donor is phosphorus, arsenic, or antimony.

Further, a display device in which thin film transistors (TFTs) using a microcrystalline semiconductor film for a channel formation region is used for a pixel portion and a driver circuit is manufactured. Since a microcrystalline semiconductor film of the present invention has high crystallinity at the interface with a gate insulating film, the thin film transistor using the microcrystalline semiconductor film has a field effect mobility of from 2.5 $cm^2$/V·sec to 10 $cm^2$/V·sec, which is 5 to 20 times higher than that of the thin film transistor using an amorphous semiconductor film. Therefore, part of the driver circuit or the entire driver circuit can be formed over the same substrate as that of the pixel portion, so that a system-on-panel can be manufactured.

Examples of the display device include a light-emitting device and a liquid crystal display device. The light-emitting device includes a light-emitting element, and the liquid crystal display device includes a liquid crystal element. A light-emitting element includes, in its category, an element whose luminance is controlled by current or voltage, and specifically includes an organic electroluminescence (EL) element and an inorganic EL element.

In addition, the display device includes a panel in which a display element is sealed, and a module in which an IC and the like including a controller are mounted on the panel. The present invention further relates to an element substrate that is one mode before a display element is completed in a manufacturing process of the display device. The element substrate is provided with a means to supply current to the display element in each of a plurality of pixels. Specifically, the element substrate may be in a state provided with only a pixel electrode of the display element, a state after a conductive film to be a pixel electrode is formed and before the conductive film is etched to form the pixel electrode, or other states.

Note that a display device in this specification means an image display device, a light-emitting device, or a light source (including a lighting device). Further, the following are also referred to as a display device: a module in which a connector, for example, an FPC (flexible printed circuit), a TAB (tape automated bonding) tape, or a TCP (tape carrier package) is attached; a module provided with a printed wiring board at the end of the TAB tape or the TCP; and a module in which an IC (integrated circuit) is directly mounted to a display element by a COG (chip on glass) method.

According to the present invention, off current of a thin film transistor can be reduced. Further, a thin film transistor with a large amount of on current, high field effect mobility, and a small amount of off current can be manufactured. Further, reverse bias current of a diode can be reduced. Furthermore, a diode which has high switching speed at the time of high voltage application can be manufactured. Therefore, image quality of a display device can be improved.

BRIEF DESCRIPTION OF THE DRAWINGS

FIGS. 9A to 9C are plan views illustrating a manufacturing process of a thin film transistor of the present invention.

FIGS. 13A to 13C are a plan view and cross-sectional views illustrating a diode of the present invention.

FIG. 28 is a cross-sectional view illustrating a display device of the present invention.

FIGS. 31A and 31B are a cross-sectional view and a top view of a display device of the present invention.

DETAILED DESCRIPTION OF THE INVENTION

Figure 1A:
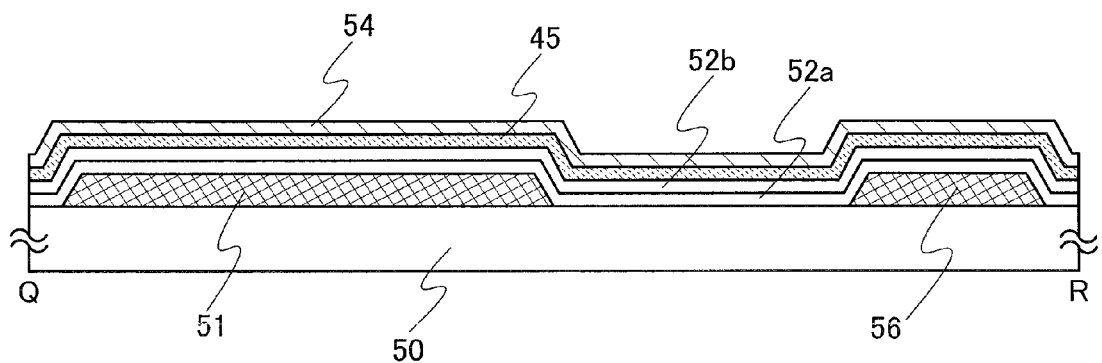
FIGS. 1A to 1C are cross-sectional views illustrating a manufacturing process of a thin film transistor of the present invention.

Embodiment modes of the present invention are described below with reference to the drawings. However, the present invention is not limited to the following description, and it is easily understood by those skilled in the art that modes and details can be variously changed without departing from the purpose and the scope of the present invention. Therefore, the present invention is not interpreted as being limited to the following description of the embodiment modes. In the structure of the present invention described below, reference numerals indicating the same things are used in common in different drawings.

Embodiment Mode 1

In this embodiment mode, a manufacturing process of a thin film transistor with high mobility, a large amount of on current, and a small amount of off current is described below. In this embodiment mode, manufacturing processes of a thin film transistor, a pixel electrode, and a capacitor element which are formed in each pixel of a pixel portion 1331 in the top view of an element substrate 1300 of a display device illustrated in FIG. 14 are described below.

Figure 2A:
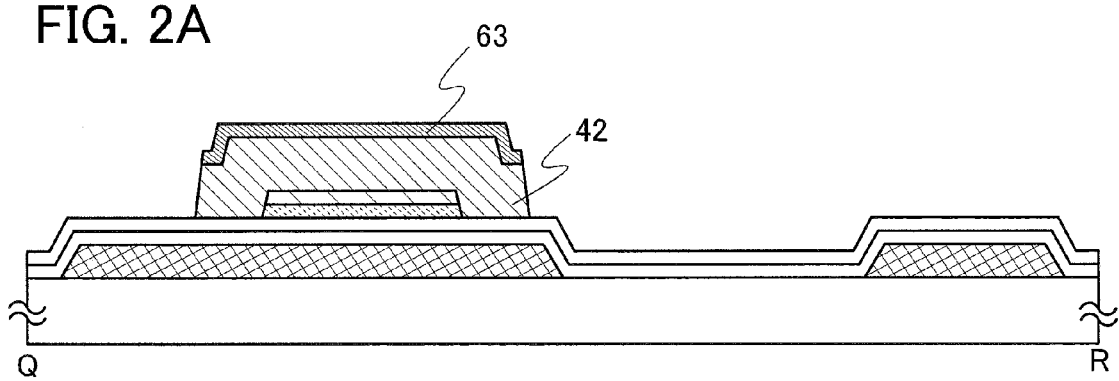
FIGS. 2A to 2C are cross-sectional views illustrating a manufacturing process of a thin film transistor of the present invention.
Figure 2B:
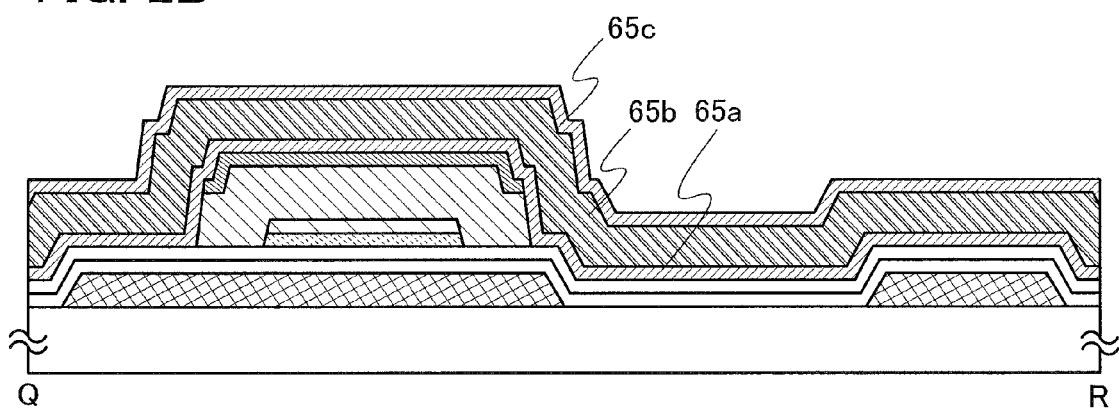
Figure 2C:
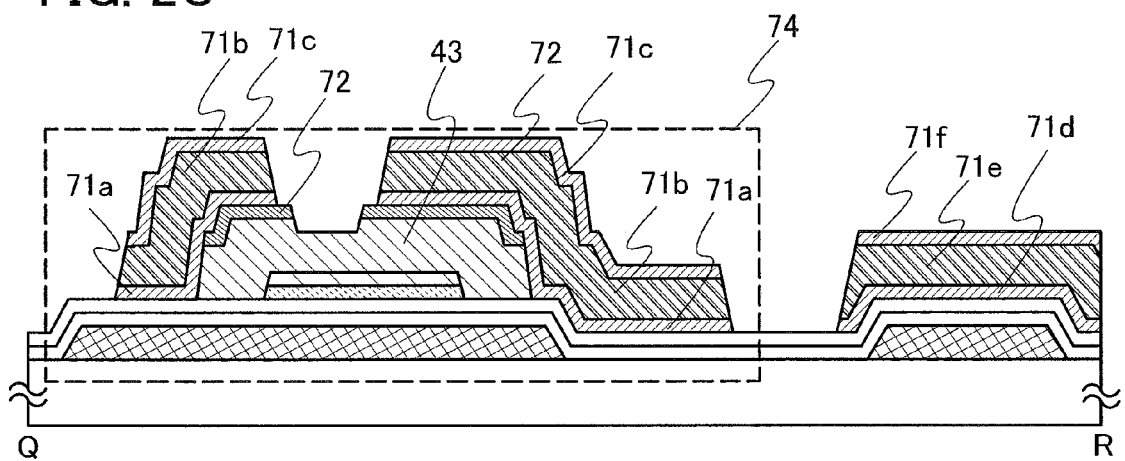
Figure 3A:
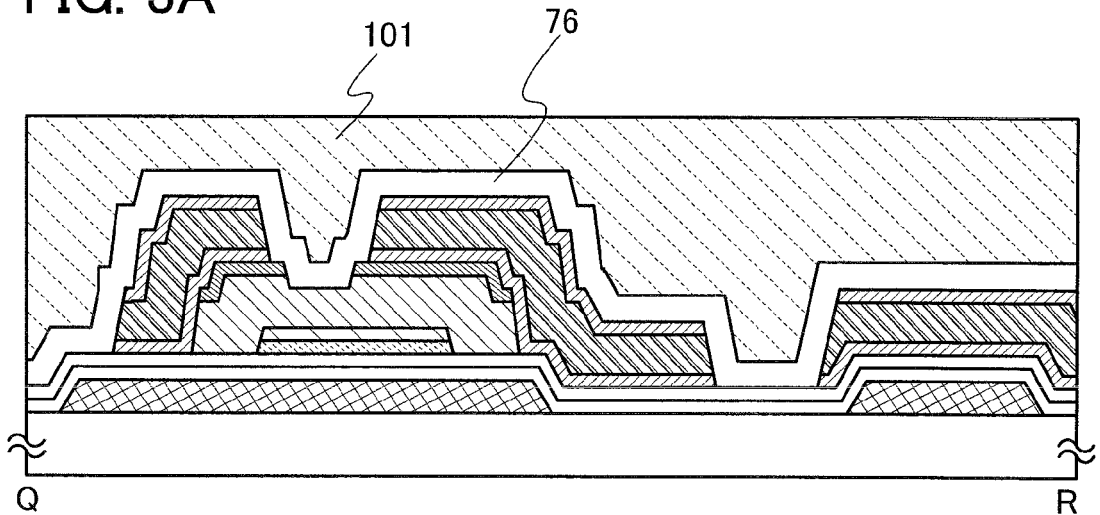
FIGS. 3A to 3C are cross-sectional views illustrating a manufacturing process of a thin film transistor of the present invention.
Figure 3B:
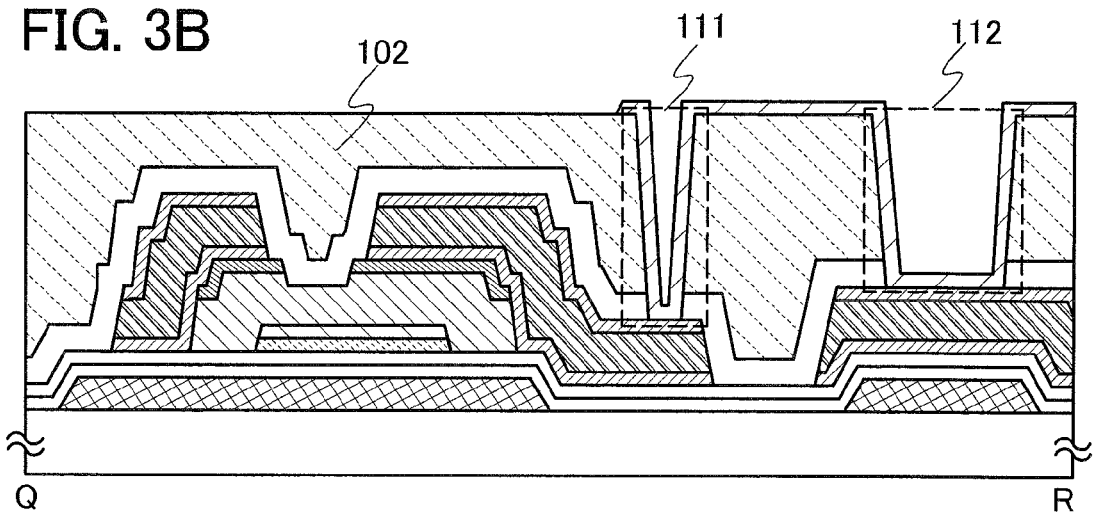
Figure 3C:
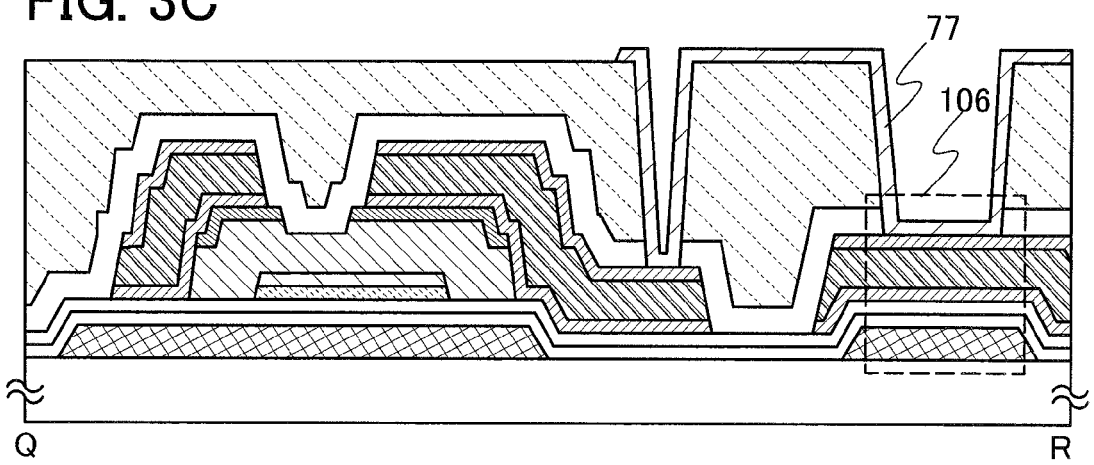
Figure 4A:
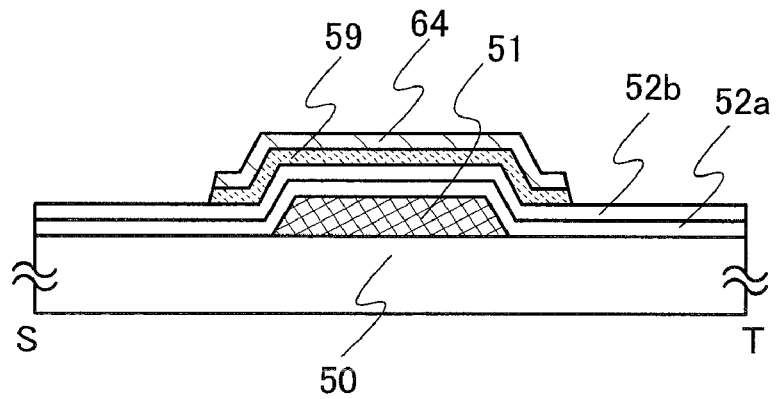
FIGS. 4A to 4C are cross-sectional views illustrating a manufacturing process of a thin film transistor of the present invention.
Figure 4B:
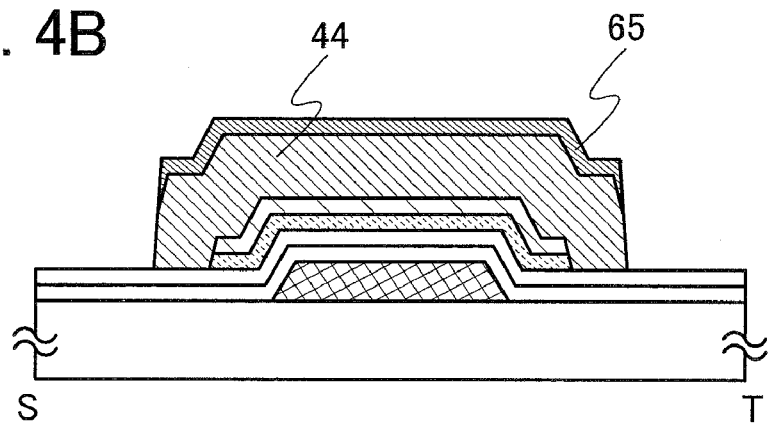
Figure 4C:
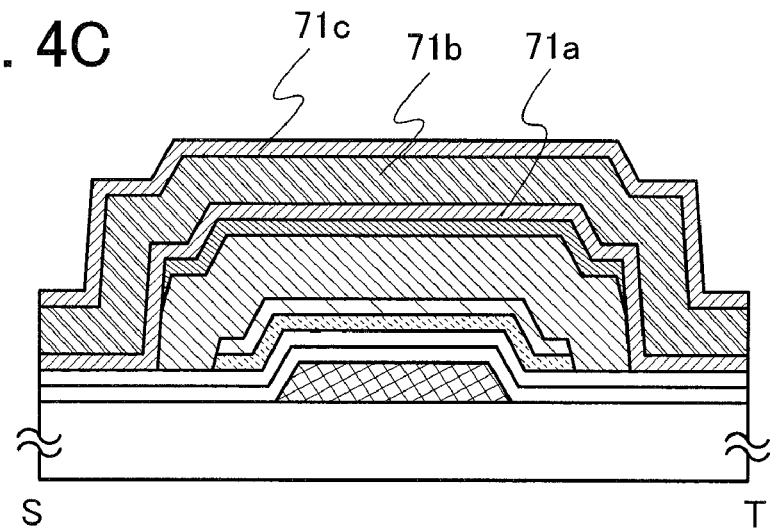
Figure 14:
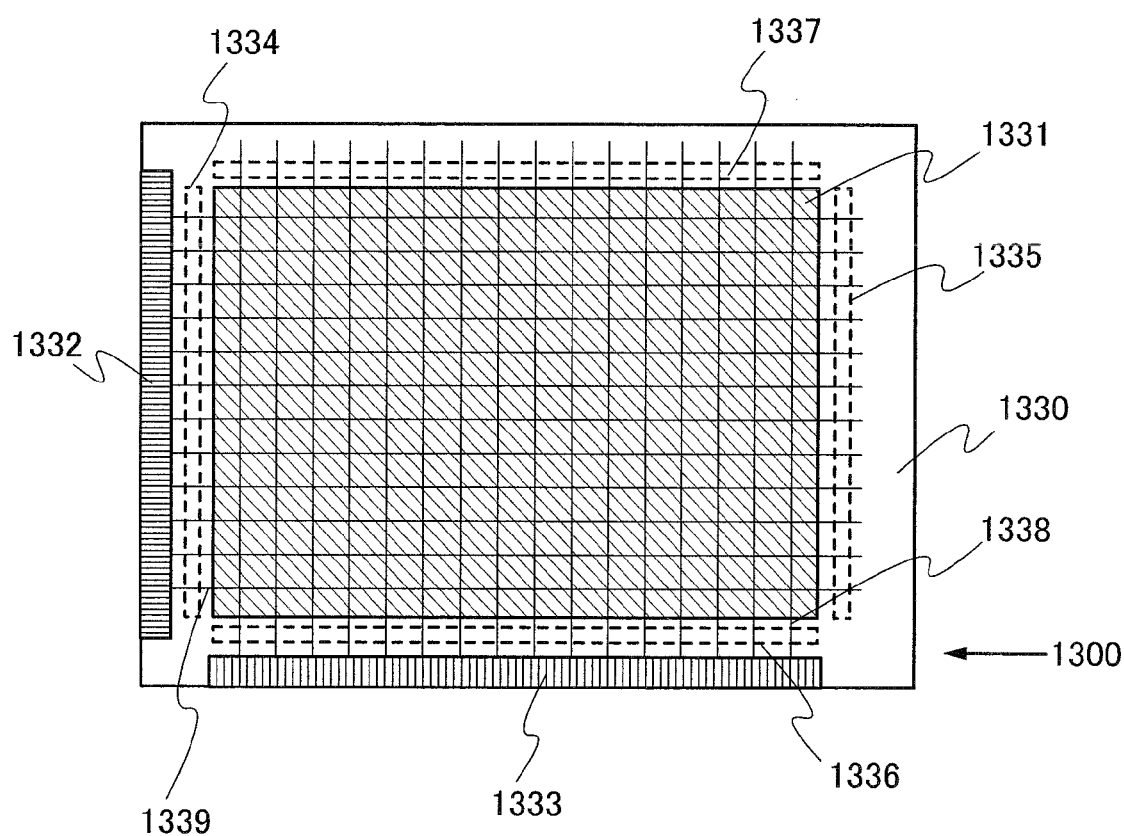
FIG. 14 is a plan view illustrating an element substrate of the present invention.

Enlarged views of a region connected to a thin film transistor and a pixel electrode of one pixel of the pixel portion 1331 in FIG. 14 are illustrated in FIGS. 5A to 5D, cross-sectional views taken along a line Q-R in FIGS. 5A to 5D are illustrated in FIGS. 1A to 1C, FIGS. 2A to 2C, and FIGS. 3A to 3C, and cross-sectional views taken along a line S-T in FIGS. 5A to 5D are illustrated in FIGS. 4A to 4C.

As illustrated in FIG. 1A, a gate electrode 51 and a capacitor wiring 56 are formed over a substrate 50, and gate insulating films 52a and 52b are formed over the gate electrode 51 and the capacitor wiring 56.

As the substrate 50, a plastic substrate having heat resistance that can withstand a processing temperature of this manufacturing process or the like as well as a non-alkaline glass substrate manufactured by a fusion method or a float method such as a substrate of barium borosilicate glass, an aluminoborosilicate glass, or an aluminosilicate glass, and a ceramic substrate can be used. Alternatively, a metal substrate such as a stainless steel alloy substrate, provided with an insulating film over its surface, may also be used.

The gate electrode 51 and the capacitor wiring 56 are formed by a sputtering method, a CVD method, a plating method, a printing method, a droplet discharge method, or the like. Here, a molybdenum film is formed as a conductive film over the substrate 50 by a sputtering method, and the conductive film which is formed over the substrate 50 is etched using a resist mask formed using a first photomask, so that the gate electrode 51 and the capacitor wiring 56 are formed.

The gate electrode 51 is formed using a metal material. As a metal material, aluminum, chromium, titanium, tantalum, molybdenum, copper, or the like is applied. The gate electrode 51 is preferably formed using aluminum or a stacked-layer structure of aluminum and a barrier metal. As a barrier metal, refractory metal such as titanium, molybdenum, or chromium is applied. The barrier metal is preferably provided for preventing hillocks and oxidation of aluminum.

The gate electrode 51 is formed with a thickness of from 50 to 300 nm. The thickness of from 50 to 100 nm of the gate electrode 51 can prevent a disconnection of a microcrystalline germanium film and a wiring, which are formed later. Further, the thickness of from 150 to 300 nm of the gate electrode 51 can lower the resistance of the gate electrode 51, and increase the size of the substrate.

Since a microcrystalline semiconductor film and a wiring are formed over the gate electrode 51, the gate electrode 51 is preferably processed to have tapered end portions so that disconnection is prevented. Further, although not illustrated, in this process, a wiring, a capacitor wiring, a common line, or the like which are connected to the gate electrode can also be formed at the same time.

The gate insulating films 52a and 52b can be formed with a silicon oxide film, a silicon nitride film, a silicon oxynitride film, or a silicon nitride oxide film with a thickness of from 50 to 150 nm by using a CVD method, a sputtering method, or the like. This embodiment mode shows an example in which a silicon nitride film or a silicon nitride oxide film is formed as the gate insulating film 52a, and a silicon oxide film or a silicon oxynitride film is formed as the gate insulating film 52b to form a stacked-layer structure. Instead of a two-layer structure, the gate insulating film can be formed with a single layer of a silicon oxide film, a silicon nitride film, a silicon oxynitride film, or a silicon nitride oxide film. In addition, the gate insulating film can have a three-layer structure using the above insulating films.

By forming the gate insulating film 52a using a silicon nitride film or a silicon nitride oxide film, adhesion between the substrate 50 and the gate insulating film 52a is increased, and further, an impurity from the substrate 50 can be prevented from diffusing into the microcrystalline semiconductor film when a glass substrate is used for the substrate 50. Furthermore, oxidation of the gate electrode 51 can be prevented. That is, film peeling can be prevented, and thus electric characteristics of a thin film transistor which is formed later can be improved. Further, the gate insulating films 52a and 52b each having a thickness of 50 nm or more are preferable because the gate insulating films 52a and 52b having the above thickness can suppress reduction in coverage caused by unevenness due to the gate electrode 51.

Here, a silicon oxynitride film means a film that contains more oxygen than nitrogen and, in a case where measurements are performed using Rutherford backscattering spectrometry (RBS) and hydrogen forward scattering (HFS), includes oxygen, nitrogen, silicon, and hydrogen at compositions ranging from 50 to 70 at. %, 0.5 to 15 at. %, 25 to 35 at. %, and 0.1 to 10 at. %, respectively. Further, a silicon nitride oxide film means a film that contains more nitrogen than oxygen and, in the case where measurements are performed using RBS and HFS, includes oxygen, nitrogen, silicon, and hydrogen at compositions ranging from 5 to 30 at. %, 20 to 55 at. %, 25 to 35 at. %, and 10 to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

Then, a microcrystalline semiconductor film 45 which includes an impurity element serving as a donor is formed over the gate insulating film 52b. As a microcrystalline semiconductor film 58 which includes an impurity element serving as a donor, a microcrystalline silicon film, a microcrystalline germanium film, a microcrystalline silicon germanium film, or the like which includes an impurity element such as phosphorus, arsenic, or antimony, which serves as a donor can be given.

Here, the microcrystalline semiconductor film is a film which includes a semiconductor having an intermediate structure between amorphous and crystalline (including a single crystal and a polycrystal) structures. This semiconductor is a semiconductor which has a third state that is stable in terms of free energy, and is a crystalline semiconductor which has short-range order and lattice distortion, and column-like or needle-like crystals in which a diameter of the crystal grain is 0.5 nm to 20 nm. The crystal grain grows in the direction of a normal line with respect to the surface of the substrate. In addition, a non-single-crystal semiconductor is present between a plurality of microcrystalline semiconductors. A Raman spectrum of microcrystalline silicon, which is a typical example of a microcrystalline semiconductor, shifts to the lower wavenumber side than 520 $cm^{-1}$ which represents single crystal silicon. That is, a peak of a Raman spectrum of microcrystalline silicon lies between 520 $cm^{-1}$ which represents that of single crystal silicon, and 480 $cm^{-1}$ which represents that of amorphous silicon. In addition, the microcrystalline silicon includes hydrogen or halogen of at least 1 at. % or more for termination of dangling bonds. Moreover, a rare gas element such as helium, argon, krypton, or neon may be included to further promote lattice distortion, so that stability is enhanced and a favorable microcrystalline semiconductor film can be obtained. Such description about a microcrystalline semiconductor film is disclosed in, for example, U.S. Pat. No. 4,409,134.

The microcrystalline semiconductor film 58 which includes the impurity element serving as a donor is formed with a thickness of from 1 to 200 nm, preferably from 1 to 100 nm, more preferably from 1 to 50 nm, still more preferably from 10 to 25 nm. When the microcrystalline semiconductor film 58 which includes the impurity element serving as a donor is formed with a thickness of from 1 to 50 nm, a thin film transistor of a complete depletion type can be manufactured.

The concentration of the impurity element included in the microcrystalline semiconductor film is from $6\times10^{15}$ $cm^{-1}$ to $3\times10^{18}$ $cm^{-3}$, preferably from $1\times10^{16}$ $cm^{-3}$ to $3\times10^{18}$ $cm^{-3}$, more preferably from $3\times10^{16}$ $cm^{-3}$ to $3\times10^{17}$ $cm^{-3}$. The concentration of the impurity element which serves as a donor and is included in the microcrystalline semiconductor film 58 is set to be in the above range, whereby the interface between the gate insulating film 52b and the microcrystalline semiconductor film 58 can have improved crystallinity, and the microcrystalline semiconductor film 58 can have lower resistivity; thus, a thin film transistor with high field effect mobility and a large amount of on current can be manufactured. When the peak concentration of the impurity element which serves as a donor and is included in the microcrystalline semiconductor film is lower than $6\times10^{15}$ $cm^{-3}$, the amount of the impurity element which serves as a donor is insufficient, and thus increase in the field effect mobility and in the on current cannot be expected. Further, when the peak concentration of the impurity element which serves as a donor and is included in the microcrystalline semiconductor film is higher than $3\times10^{18}$ $cm^{-3}$, the threshold voltage shifts to the minus side of the gate voltage, and the thin film transistor does not function well; therefore, it is preferable that the concentration of the impurity element which serves as a donor be from $6\times10^{15}$ $cm^{-3}$ to $3\times10^{18}$ $cm^{-3}$, preferably from $1\times10^{16}$ $cm^{-3}$ to $3\times10^{18}$ $cm^{-3}$, more preferably from $3\times10^{16}$ $cm^{-3}$ to $3\times10^{17}$ $cm^{-3}$.

Further, it is preferable that the concentration of oxygen and the concentration of nitrogen in the microcrystalline semiconductor film 58 which includes the impurity element serving as a donor be lower than ten times that of the impurity element which serves as a donor, typically lower than $3\times10^{19}$ $atoms/cm^3$, preferably lower than $3\times10^{18}$ $atoms/cm^3$, and that the concentration of carbon be less than or equal to $3\times10^{18}$ $atoms/cm^3$. By decreasing concentrations of oxygen, nitrogen, and carbon mixed in the microcrystalline semiconductor film, generation of defects in the microcrystalline semiconductor film 58 which includes the impurity element serving as a donor can be suppressed. Further, oxygen or nitrogen in the microcrystalline semiconductor film hinders crystallization. Therefore, when the microcrystalline semiconductor film 58 includes oxygen and nitrogen at relatively low concentrations and includes the impurity element serving as a donor, the crystallinity of the microcrystalline semiconductor film 58 which includes the impurity element serving as a donor can be enhanced.

The microcrystalline semiconductor film 58 which includes the impurity element serving as a donor of this embodiment mode includes the impurity element serving as a donor; therefore, by adding an impurity element serving as an acceptor to the microcrystalline semiconductor film 58 which includes the impurity element serving as a donor at the same time as or after formation of the microcrystalline semiconductor film, the threshold voltage can be controlled. A typical example of the impurity element serving as an acceptor is boron, and an impurity gas such as $B_2H_6$ or $BF_3$ may be added to silicon hydride at 1 ppm to 1000 ppm, preferably 1 ppm to 100 ppm. Further, the concentration of boron is preferably set to be approximately one tenth that of the impurity element serving as a donor, e.g., from $1\times10^{14}$ to $6\times10^{16}$ $atoms/cm^3$.

In a reaction chamber of the plasma CVD apparatus, a deposition gas including silicon or germanium is mixed with hydrogen, and the microcrystalline semiconductor film 45 is formed by glow discharge plasma. The flow ratio of hydrogen is 10 to 200 times, preferably 50 to 200 times as high as the deposition gas including silicon or germanium, so that the microcrystalline semiconductor film is formed. The temperature for heating the substrate is 100 to 300° C., preferably 120 to 220° C. Further, by mixing a gas including phosphorus, arsenic, antimony, or the like with the above source gas, a microcrystalline semiconductor film which includes the impurity element serving as a donor can be formed. Here, silane and hydrogen and/or a rare gas are mixed with phosphine, and a microcrystalline silicon film including phosphorus can be formed by glow discharge plasma.

In the process of forming the microcrystalline semiconductor film 45 which includes the impurity element serving as a donor, glow discharge plasma is generated by applying high-frequency power of from 1 MHz to 30 MHz, typically high-frequency power of 13.56 MHz or 27.12 MHz, or applying high-frequency power with a frequency in the VHF band of 30 MHz to about 300 MHz, typically 60 MHz. In addition, high-frequency plasma, for example, a frequency of 1 GHz or 2.45 GHZ can be used.

As a typical example of the deposition gas including silicon or germanium, $SiH_4$, $Si_2H_6$, $GeH_4$, $Ge_2H_6$, or the like can be given.

Note that instead of a semiconductor film 47 which includes an impurity element serving as a donor, a semiconductor film which does not include an impurity element serving as a donor may be formed, and an insulating film which includes the impurity element serving as a donor may be formed as the gate insulating film 52*b*. For example, the gate insulating film 52*b* which includes the impurity element serving as a donor can be formed using a silicon oxide film, a silicon nitride film, a silicon oxynitride film, or a silicon nitride oxide film each of which includes the impurity element (phosphorus, arsenic, or antimony) serving as a donor. Further, in a case where the gate insulating film 52*b* has a stacked-layer structure, an impurity element serving as a donor may be added to a layer which is in contact with the microcrystalline semiconductor film 45 or a layer which is in contact with the substrate 50.

As a method for forming an insulating film which includes an impurity element serving as a donor as the gate insulating film 52*b*, an insulating film may be formed using a gas including an impurity element serving as a donor in addition to a source gas of an insulating film. For example, silicon nitride including phosphorus can be formed by a plasma CVD method using silane, ammonium, and phosphine. Further, a silicon oxynitride film including phosphorus can be formed by a plasma CVD method using silane, dinitrogen monoxide, and ammonium, and phosphine.

Further, before the gate insulating film 52*b* is formed, a gas which includes an impurity element serving as a donor may be supplied to a reaction chamber of a film formation apparatus so that the impurity element serving as a donor can be adsorbed onto a surface of the substrate 50 and an inner wall of the reaction chamber. Then, by forming the gate insulating film 52*b*, an insulating film is deposited while taking in the impurity element serving as a donor; therefore, a gate insulating film which includes an impurity element serving as a donor can be formed.

Alternatively, before the microcrystalline semiconductor film 45 which includes the impurity element serving as a donor is formed, a gas which includes an impurity element serving as a donor may be supplied to a reaction chamber of a film formation apparatus so that the impurity element serving as a donor is adsorbed onto the gate insulating film 52*b* and an inner wall of the reaction chamber. Then, by depositing the microcrystalline semiconductor film, the microcrystalline semiconductor film is deposited while taking in the impurity element serving as a donor; therefore, the microcrystalline semiconductor film 45 which includes the impurity element serving as a donor can be formed.

Note that a fluoride gas including silicon or germanium may be used in addition to a deposition gas including silicon or germanium to form the microcrystalline semiconductor film which includes the impurity element serving as a donor. In this case, the flow ratio of fluorosilane to the flow ratio of silane is set to be 0.1:1 to 50:1, preferably 1:1 to 10:1. In order to form the microcrystalline semiconductor film 45 which includes the impurity element serving as a donor, a fluoride gas including silicon or germanium is used in addition to a deposition gas including silicon or germanium; thus, amorphous semiconductor components are etched by fluorine radicals in crystal growth of the microcrystalline semiconductor film so that the microcrystalline semiconductor film has high crystallinity, and crystal growth occurs. That is, a microcrystalline semiconductor film which has high crystallinity can be formed.

Further, a silicon germanium film of which an energy band width is adjusted to be from 0.9 to 1.1 eV by mixing germanium hydride or germanium fluoride such as $GeH_4$ or $GeF_4$ into a gas such as silane may be formed. By adding germanium to silicon, the temperature characteristic of a thin film transistor can be changed.

The microcrystalline semiconductor film which includes the impurity element serving as a donor of this embodiment mode includes the impurity element serving as a donor; therefore, by adding an impurity element serving as an acceptor to the microcrystalline semiconductor film serving as a channel formation region of the thin film transistor at the same time as or after formation of the microcrystalline semiconductor film, the threshold voltage can be controlled. A typical example of the impurity element serving as an acceptor is boron, and an impurity gas such as $B_2H_6$ or $BF_3$ is preferably mixed into the deposition gas including silicon or germanium at a proportion of 1 to 1000 ppm, preferably 1 to 100 ppm. Further, the concentration of boron is preferably set to be approximately one tenth that of the impurity element serving as a donor, e.g., from $1 \times 10^{14}$ to $6 \times 10^{16}$ atoms/cm$^3$.

In the film formation treatment of the microcrystalline semiconductor film which includes the impurity element serving as a donor, helium may be added to a reaction gas in addition to silane and hydrogen. Helium has ionization energy of 24.5 eV, which is the highest ionization energy in all gases, and has a metastable state in a level of about 20 eV which is a little lower than the level of the ionization energy. Thus, only about 4 eV that is a difference of level between the ionization energy and the metastable state is needed for ionization while keeping discharge. Therefore, a discharge starting voltage of helium shows the lowest value in all gases. Because of such characteristics, helium can maintain plasma with stability. In addition, uniform plasma can be formed so that plasma density is equalized even when the area of the substrate on which the microcrystalline semiconductor film which includes the impurity element serving as a donor is deposited is increased.

Next, a first buffer layer 54 is formed. The first buffer layer 54 is formed using an amorphous silicon film, an amorphous silicon germanium film, or the like. The thickness of the first buffer layer 54 is 10 to 100 nm, preferably, 30 to 50 nm.

As the first buffer layer 54, an amorphous semiconductor film can be formed by a plasma CVD method using a deposition gas including silicon or germanium. Alternatively, by diluting a deposition gas including silicon or germanium with one or plural kinds of rare gases selected from helium, argon, krypton, and neon, an amorphous semiconductor film can be formed. Alternatively, an amorphous semiconductor film including hydrogen can be formed using hydrogen with a flow rate of 1 to 10 times, preferably 1 to 5 times as high as that of a silane gas. In addition, halogen such as fluorine, chlorine, bromine, or iodine may be added to the hydrogenated semiconductor film.

Alternatively, as the first buffer layer 54, an amorphous semiconductor film can be formed by sputtering silicon, germanium, or the like, which is a target, with hydrogen or a rare gas.

Formation of an amorphous semiconductor film or an amorphous semiconductor film including hydrogen, nitrogen, or halogen as the first buffer layer 54 over the surface of the microcrystalline semiconductor film 45 which includes the impurity element serving as a donor can prevent a surface of a crystal grain included in the microcrystalline semiconductor film 45 which includes the impurity element serving as a donor from being naturally oxidized. In particular, in a region where an amorphous semiconductor is in contact with microcrystal grains, a crack is likely to be caused due to local stress. If a crack is exposed to oxygen, the crystal grain is oxidized to form silicon oxide. However, by formation of the first buffer layer 54 over the surface of the microcrystalline semiconductor film 45 which includes the impurity element serving as a donor, the microcrystalline grains can be prevented from being oxidized.

After the microcrystalline semiconductor film 45 which includes the impurity element serving as a donor is formed, the first buffer layer 54 is preferably formed at a temperature of 300° C. to 400° C. by a plasma CVD method. By this film formation process, hydrogen is supplied to the microcrystalline semiconductor film 45, and the same effect as hydrogenizing the microcrystalline semiconductor film 45 can be obtained. In other words, by depositing the first buffer layer 54 over the microcrystalline semiconductor film 45 which includes the impurity element serving as a donor, hydrogen is diffused into the microcrystalline semiconductor film 45 which includes the impurity element serving as a donor, and a dangling bond can be terminated.

Figure 1B:
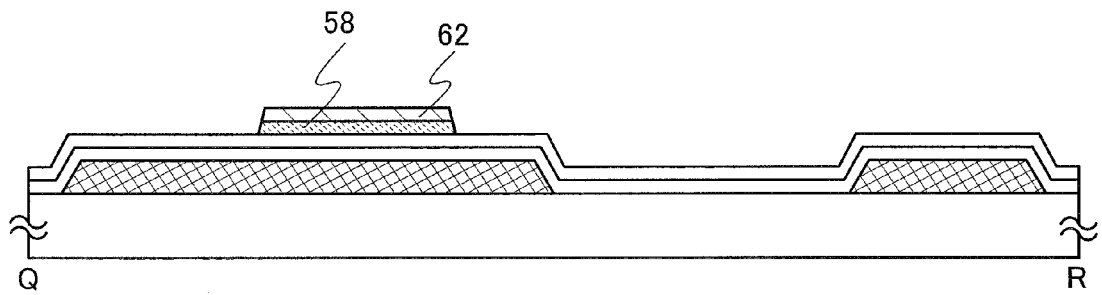

Then, after a resist is applied to the first buffer layer 54 and the gate insulating film 52b, the resist is exposed to light and developed through a photolithography process using a second photomask so that a resist mask is formed. Next, the first buffer layer 54 and the microcrystalline semiconductor film 45 which includes the impurity element serving as a donor are etched using the resist mask, and a first buffer layer 62 and the microcrystalline semiconductor film 58 which includes the impurity element serving as a donor are formed as illustrated in FIG. 1B. At this time, a microcrystalline semiconductor film 59 which includes an impurity element serving as a donor and a first buffer layer 64 are formed also in a region where the gate electrode 51 (the gate wiring) intersects a source wiring which is formed later as illustrated in FIG. 4A. Note that FIG. 1B corresponds to a cross-sectional view taken along a line Q-R in FIG. 5A, and FIG. 4A corresponds to a cross-sectional view taken along a line S-T in FIG. 5A.

Figure 1C:
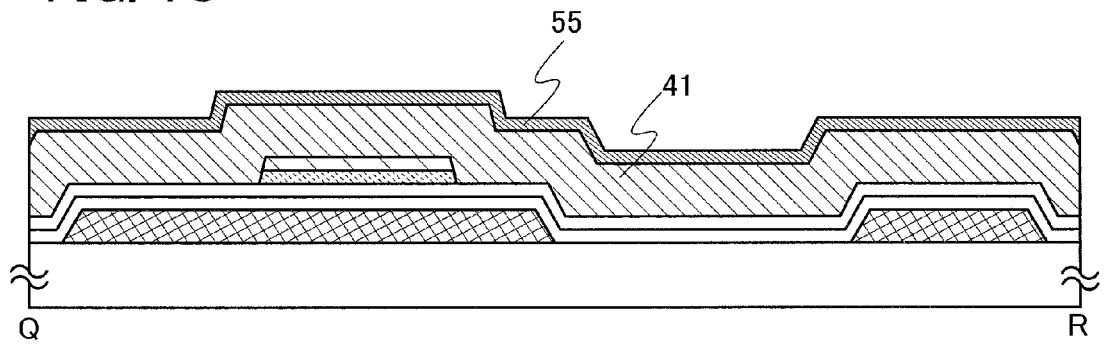

Next, as illustrated in FIG. 1C, a second buffer layer 41 and an impurity semiconductor film 55 to which an impurity element imparting one conductivity is added are formed over the first buffer layer 62 and the gate insulating film 52b.

The second buffer layer 41 can be formed in a similar manner to the first buffer layer 54. The second buffer layer 41 at this time is partly etched in a later formation process of a source region and a drain region in some cases, and in that case, the second buffer layer 41 is formed at such a thickness that a part of the second buffer layer 41 is left after the etching. Typically, it is preferable to form the second buffer layer 41 with a thickness of from 30 to 500 nm, preferably from 50 to 200 nm.

In a display device including a thin film transistor to which high voltage (e.g., about 15 V) is applied, typically in a liquid crystal display device, if the first buffer layer 54 and the second buffer layer 41 are formed thick, withstand-voltage of the source-drain region is increased. Thus, deterioration of the thin film transistor can be reduced even when high voltage is applied to a gate voltage of the thin film transistor.

Since the first buffer layer 54 and the second buffer layer 41 are each formed using an amorphous semiconductor film or an amorphous semiconductor film including hydrogen or halogen, the first buffer layer 54 and the second buffer layer 41 have larger energy gaps than the microcrystalline semiconductor film 45 which includes the impurity element, and have high resistivities and lower mobilities, i.e., a fifth to a tenth of a mobility of the microcrystalline semiconductor film 45. Therefore, in a thin film transistor which is formed later, the first buffer layer and the second buffer layer formed between the source region and the drain region, and the microcrystalline semiconductor film 45 which includes the impurity element serving as a donor function as high resistance regions, and the microcrystalline semiconductor film 45 which includes the impurity element serving as a donor functions as a channel formation region. Accordingly, off current of the thin film transistor can be reduced. When the thin film transistor is used as a switching element of a display device, the contrast of the display device can be improved.

In a case where an n-channel thin film transistor is formed, phosphorus as a typical impurity element may be added to the impurity semiconductor film 55 to which the impurity element imparting one conductivity is added, and an impurity gas such as $PH_3$ may be added to the deposition gas including silicon or germanium. Alternatively, in a case where a p-channel thin film transistor is formed, boron as a typical impurity element may be added to the impurity semiconductor film 55 to which the impurity element imparting one conductivity is added, and a gas including an impurity element such as $B_2H_6$ may be added to the deposition gas including silicon or germanium as a source gas. By setting the concentration of phosphorus or boron at $1\times10^{19}$ to $1\times10^{21}$ cm$^{-3}$, ohmic contact between the impurity semiconductor film 55 to which the impurity element imparting one conductivity is added and wirings 71a to 71c can be obtained, and the impurity semiconductor film 55 to which the impurity element imparting one conductivity is added functions as a source region and a drain region. The impurity semiconductor film 55 to which the impurity element imparting one conductivity is added can be formed with a microcrystalline semiconductor film or an amorphous semiconductor film. The impurity semiconductor film 55 to which the impurity element imparting one conductivity is added is formed with a thickness of from 2 nm to 50 nm. If the impurity semiconductor film to which the impurity element imparting one conductivity is added is thinned, the throughput can be improved.

Then, a resist mask is formed over the impurity semiconductor film 55 to which the impurity element imparting one conductivity is added. The resist mask is formed by a photolithography process. Here, by using a third photomask, a resist that is applied over the impurity semiconductor film 55 to which the impurity element imparting one conductivity is added is exposed to light and developed so that the resist mask is formed.

Next, by using a resist mask, the second buffer layer 41 and the impurity semiconductor film 55 to which the impurity element imparting one conductivity is added are etched to be separated, so that an island-shaped second buffer layer 42 and an impurity semiconductor film 63 to which an impurity element imparting one conductivity is added are formed as illustrated in FIG. 2A. At this time, as illustrated in FIG. 4B, a second buffer layer 44 and an impurity semiconductor film 65 to which an impurity element imparting one conductivity is added are formed in a region where the gate electrode (the gate wiring) intersects a source wiring which is formed later. Then, the resist mask is removed. Note that FIG. 2A corresponds to a cross-sectional view taken along a line Q-R in FIG. 5B, and FIG. 4B corresponds to a cross-sectional view taken along a line S-T in FIG. 5B.

The microcrystalline semiconductor film 58 which includes the impurity element serving as a donor is covered with the second buffer layer 42; thus, the microcrystalline semiconductor film 58 which includes the impurity element serving as a donor and a wiring which is formed later are not in contact with each other. Therefore, leakage current between a wiring formed over the first buffer layer 62 and the microcrystalline semiconductor film 58 can be reduced.

Next, as illustrated in FIG. 2B, conductive films 65a to 65c are formed over the impurity semiconductor film 63 to which the impurity element imparting one conductivity is added and the gate insulating film 52b. The conductive films 65a to 65c are formed by a sputtering method, a CVD method, a droplet discharge method, an evaporation method, or the like.

It is preferable that the conductive films 65a to 65c are formed to have a single layer of aluminum, copper, or an aluminum alloy to which an element that improves heat resistance or an element that prevents hillock such as silicon, titanium, neodymium, scandium, or molybdenum is added; or as stacked layers thereof. Alternatively, the conductive films may have a stacked-layer structure where a film in contact with source and drain regions 72 to which an impurity element imparting one conductivity is added may be formed using titanium, tantalum, molybdenum, tungsten, or nitride of such an element and aluminum or an aluminum alloy is formed thereover. Further alternatively, top and bottom surfaces of aluminum or an aluminum alloy may be each sandwiched with titanium, tantalum, molybdenum, tungsten, or nitride thereof to form a stacked-layer structure. Here, as the conductive film, a conductive film having a three-layer structure of the wirings 71a to 71c is shown. A stacked-layer conductive film where a molybdenum film is used for each of the conductive films 71a and 71c and an aluminum film is used for the conductive film 71b, or a titanium film is used for each of the conductive films 71a and 71c and an aluminum film is used for the conductive film 71b can be given.

Then, a resist mask is formed over the conductive film 65c through a photolithography process using a fourth photomask.

Then, the conductive films 65a to 65c are etched using the resist mask, and pairs of the wirings 71a to 71c (functioning as source electrodes and drain electrodes) and capacitor electrodes 71d to 71f are formed as illustrated in FIG. 2C.

At this time, as illustrated in FIG. 4C, the gate electrode 51 (the gate wiring) intersects the wirings 71a to 71c with the second buffer layer 44 the impurity semiconductor film 65 to which the impurity element serving as a donor is added, the microcrystalline semiconductor film 59 which includes the impurity element serving as a donor, and the first buffer layer 64 interposed therebetween. Therefore, parasitic capacitance of the region where the gate electrode 51 (the gate wiring) intersects the wirings 71a to 71c can be reduced.

Then, the impurity semiconductor film 63 to which the impurity element imparting one conductivity is added is etched using a resist mask to be separated. As a result, as illustrated in FIG. 2C, a pair of the source and drain regions 72 can be formed. Note that a part of the second buffer layer 42 is also etched in this etching process. The second buffer layer which is partly etched and has a recessed portion is referred to as a second buffer layer 43. The source and drain regions and the recessed portion of the second buffer layer can be formed in the same process. The depth of the recessed portion in the second buffer layer 43 is set to half to one third of the thickness of the thickest regions in the second buffer layer 43, so that the source region and the drain region can be spaced apart from each other. Then, leakage current between the source region and the drain region can be reduced. Then, the resist mask is removed.

Next, dry etching may be performed under such a condition that the second buffer layer 43 which is exposed is not damaged and an etching rate with respect to the second buffer layer 43 is low. Through this process, an etching residue on the second buffer layer 43 between the source region and the drain region, a residue of the resist mask, and a contamination source in the apparatus used for removal of the resist mask can be removed, whereby the source region and the drain region can be certainly insulated. As a result, leakage current of the thin film transistor can be reduced, so that a thin film transistor with a small amount of off current and high withstand voltage can be manufactured. Note that a chlorine gas may be used for an etching gas, for example.

Through the above process, a channel etched thin film transistor 74 can be formed.

Figure 5A:
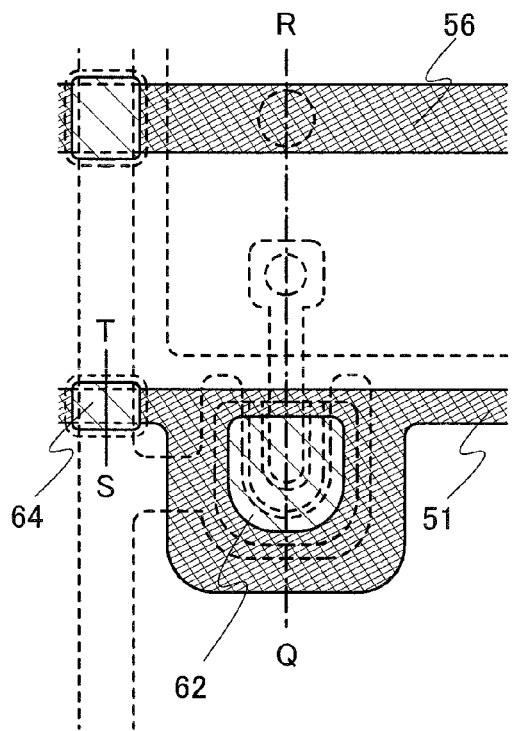
FIGS. 5A to 5D are plan views illustrating a manufacturing process of a thin film transistor of the present invention.
Figure 5B:
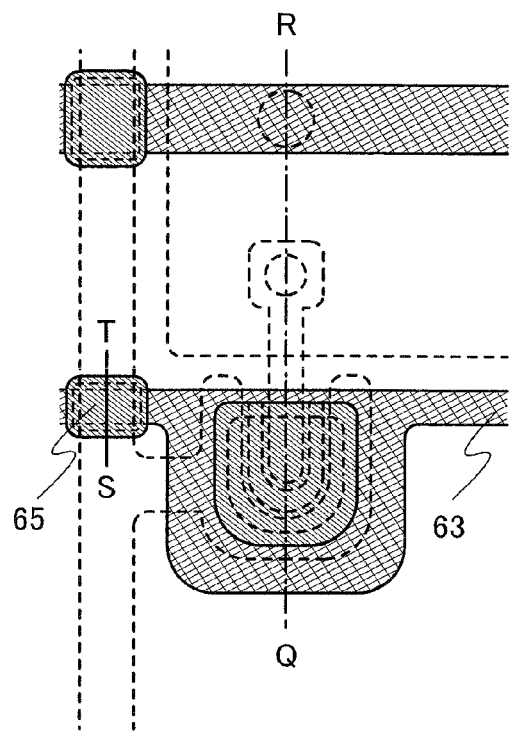
Figure 5C:
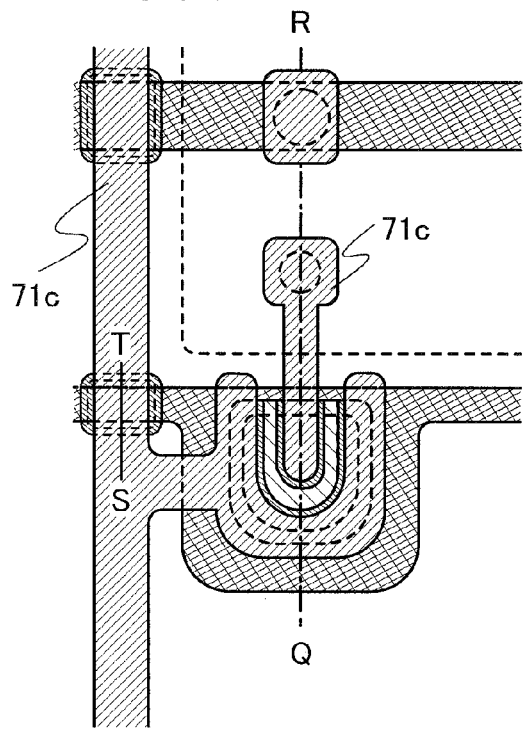
Figure 5D:
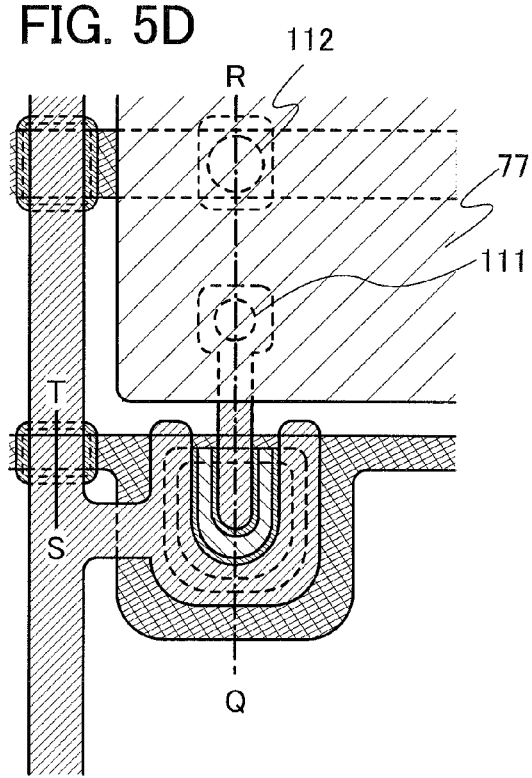

Note that the FIG. 2C corresponds to a cross-sectional view taken along a line Q-R in FIG. 5C, and FIG. 4C corresponds to a cross-sectional view taken along a line S-T in FIG. 5C. As illustrated in FIG. 5C, it can be seen that the end portions of the source and drain regions 72 are positioned in the outside of the end portions of the wiring 71c. Further, unevenness due to the gate electrode has little influence, and reduction in coverage and generation of leakage current can be suppressed because the wirings are overlapped over the gate insulating film with the microcrystalline semiconductor film, the first buffer layer 64, the second buffer layer 44, and the impurity semiconductor film 65 to which the impurity element imparting one conductivity is added interposed therebetween.

Then, as illustrated in FIG. 3A, a protective insulating film 76 is formed over the wirings 71a to 71c, the source and drain regions 72, the second buffer layer 43, and the gate insulating film 52b. The protective insulating film 76 can be formed in a similar manner to the gate insulating films 52a and 52b. Note that the protective insulating film 76 prevents intrusion of a contaminating impurity such as an organic matter, a metal, or water vapor contained in the atmosphere; thus, a dense film is preferably used for the protective insulating film 76. Further, by using a silicon nitride film as the protective insulating film 76, the oxygen concentration in the second buffer layer 43 can be set to $5 \times 10^{19}$ atoms/cm$^3$ or less, preferably, $1 \times 10^{19}$ atoms/cm$^3$ or less, and the second buffer layer 43 can be prevented from being oxidized.

Then, an insulating film 101 is formed over the protective insulating film 76. Here, the insulating film 101 is formed using a photosensitive organic resin. Next, the insulating film 101 is exposed to light and developed using a fifth photomask to form an insulating film 102 in which the protective insulating film 76 is exposed. Then, the protective insulating film 76 is etched using the insulating film 102, and a contact hole 111 which exposes a part of the wiring 71c and a contact hole 112 which exposes the capacitor electrode 71f are formed as illustrated in FIG. 3B.

Next, as illustrated in FIG. 3C, a pixel electrode 77 which is in contact with the wiring 71c and the capacitor electrode 71f are formed in the contact hole 111 and the contact hole 112. Further, a capacitor 106 can be formed using the gate insulating films 52a and 52b, the capacitor electrodes 71d to 71f, and the pixel electrode 77. Here, after a conductive film is formed over the insulating film 102, the pixel electrode 77 is formed by etching the conductive film using a resist mask which is formed through a photolithography process using a sixth photomask.

The pixel electrode 77 can be formed using a light-transmitting conductive material such as indium oxide including tungsten oxide, indium zinc oxide including tungsten oxide, indium oxide including titanium oxide, indium tin oxide including titanium oxide, indium tin oxide, indium zinc oxide, or indium tin oxide to which silicon oxide is added.

Alternatively, the pixel electrode 77 can be formed using a conductive composition containing a conductive high molecule (also referred to as a conductive polymer). It is preferable that the pixel electrode formed using the conductive composition have a sheet resistance of 10000 Ω/square or less and a light transmittance of 70% or more at a wavelength of 550 nm. Further, it is preferable that a conductive high molecule included in the conductive composition have resistance of 0.1 Ω·cm or less.

As the conductive high molecule, a so-called π-electron conjugated conductive high molecule can be used. For example, polyaniline or a derivative thereof, polypyrrole or a derivative thereof, polythiophene or a derivative thereof, a copolymer of more than two kinds of them, and the like can be given.

Here, an ITO film is formed as the pixel electrode 77 by a sputtering method, and then a resist is applied to the ITO film. Subsequently, the resist is exposed to light and developed using the sixth photomask to form a resist mask. Then, the ITO film is etched using the resist mask to form the pixel electrode 77.

Through the above process, a thin film transistor can be formed. Further, an element substrate that can be used in a liquid crystal display device can be formed.

The channel formation region in the thin film transistor manufactured in this embodiment mode is formed with a microcrystalline semiconductor film; thus, a driving frequency of a display device can be increased, whereby the panel size can be increased and high density of pixels can be achieved. Further, the thin film transistor can be manufactured using a large-sized substrate.

Further, since the buffer layer is provided between the microcrystalline semiconductor film which includes the impurity element serving as a donor and the wiring, leakage current between the microcrystalline semiconductor film which includes the impurity element serving as a donor and the wiring can be reduced. Further, since the buffer layer which is formed with the amorphous semiconductor film is provided between the source and drain regions, and the microcrystalline semiconductor film which includes the impurity element serving as a donor, the buffer layer serves as a high resistance region; thus, leakage current can be reduced. Therefore, a thin film transistor with excellent electric characteristics and high reliability can be manufactured.

Although the channel etched thin film transistor is employed in this embodiment mode, but this embodiment can be applied to a channel protective thin film transistor.

Embodiment Mode 2

In this embodiment mode, a process for manufacturing a thin film transistor using a process capable of reducing the number of photomasks compared with Embodiment Mode 1 is described.

Figure 6A:
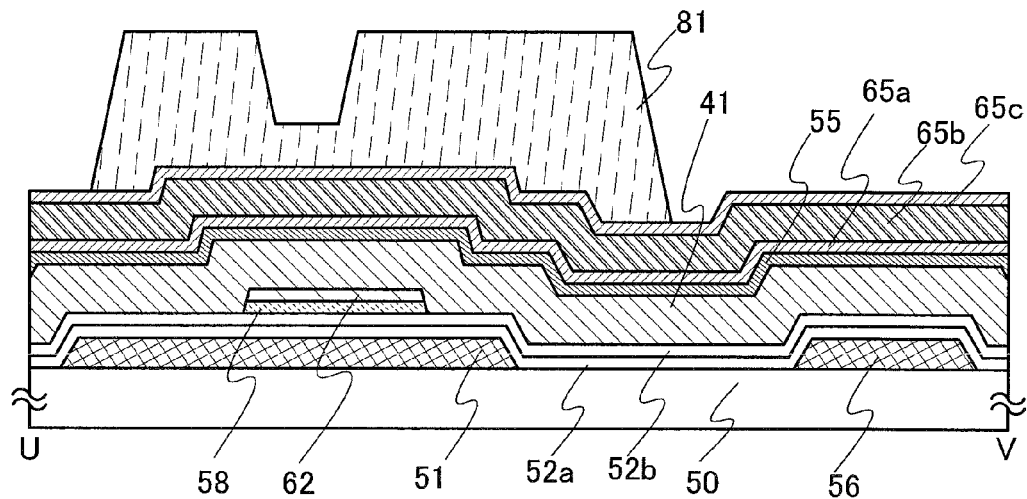
FIGS. 6A to 6C are cross-sectional views illustrating a manufacturing process of a thin film transistor of the present invention.

In a similar manner to Embodiment Mode 1, as illustrated in FIG. 6A, a conductive film is formed over the substrate 50, a resist is applied over the conductive film, and the conductive film is partly etched using a resist mask formed through a photolithography process using the first photomask, so that the gate electrode 51 and the capacitor wiring 56 are formed. Subsequently, the gate insulating films 52a and 52b are formed over the gate electrode 51. Then, the microcrystalline semiconductor film 58 which includes the impurity element serving as a donor and the first buffer layer 62 are formed over the gate insulating film 52 through a photolithography process using the second photomask. Next, the second buffer layer 41, the impurity semiconductor film 55 to which the impurity element imparting one conductivity is added, and the conductive films 65a to 65c are formed in this order over the first buffer layer 62. Then, a resist is applied to the conductive film 65a.

As the resist, a positive type resist or a negative type resist can be used. In this embodiment mode, a positive resist is used.

Next, the resist is irradiated with light with use of a multi-tone mask as the third photomask, so that the resist is exposed to light and thus a resist mask 81 is formed.

Here, light exposure using the multi-tone mask is described with reference to FIGS. 7A to 7D.

A multi-tone mask can achieve three levels of light exposure to obtain an exposed portion, a half-exposed portion, and an unexposed portion; one-time exposure and development process allows a resist mask with regions of plural thicknesses (typically, two kinds of thicknesses) to be formed. Therefore, the use of a multi-tone mask allows the number of photomasks to be reduced.

Figure 7A:
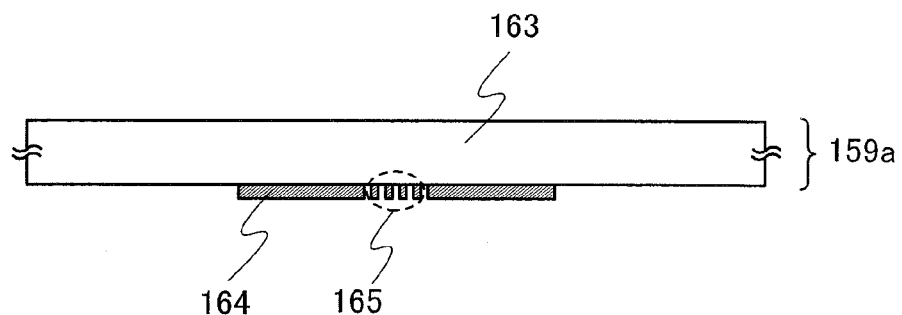
FIGS. 7A to 7D are diagrams illustrating a multi-tone mask applicable to the present invention.
Figure 7B:
Figure 7C:
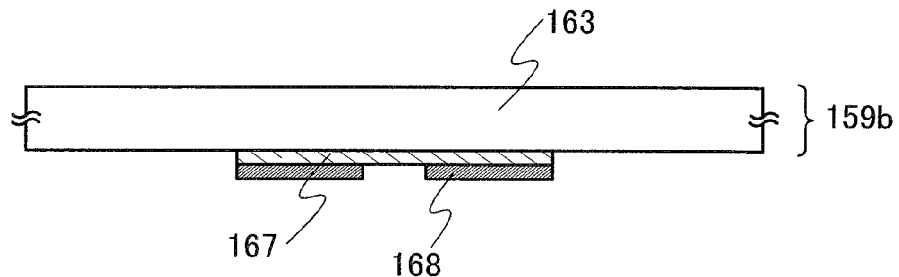

Typical examples of a multi-tone mask include a gray-tone mask 159a as illustrated in FIG. 7A, and a half-tone mask 159b as illustrated in FIG. 7C.

As illustrated in FIG. 7A, the gray-tone mask 159a includes a substrate 163 having a light-transmitting property, and a light-blocking portion 164 and a diffraction grating 165 which are formed over the substrate 163. The light transmittance of the light-blocking portion 164 is 0%. On the other hand, the diffraction grating 165 has a light-transmitting portion in a slit form, a dot form, a mesh form, or the like with intervals less than or equal to the resolution limit of light used for the exposure; thus, the light transmittance can be controlled. Note that the diffraction grating 165 can be in a slit form, a dot form, or a mesh form with regular intervals; or in a slit form, a dot form, or a mesh form with irregular intervals.

For the substrate 163 having a light-transmitting property, a substrate having a light-transmitting property, such as a quartz substrate, can be used. The light-blocking portion 164 and the diffraction grating 165 can be formed using a light-blocking material such as chromium or chromium oxide, which absorbs light.

When the gray-tone mask 159a is irradiated with light for exposure, a light transmittance 166 of the light-blocking portion 164 is 0% and that of a region where neither the light-blocking portion 164 nor the diffraction grating 165 are provided is 100%, as illustrated in FIG. 7B. The light transmittance of the diffraction grating 165 can be controlled in a range of 10 to 70%. The light transmittance 166 of the diffraction grating 165 can be controlled with an interval or a pitch of slits, dots, or meshes of the diffraction grating 165.

As illustrated in FIG. 7C, the half-tone mask 159b includes the substrate 163 having a light-transmitting property, and a semi-transmissive portion 167 and a light-blocking portion 168 which are formed over the substrate 163. The semi-transmissive portion 167 can be formed using MoSiN, MoSi, MoSiO, MoSiON, CrSi, or the like. The light-blocking portion 168 can be formed using a light-blocking material such as chromium or chromium oxide, which absorbs light.

Figure 7D:
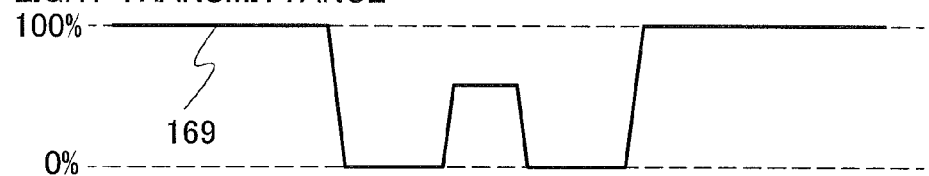

When the half-tone mask 159b is irradiated with light for exposure, a light transmittance 169 of the light-blocking portion 168 is 0% and that of a region where neither the light-blocking portion 168 nor the semi-transmissive portion 167 is provided is 100%, as illustrated in FIG. 7D. The light transmittance of the semi-transmissive portion 167 can be controlled in a range of 10 to 70%. The light transmittance 169 of the semi-transmissive portion 167 can be controlled with the material of the semi-transmissive portion 167.

After the exposure to light using the multi-tone mask, development is carried out, whereby a resist mask 81 having regions with different thicknesses can be formed as illustrated in FIG. 6A.

Figure 6B:
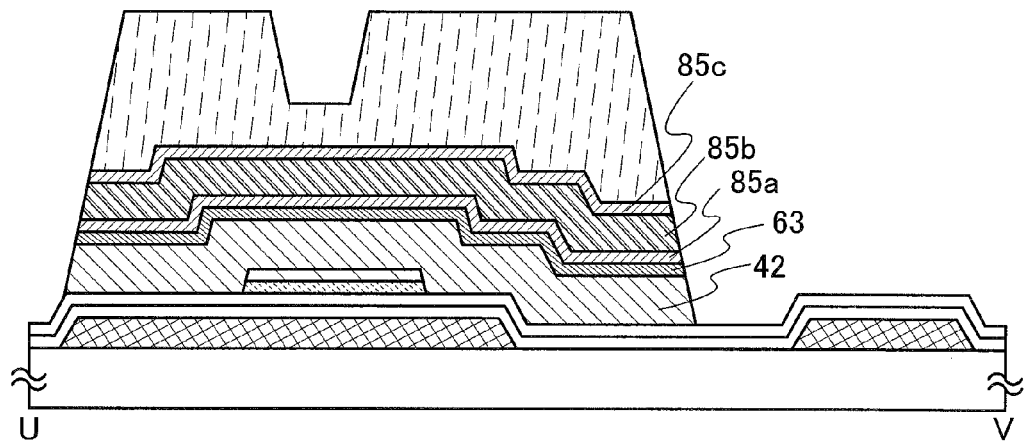

Then, with the resist mask 81, the second buffer layer 41, the impurity semiconductor film 55 to which the impurity element imparting one conductivity is added, and the conductive films 65a to 65c are etched to be separated. As a result, the second buffer layer 42, the impurity semiconductor film 63 to which the impurity element imparting one conductivity is added, and conductive films 85a to 85c can be formed as illustrated in FIG. 6B. Note that FIG. 6A (excluding the resist mask 81) corresponds to a cross-sectional view taken along a line U-V in FIG. 9A.

Figure 6C:
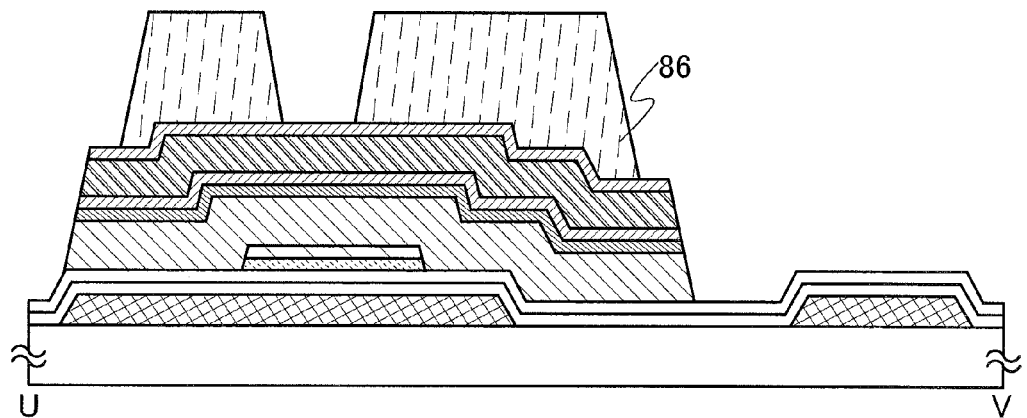

Next, ashing is conducted to the resist mask 81. As a result, the areas and the thicknesses of the resist are reduced. At this time, the resist in a region with a small thickness (a region overlapping with part of the gate electrode 51) is removed to form resist masks 86 which is separated, as illustrated in FIG. 6C.

Figure 8A:
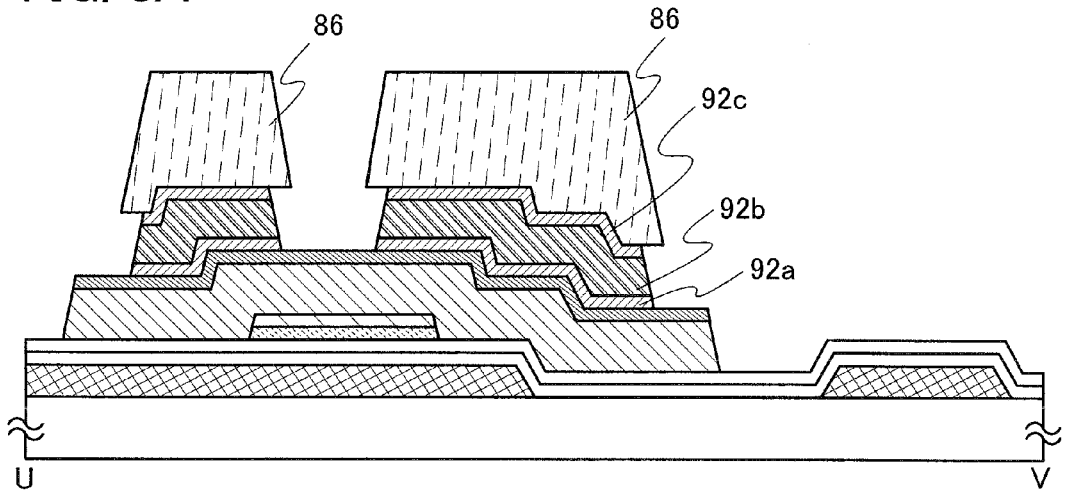
FIGS. 8A to 8C are cross-sectional views illustrating a manufacturing process of a thin film transistor of the present invention.

Next, the conductive films 85a to 85c are etched to be separated using the resist masks 86. As a result, pairs of wirings 92a to 92c can be formed as illustrated in FIG. 8A. When conductive films 89a to 89c are etched by wet etching using the resist masks 86, the conductive films 89a to 89c are isotropically etched. As a result, the wirings 92a to 92c having smaller areas than the resist masks 86 can be formed.

Figure 8B:
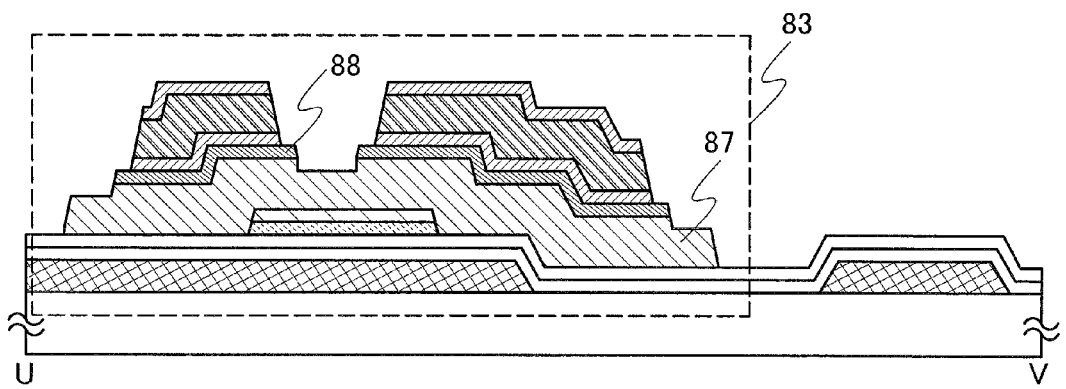

Next, as illustrated in FIG. 8B, the impurity semiconductor film 63 to which the impurity element imparting one conductivity is added is etched using the resist masks 86 to form a pair of source and drain regions 88. Note that a part of the second buffer layer 42 is also etched in this etching process. The second buffer layer which is partly etched is referred to as a second buffer layer 87. Note that the second buffer layer 87 has a recessed portion. The source and drain regions and the recessed portion of the second buffer layer can be formed in the same process. Here, the second buffer layer 87 is partly etched with use of the resist masks 86 having a smaller area than the resist mask 81, so that end portions of the second buffer layer 87 are located outside the source and drain regions 88. Further, the end portions of the wirings 92a to 92c are not aligned with the end portions of the source and drain regions 88, and the end portions of the source and drain regions 88 are formed in the outside of the end portions of the wirings 92a to 92c. Then, the resist masks 86 are removed. Note that FIG. 8B corresponds to a cross-sectional view taken along a line U-V in FIG. 9B.

Then, dry etching may be performed under such a condition that the buffer layer which is exposed is not damaged and an etching rate with respect to the buffer layer is low. Through this process, an etching residue on the buffer layer between the source region and the drain region, a residue of the resist mask, and a contamination source in the apparatus used for removal of the resist mask can be removed, whereby the source region and the drain region can be certainly insulated. As a result, leakage current of the thin film transistor can be reduced, so that a thin film transistor with low off current and high withstand voltage can be manufactured. Note that a chlorine gas may be used for an etching gas, for example.

Through the above process, a channel etched thin film transistor 83 can be formed. In addition, the thin film transistor can be formed using two photomasks.

Figure 8C:
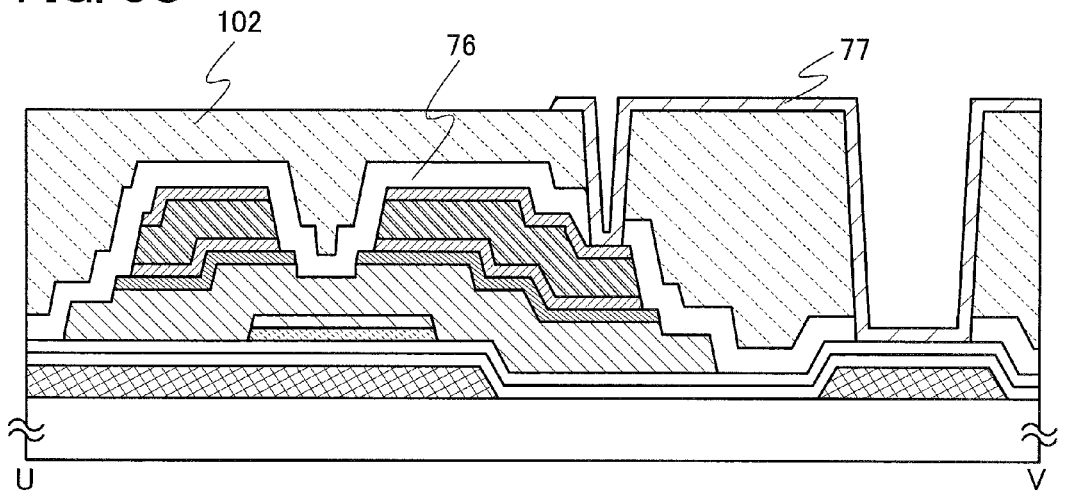

Then, through a similar process to Embodiment Mode 1, as illustrated in FIG. 8C, a protective insulating film and an insulating film are formed over the wirings 92a to 92c, the source and drain regions 88, the second buffer layer 87, and the gate insulating film 52b, and a contact hole is formed through a photolithography process using the fourth photomask. The protective insulating film at this time is referred to as a protective insulating film 76a.

At this time, etching for forming a contact hole over the capacitor wiring 56 can be stopped at the gate insulating film 52b under such a condition that the gate insulating film 52b and the protective insulating film 76a are formed using films having different etching selection ratios (for example, the gate insulating film 52b is formed with a silicon oxynitride film, and the protective insulating film 76a is formed with a silicon nitride film) and the protective insulating film 76a is etched selectively. Therefore, a capacitor element can be formed from the capacitor wiring 56, the gate insulating films 52a and 52b, and the pixel electrode 77.

Further, the gate insulating film 52b and the protective insulating film 76a are formed of the same material, and the gate insulating film 52a and the gate insulating film 52b are formed with films having different etching selection ratios (for example, the gate insulating film 52b and the protective insulating film 76a are formed with silicon nitride films, and the gate insulating film 52a is formed with a silicon oxynitride film); thus, etching for forming a contact hole over the capacitor wiring 56 can be stopped at the gate insulating film 52a under such a condition that the protective film 76a and the gate insulating film 52b are etched selectively. Therefore, the capacitor element can be formed from the capacitor wiring 56, the gate insulating film 52a, and the pixel electrode 77. As the thickness of the insulating film (here, the gate insulating film 52a) between the two conductive films (here, the capacitor wiring 56 and the pixel electrode 77) is smaller, the capacitor can take on high capacitance, which is preferable.

Next, the pixel electrode 77 can be formed over the insulating film 102 through a photolithography process using the fifth photomask. Note that FIG. 8C corresponds to a cross-sectional view taken along a line U-V in FIG. 9C.

Through the above process, a thin film transistor can be manufactured. Further, an element substrate that can be used for a display device can be formed.

Through the above process, an element substrate that is provided with a thin film transistor and can be used for a display device can be formed through a process capable of reducing the number of photomasks by one photomask compared with Embodiment Mode 1.

Embodiment Mode 3

In this embodiment mode, a mode which is different from the thin film transistors in Embodiment Modes 1 and 2 is described.

Figure 10:
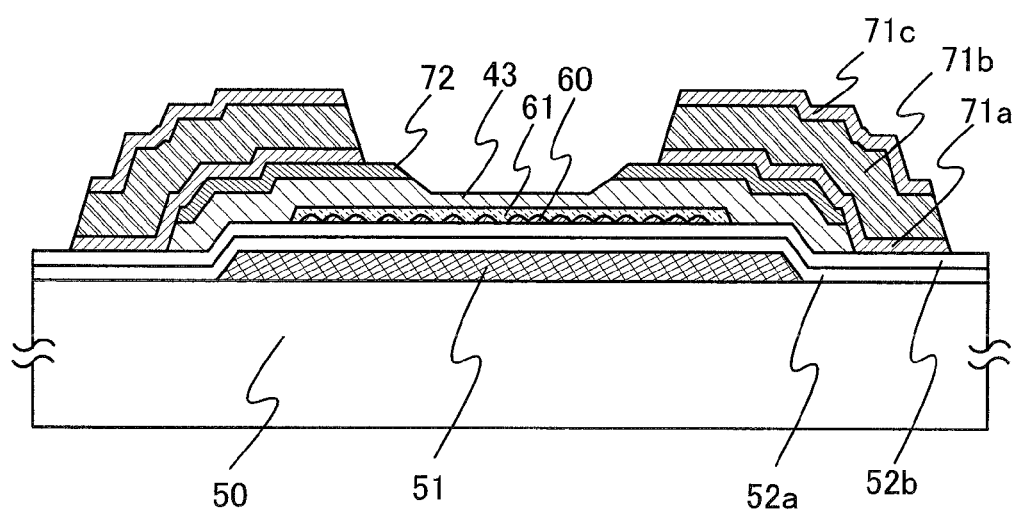
FIG. 10 is a cross-sectional view illustrating a thin film transistor of the present invention.

FIG. 10 illustrates a mode of thin film transistor in which crystal grains 60 which include an impurity element serving as a donor are dispersed over the gate insulating film 52b, and the crystal grains 60 which include the impurity element serving as a donor and a semiconductor film 61 which covers the crystal grains 60 which include the impurity element serving as a donor and the gate insulating film 52b and contains germanium as its main component are included instead of the microcrystalline semiconductor film which includes the impurity element serving as a donor of the thin film transistors shown in Embodiment Modes 1 and 2. In addition, the second buffer layer 43 which covers top and side surfaces of the semiconductor film 61 which contains germanium as its main component is formed. Compared with the crystal grains 60 which contains silicon as its main component, the semiconductor film 61 which contains germanium as its main component has higher mobility, so carriers move in the semiconductor film 61 which contains germanium as its main component. Therefore, the semiconductor film 61 which contains germanium as its main component and formed over the gate insulating film 52b functions as a channel formation region of thin film transistor.

Further, since the second buffer layer 43 covers top and side surfaces of the semiconductor film 61 which contains germanium as its main component, the semiconductor film 61 which contains germanium as its main component is not in contact with the wirings 71a to 71c, and leakage current can be reduced. Therefore, a thin film transistor which has a large amount of on current, high field effect mobility, and a small amount of off current can be manufactured.

The crystal grains 60 which include the impurity element serving as a donor are formed as follows. A microcrystalline semiconductor film or an amorphous semiconductor film which includes an impurity element serving as a donor is formed over the gate insulating film 52 in a similar manner to Embodiment Mode 1. Next, the microcrystalline semiconductor film or the amorphous semiconductor film which includes the impurity element serving as a donor is exposed to plasma, so that the crystal grains 60 are formed. As for plasma, at least one of hydrogen, fluorine, and fluoride is introduced to a reaction chamber of a plasma CVD apparatus, and high frequency power source is applied; thus, plasma is generated.

By introducing at least one of fluorine, fluoride, and hydrogen to apply high frequency power source, hydrogen plasma or fluorine plasma is generated. Hydrogen plasma generates plasma by introducing hydrogen to a reaction chamber. Fluorine plasma generates plasma by introducing fluorine or fluoride to a reaction chamber. As fluoride, HF, $SiF_4$, $SiHF_3$, $SiH_2F_2$, $SiH_3F$, $Si_2F_6$, $GeF_4$, $GeHF_3$, $GeH_2F_2$, $GeH_3F$, $Ge_2F_6$, or the like can be given. Note that instead of fluorine, fluoride, or hydrogen, a rare gas may be introduced to a reaction chamber to generate rare gas plasma.

Hydrogen radicals, fluorine radicals, or the like are generated in plasma by a hydrogen plasma, a fluorine plasma, or the like. Hydrogen radicals react with amorphous component of the microcrystalline semiconductor film or the amorphous semiconductor film which includes the impurity element serving as a donor, and etch the amorphous component while crystallizing a part of a semiconductor film. Further, the fluorine radicals etch the amorphous component of the microcrystalline semiconductor film or the amorphous semiconductor film which includes the impurity element serving as a donor. Therefore, crystal grains with high crystallinity can be left. Further, in a case where the amorphous semiconductor film which includes the impurity element serving as a donor is formed over the gate insulating film 52b, a part of amorphous component is crystallized and crystal grains can be formed as well as the amorphous component is etched. Therefore, the amorphous component at the interface with the gate insulating film is also etched by plasma; thus, crystal grains can be formed over the gate insulating film.

Plasma is generated by applying HF band (3 MHz to 30 MHz, typically 13.56 MHz or 27.12 MHz), or VHF band of 30 MHz to 300 MHz, typically 60 MHz. Further, a high frequency plasma of, for example, 1 GHz or 2.45 GHz can be used. In particular, by using high frequency power of 13.56 MHz, uniformity of plasma can be raised; thus, even in the sixth to tenth generation large-sized substrates, a germanium film can be exposed to plasma with high uniformity, so high frequency power of 13.56 MHz is preferable for mass production.

Next, the semiconductor film 61 which contains germanium as its main component is formed over the crystal grains 60, whereby adhesion of the semiconductor film 61 which contains germanium as its main component can be improved. Further, crystal growth is generated using the crystal grains 60 as a crystal nucleus, whereby a microcrystalline semiconductor film can be formed as the semiconductor film 61 which contains germanium as its main component.

In a case where the semiconductor film 61 which contains germanium as its main component is formed by a CVD method, hydrogen is introduced to a reaction chamber of a plasma CVD apparatus with a deposition gas containing germanium, high frequency power is applied, and plasma is generated; thus, an amorphous germanium film or a microcrystalline semiconductor film is formed as the semiconductor film 61 which contains germanium as its main component. Further, by using a deposition gas containing silicon in addition to a deposition gas containing germanium and hydrogen, an amorphous silicon germanium film or a microcrystalline silicon germanium film is formed.

Note that as for the semiconductor film 61 which contains germanium as its main component, as one mode of forming an amorphous germanium film, an amorphous germanium film can be formed in a reaction chamber by glow discharge plasma using a deposition gas containing germanium. Alternatively, by dilution of a deposition gas containing germanium with one of plural kinds of rare gases selected from helium, argon, krypton, and neon, an amorphous germanium film can be formed by glow discharge plasma. Further, by glow discharge plasma using hydrogen with a flow rate of 1 to 10 times, preferably 1 to 5 times as high as that of a deposition gas containing germanium, an amorphous germanium film can be formed. Further, by using a deposition gas containing silicon in addition to a deposition gas containing germanium and hydrogen, an amorphous silicon germanium film can be formed as the semiconductor film 61 which contains germanium as its main component.

Further, as one mode of forming a microcrystalline germanium film as the semiconductor film 61 which contains germanium as its main component, in a reaction chamber, by glow discharge plasma using a deposition gas containing germanium, here, a mixed gas of germanium, and hydrogen and/or a rare gas, a microcrystalline germanium film is formed. Germane is diluted with hydrogen and/or a rare gas to be 10 to 2000 times thinner. Therefore, a large amount of hydrogen and/or a rare gas is needed. The substrate heating temperature is from 100 to 400° C., preferably from 250 to 350° C. Furthermore, by using a deposition gas containing silicon in addition to a deposition gas containing germanium and hydrogen, a microcrystalline silicon germanium ($Si_y Ge_{1-y}$, $0<y<0.5$) film can be formed as the semiconductor film 61 which contains germanium as its main component.

In a process of forming the semiconductor film 61 which contains germanium as its main component, glow discharge plasma is generated by applying high frequency power with a frequency of 1 to 30 MHz, typically high frequency power of 13.56 MHz or 27.12 MHz, or applying high frequency power with a frequency in the VHF band of 30 to about 300 MHz, typically 60 MHz.

Instead of the microcrystalline semiconductor film 45 which includes the impurity element serving as a donor and the first buffer layer 54 shown in Embodiment Mode 1, after the above-described crystal grains which include the impurity element serving as a donor and the semiconductor film which contains germanium as its main component are formed, a thin film transistor as illustrated in FIG. 10 can be manufactured through the same process as in Embodiment Mode 1. Further, a thin film transistor can be formed through the same steps as in Embodiment Mode 2.

Figure 11:
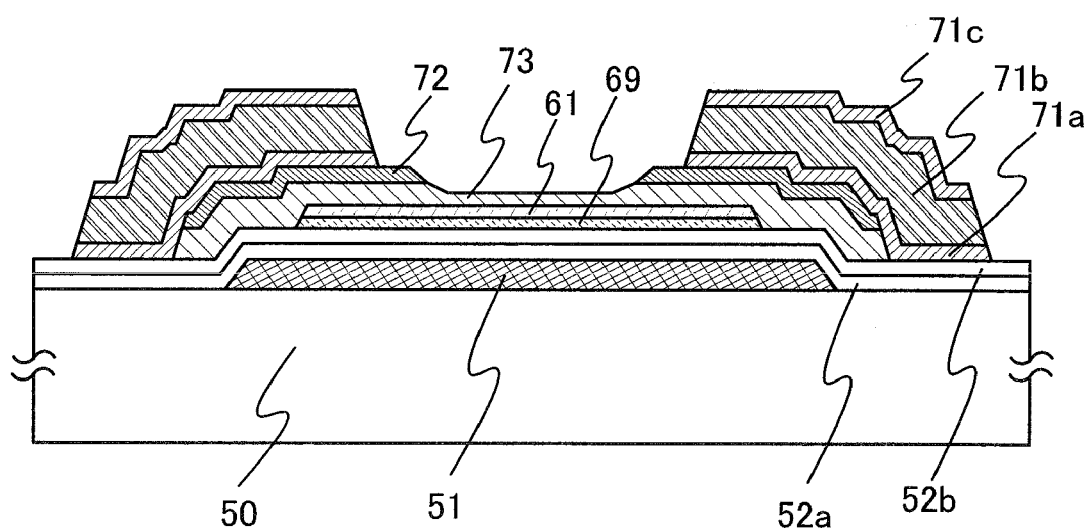
FIG. 11 is a cross-sectional view illustrating a thin film transistor of the present invention.

FIG. 11 illustrates a mode which is different from Embodiment Mode 1. In the same manner as Embodiment Mode 1, after the microcrystalline semiconductor film 45 which includes the impurity element serving as a donor is formed over the gate insulating film 52, a semiconductor film which contains germanium as its main component is formed. Next, in the same manner as Embodiment Mode 1, the microcrystalline semiconductor film 45 which includes the impurity element serving as a donor and the semiconductor film which contains germanium as its main component are etched using a resist mask which is formed in a photolithography process using the second photomask, whereby a microcrystalline semiconductor film 69 which includes an impurity element serving as a donor and the semiconductor film 61 which contains germanium as its main component are formed. Next, in the same process as in Embodiment Mode 1, as illustrated in FIG. 11, the microcrystalline semiconductor film 69 which includes the impurity element serving as a donor is formed over the gate insulating film 52b, and the semiconductor film 61 which contains germanium as its main component is formed thereover, whereby a thin film transistor which includes the buffer layer 73 covering side surfaces of the microcrystalline semiconductor film 69 which includes the impurity element serving as a donor and the semiconductor film 61 which contains germanium as its main component can be manufactured. Further, a thin film transistor can be formed through the same process as in Embodiment Mode 2.

Further, since the semiconductor film 61 which contains germanium as its main component is in contact with the microcrystalline semiconductor film 69 which contains silicon as its main component, adhesion between them is improved. Therefore, yield of thin film transistor can be increased.

As for the microcrystalline semiconductor film 69 which includes the impurity element serving as a donor, microcrystals are formed on the surface of the film, so the crystallinity of surface of the microcrystalline semiconductor film 69 which includes the impurity element serving as a donor is high. If the semiconductor film 61 which contains germanium as its main component is formed thereover, crystal growth is generated using the crystal grain of surface of the microcrystalline semiconductor film 69 as a crystal nucleus, whereby the semiconductor film 61 which contains germanium as its main component with high crystallinity, typically a microcrystalline semiconductor film which contains germanium as its main component is formed. Since the semiconductor film 61 which contains germanium as its main component has low resistivity, carriers flow preferentially in the semiconductor film 61 which contains germanium as its main component side. Therefore, a thin film transistor shown in this embodiment mode has high field effect mobility and a large amount of on current.

Further, since the buffer layer 73 covers the top and side surfaces of the semiconductor film 61 which contains germanium as its main component, the semiconductor film 61 which contains germanium as its main component is not in contact with the wirings 71a to 71c, whereby leakage current can be reduced. Therefore, a thin film transistor which a large amount of on current, high field effect mobility, and a small amount of off current can be manufactured.

Embodiment Mode 4

In this embodiment mode, a structure of the thin film transistor shown in any of the above embodiment modes is described below.

Figure 12A:
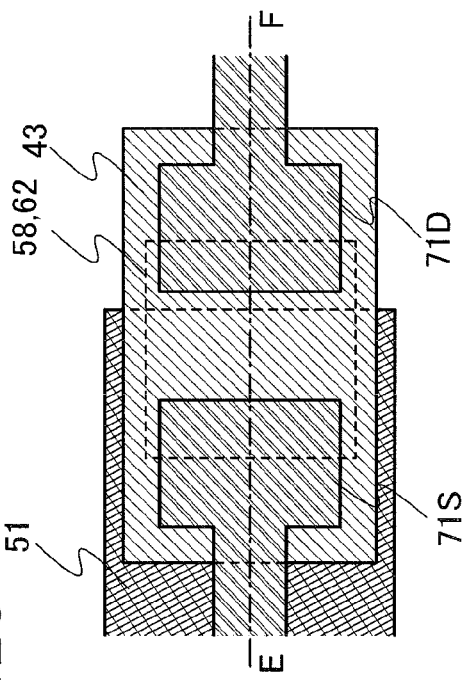
FIGS. 12A to 12D are plan views and cross-sectional views illustrating diodes of the present invention.
Figure 12B:
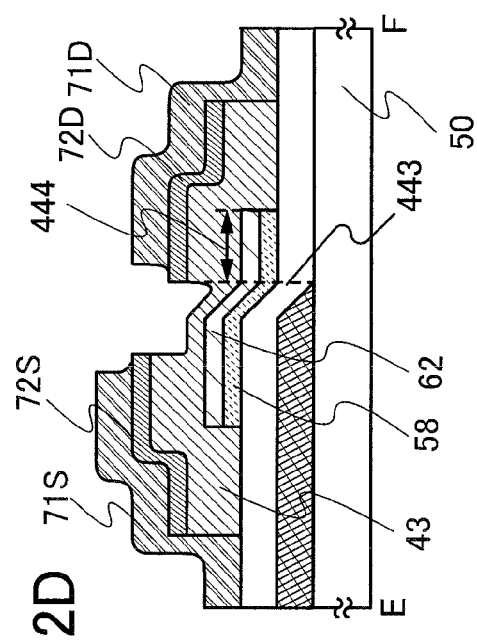

FIG. 12A illustrates a top structure of a thin film transistor in a case of source electrode and drain electrode parallel to each other, and FIG. 12B illustrates a cross-sectional view taken along a line E-F in FIG. 12A.

In FIG. 12B, the gate electrode 51 and the gate insulating film are formed over the substrate 50, and the microcrystalline semiconductor film 58 which includes the impurity element serving as a donor and the first buffer layer 62 are formed inside the gate electrode. Further, the second buffer layer 43, which covers the microcrystalline semiconductor film 58 which includes the impurity element serving as a donor and the first buffer layer 62, is formed. Further, a source region 72S and a drain region 72D, and a source region 71S and a drain region 71D, which are opposite to each other, are formed over the second buffer layer 43.

In FIG. 12B, an overlapping region 441 of the gate electrode 51 and the drain region 72D, and an overlapping region 442 of the microcrystalline semiconductor film 58 which includes the impurity element serving as a donor and the drain region 72D are provided. Further, the overlapping regions 441 and 442 are overlapped with each other.

In a thin film transistor illustrated in FIGS. 12A and 12B, since the gate electrode 51 and the drain region 72D, and the microcrystalline semiconductor film 58 which includes the impurity element serving as a donor and the drain region 72D are overlapped, a thin film transistor which has a large amount of on current and high field effect mobility can be manufactured.

Figure 12C:
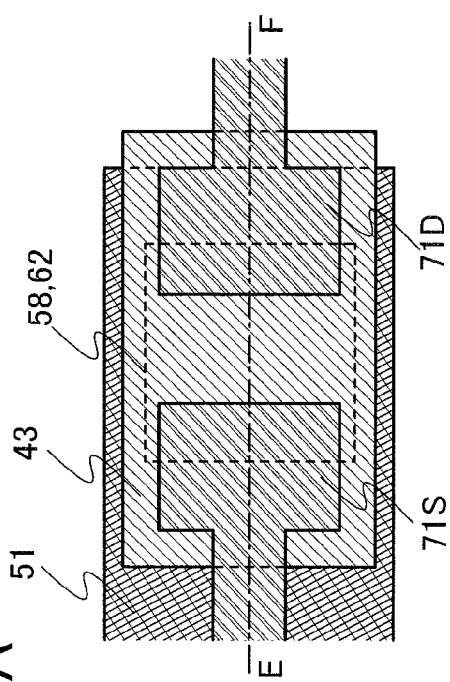
Figure 12D:
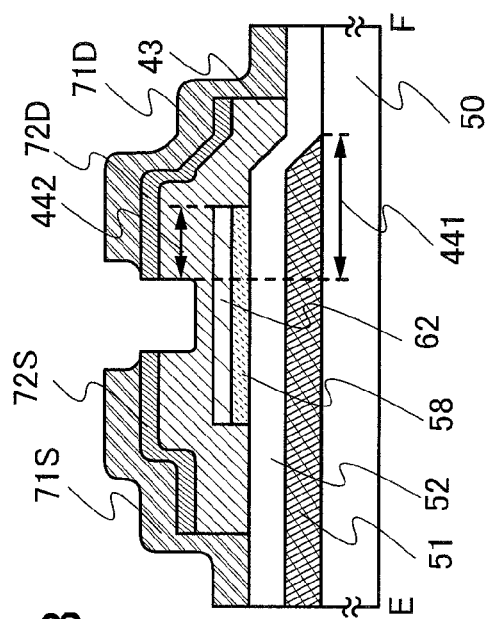

FIG. 12C illustrates a top structure of a thin film transistor, and FIG. 12D illustrates a cross-sectional view taken along a line E-F in FIG. 12C.

In FIG. 12C, the gate electrode 51 and the gate insulating film are formed over the substrate 50, and the microcrystalline semiconductor film 58 which includes the impurity element serving as a donor and the first buffer layer 62 are formed to cover the end portions of the gate electrode. Further, the second buffer layer 43, which covers the microcrystalline semiconductor film 58 which includes the impurity element serving as a donor and the first buffer layer 62, is formed. Further, the source region 72S and the drain region 72D, and the source region 71S and the drain region 71D, which are opposite to each other, are formed over the second buffer layer 43.

In FIG. 12D, the end portion of the gate electrode 51 and the end portion of the drain region 71D are aligned with each other, and an overlapping region 444 of the microcrystalline semiconductor film 58 which includes the impurity element serving as a donor and the drain region 72D is provided.

In the thin film transistor illustrated in FIGS. 12C and 12D, since the gate electrode 51 and the drain region 72D are not overlapped with each other, parasitic capacitance can be reduced. Therefore, a thin film transistor which suppresses a voltage drop in the drain electrode side can be manufactured. Therefore, in a display device using this structure, response speed of pixel can be improved. In particular, in a case of a thin film transistor formed in a pixel of a liquid crystal display device, a voltage drop of drain voltage can be suppressed; thus, response speed of a liquid crystal material can be increased.

FIG. 13A illustrates a top structure of a thin film transistor, in a case where an opposite region of a source electrode and a drain electrode has a curved shape, and the shape of the source or drain electrode is U-shape or C-shape, FIG. 13B illustrates a cross-sectional view taken along a line G-H in FIG. 13A, and FIG. 13C illustrates a cross-sectional view taken along a line E-F in FIG. 13A.

In FIGS. 13B and 13C, the gate electrode 51 and the gate insulating film are formed over the substrate 50, and the microcrystalline semiconductor film 58 which includes the impurity element serving as a donor and the first buffer layer 62 are formed in the inside of the gate electrode. Further, the second buffer layer 43, which covers the microcrystalline semiconductor film 58 which includes the impurity element serving as a donor and the first buffer layer 62, is formed. Further, the source region and drain region 72, and the source region 71S and the drain region 71D, which are opposite to each other, are formed over the second buffer layer 43.

In FIGS. 13B and 13C, an overlapping region 449 of the gate electrode 51 and the drain region 72D and an overlapping region 450 of the microcrystalline semiconductor film 58 which includes the impurity element serving as a donor and the drain region 72D are provided. Further, the overlapping regions 449 and 450 are overlapped with each other. Further, one of the wirings has a shape (specifically, a U-shape or a C-shape) to surround the other of the source region and the drain region. Thus, an area in which carriers can move can be increased, and thus the amount of current can be increased and an area for a thin film transistor can be reduced.

Embodiment Mode 5

In this embodiment mode, in the element substrate 1300 illustrated in FIG. 14, structures and manufacturing methods of protection circuits 1334 and 1336 formed between the pixel portion 1331 and an input terminals 1332 and 1333 are described below. Protection circuits shown in this embodiment mode are formed using a Schottky diode.

The input terminal 1332 on the scan line side and an input terminal 1333 on the signal line side which are formed over the substrate 1330 are connected to the pixel portion 1331 by wirings which are extended in vertical and horizontal directions. The wirings are connected to protection circuits 1334 to 1337.

The pixel portion 1331 and the input terminal 1332 are connected by a wiring 1339. The protection circuit 1334 is provided between the pixel portion 1331 and the input terminal 1332, and is connected to the wiring 1339. By the protection circuit 1334, various semiconductor elements such as thin film transistors or the like, which are included in the pixel portion 1331, can be protected and thus deterioration or damage can be prevented. Note that although the wiring 1339 corresponds to one wiring in the drawing, all of a plurality of wirings provided in parallel to the wiring 1339 have connection relation which is similar to that of the wiring 1339. Note that the wiring 1339 functions as a scan line (gate wiring).

Note that as for the protection circuit 1334 on the scan line side, not only the protection circuit 1334 provided between the input terminal 1332 and the pixel portion 1331 but also another protection circuit may be provided on the opposite side of the input terminal 1332 across the pixel portion 1331 (see the protection circuit 1335 in FIG. 14).

Further, the pixel portion 1331 and the input terminal 1333 are connected by a wiring 1338. The protection circuit 1336 is provided between the pixel portion 1331 and the input terminal 1333, and is connected to the wiring 1338. By the protection circuit 1336, various semiconductor elements such as thin film transistors or the like, which are included in the pixel portion 1331, can be protected and thus deterioration or damage can be prevented. Note that although the wiring 1338 corresponds to one wiring in the drawing, all of a plurality of wirings provided in parallel to the wiring 1338 have connection relation which is similar to that of the wiring 1338. Note that the wiring 1338 functions as a scan line (a source wiring).

Note that as for the protection circuit 1336 on the signal line side, not only the protection circuit 1336 provided between the input terminal 1333 and the pixel portion 1331 but also another protection circuit may be provided on the opposite side of the input terminal 1333 across the pixel portion 1331 (see the protection circuit 1337 in FIG. 14).

Note that all the protection circuits 1334 to 1337 are not necessarily provided. However, at least the protection circuit 1334 is required to be provided. This is because when an excessive amount of current is generated in the wiring 1339 which is a scan line, the gate insulating films of the thin film transistors included in the pixel portion 1331 are damaged and thus a point defect may be generated.

In addition, when not only the protection circuit 1334 but also the protection circuit 1336 which is a signal line is provided, generation of excessive current in the wiring 1338 which is a signal line can be prevented. Therefore, compared to a case where only the protection circuit 1334 is provided, reliability is improved and thus yield is improved. When the protection circuit 1336 is provided, electrostatic discharge damage that can be caused in a rubbing process after formation of the thin film transistors can also be prevented.

Further, when the protection circuit 1335 and the protection circuit 1337 are provided, reliability can be further improved and thus yield can be improved. The protection circuit 1335 and the protection circuit 1337 are provided on the opposite sides of the input terminal 1332 and the input terminal 1333, respectively. Therefore, the protection circuit 1335 and the protection circuit 1337 contribute to prevention of deterioration or damage of the various semiconductor elements, which is caused in the manufacturing process of a display device.

Next, examples of specific circuit structures of protection circuits which are used as the protection circuits 1334 to 1337 in FIG. 14 are described below.

Figure 15:
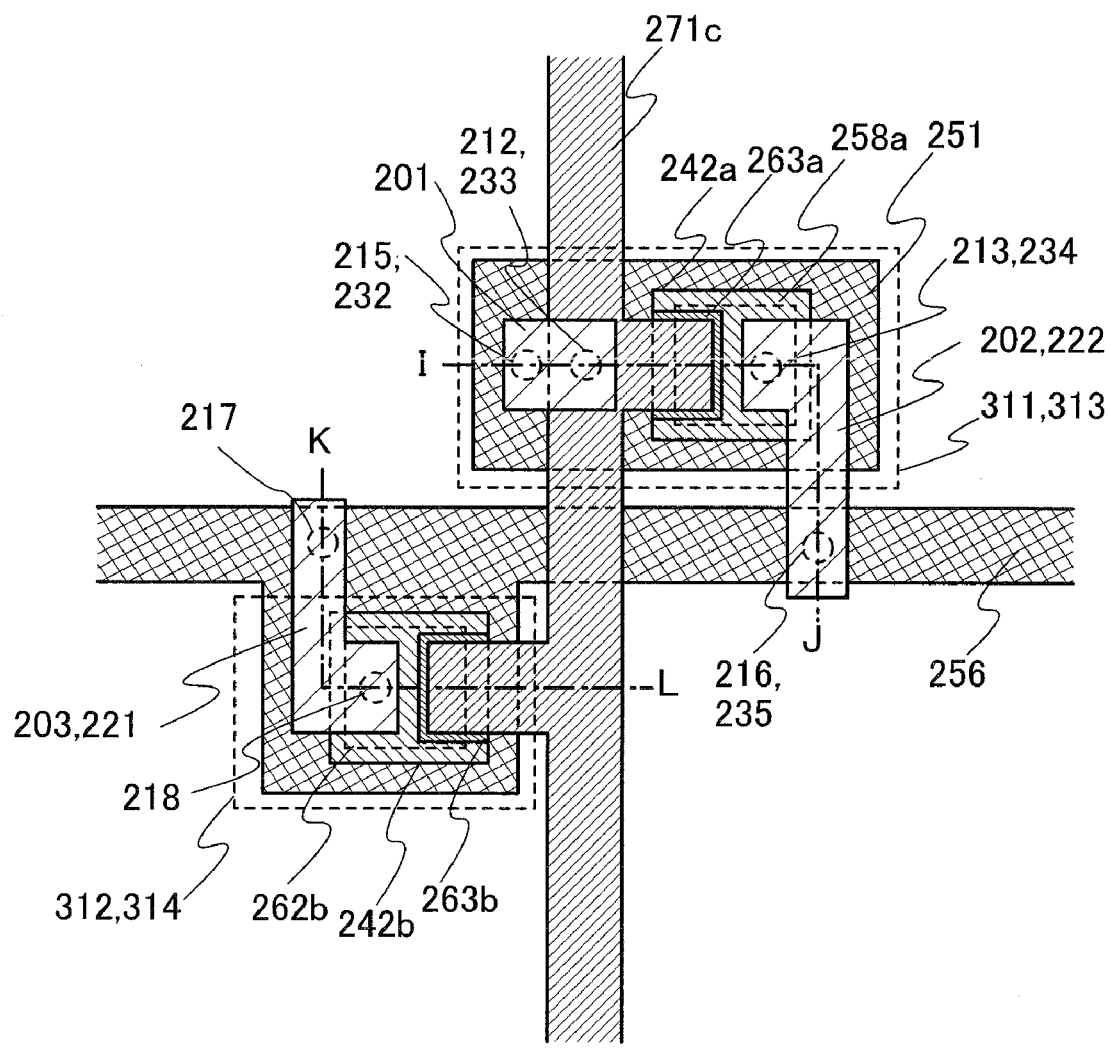
FIG. 15 is a plan view illustrating a diode of the present invention.

A protection circuit illustrated in FIG. 15 include a plurality of diodes. In the protection circuit, diodes 311 and 312 which are connected to a signal line 271c (the wiring 1338 which is a signal line, illustrated in FIG. 14) are included. Here, FIG. 16A illustrates a cross-sectional view taken along a line I-J in FIG. 15, and FIG. 16B illustrates a cross-sectional view taken along a line K-L in FIG. 15.

Figure 16A:
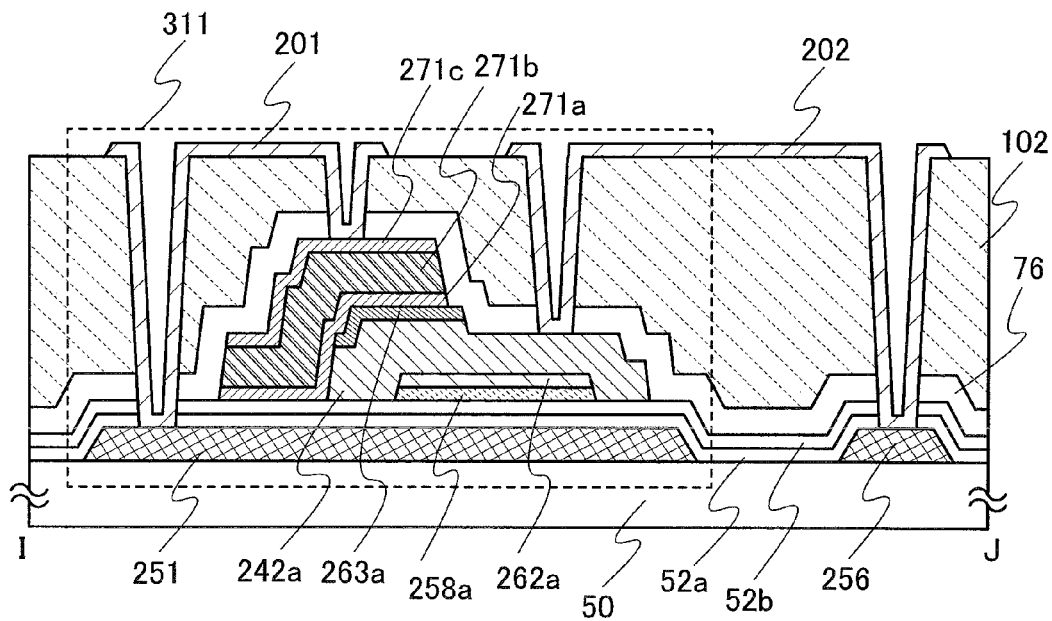
FIGS. 16A and 16B are cross-sectional views illustrating a diode of the present invention.

As illustrated in FIG. 16A, signal lines 271a and 271b and the signal line 271c in the diode 311 are connected to a gate electrode 251 through a conductive film 201, and in contact with a source region or drain region 263a. Further, a second buffer layer 242a in the diode 311 is connected to a common line 256 through a conductive film 202. Here, since the common line 256 is in contact with the second buffer layer 242a which is formed with an amorphous semiconductor film to which an impurity element serving as a donor is not added through the conductive film 202, Schottky junction is formed.

Figure 16B:
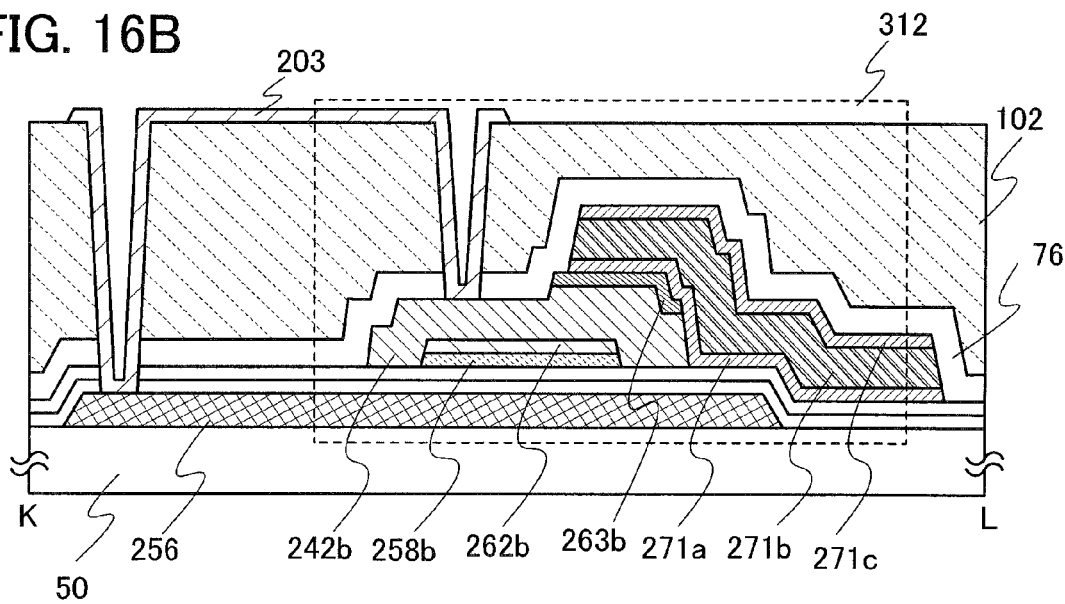

Further, as illustrated in FIG. 16B, the gate electrode in the diode 312 is formed using the common line 256, and the common line 256 is connected to the second buffer layer 242b through the conductive film 203. Further, the signal lines 271a to 271c are in contact with the source or drain region 263b. Here, since the common line 256 is in contact with the second buffer layer 242a which is formed with an amorphous semiconductor film to which the impurity element serving as a donor is not added through the conductive film 203, Schottky junction is formed.

Note that in a case of a protection film which is provided in the wiring 1339 which is a scan line illustrated in FIG. 15, the signal lines 271a to 271c in FIGS. 16A and 16B function as common lines, and the common line 256 in FIGS. 16A and 16B functions as a scan line.

When positive voltage of which absolute value is large is applied from an input terminal of the signal lines 271a to 271c, positive voltage is applied to the gate electrode 251 and the signal lines 271a to 271c in the diode 311 in FIG. 16A, and carriers are generated in the microcrystalline semiconductor film 258a which includes the impurity element serving as a donor; thus, current flows to the common line 256. Further, when negative voltage of which absolute value is large is applied from an input terminal of the signal lines 271a to 271c, negative voltage is applied to the signal lines 271a to 271c in the diode 312 in FIG. 16B, and a potential difference equal to or higher than the threshold voltage between the gate electrode and the signal lines 271a to 271c is generated; thus, carriers are generated in the microcrystalline semiconductor film 258b which includes the impurity element serving as a donor, and current flows to the common line 256. Therefore, electrostatic discharge damage of the thin film transistor provided in the pixel portion can be prevented.

Next, a manufacturing process of the diode 311 illustrated in FIG. 16A is described with reference to FIGS. 17A to 17D. Here, a manufacturing method of the diode 311 is described using Embodiment Mode 1; however, Embodiment Mode 2 can be used as appropriate.

Figure 17A:
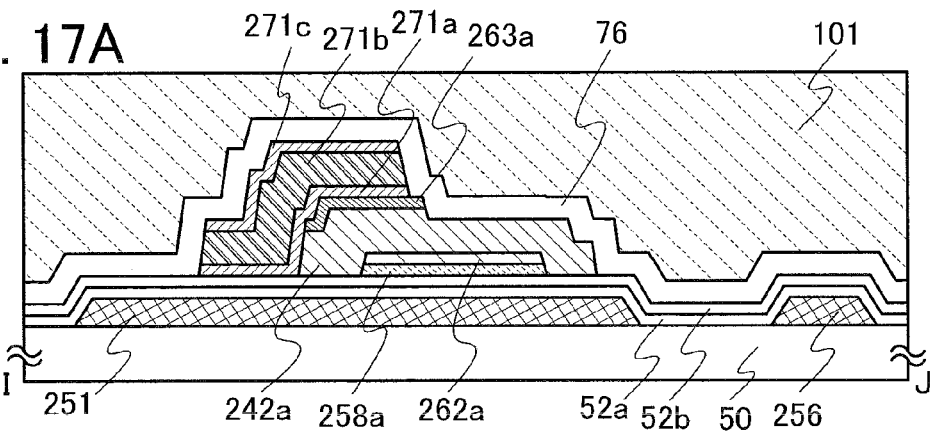
FIGS. 17A to 17D are cross-sectional views illustrating a manufacturing process of a diode of the present invention.

The gate electrode 251 and the common line 256 are formed over the substrate 50 through the same process as in Embodiment Mode 1 as illustrated in FIG. 17A. Next, the gate insulating films 52a and 52b are formed over the gate electrode 251 and the common line 256.

Next, in the same manner as Embodiment Mode 1, the microcrystalline semiconductor film 258a which includes the impurity element serving as a donor and the first buffer layer 262a are formed over the gate insulating film 52b.

Next, in the same manner as Embodiment Mode 1, the second buffer layer 242a is formed over the first buffer layer 262a and the gate insulating film 52b.

Next, in the same manner as Embodiment Mode 1, the source or drain region 263a and the signal lines 271a to 271c are formed. In this case, a part of the second buffer layer 242a which is not covered with the signal lines 271a to 271c is thinner.

Next, in the same manner as Embodiment Mode 1, the protective insulating film 76 and the insulating film 101 are formed.

Figure 17B:
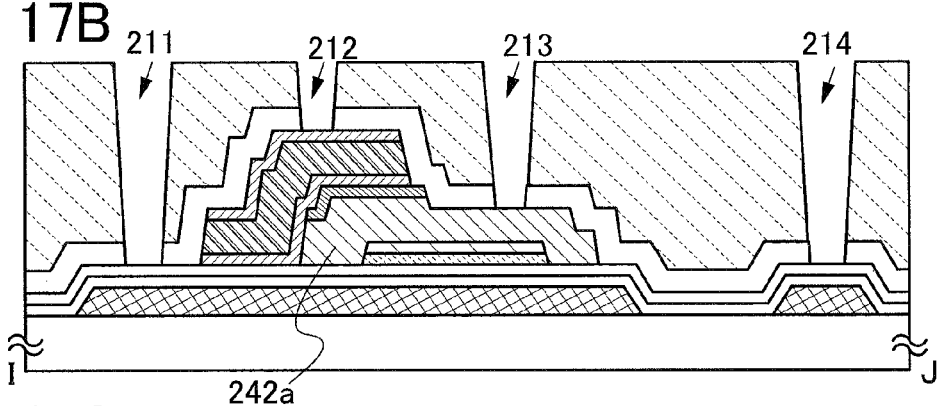

Next, as illustrated in FIG. 17B, contact holes 211 and 214 which expose the gate insulating film 52b, a contact hole 212 which exposes the signal line 271c, and a contact hole 213 which exposes the second buffer layer 242a are formed.

Figure 17C:
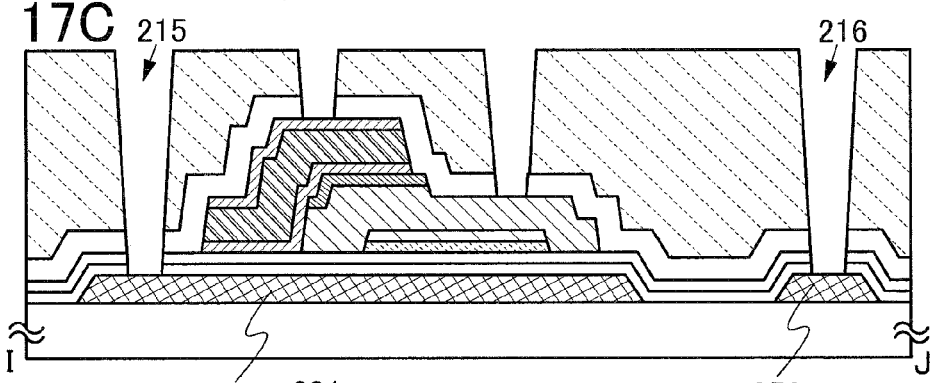

Next, as illustrated in FIG. 17C, the gate insulating films 52a and 52b are etched under a condition that the gate insulating films 52a and 52b are etched selectively so that contact holes 215 and 216 which expose the gate electrode 251 and the common line 256 respectively are formed.

Figure 17D:
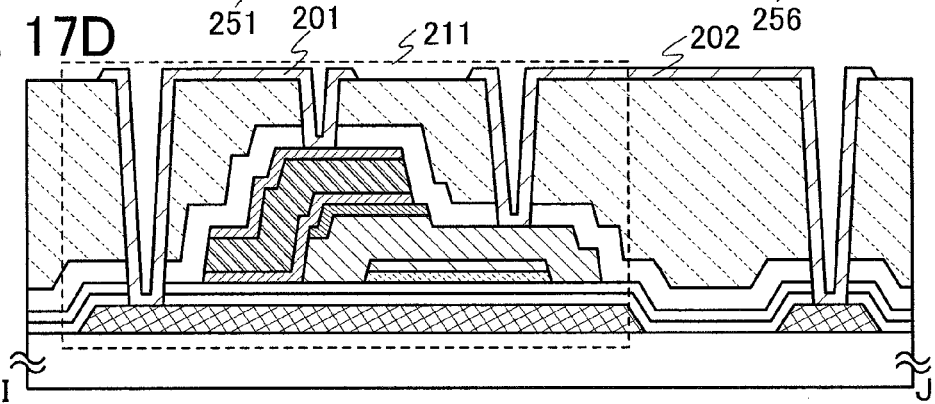

Next, as illustrated in FIG. 17D, the conductive film 201 which connects the gate electrode 251 and the signal line 271c, and the conductive film 202 which connects the second buffer layer 242a and the common line 256 are formed at the same time as the pixel electrode 77 is formed.

Through the above process, the diode 311 can be formed. Further, by the same number of masks as that used to form the thin film transistors shown in Embodiment Modes 1 to 3, a protection circuit can be formed.

Embodiment Mode 6

In this embodiment mode, a structure and a manufacturing method of protection circuit which are different from those of the protection circuit in Embodiment Mode 5 are described below. In this embodiment mode, a diode which forms Schottky junction of a microcrystalline semiconductor film which includes an impurity element serving as a donor, a first buffer layer, a second buffer layer, and a common line is used for description.

Figure 18A:
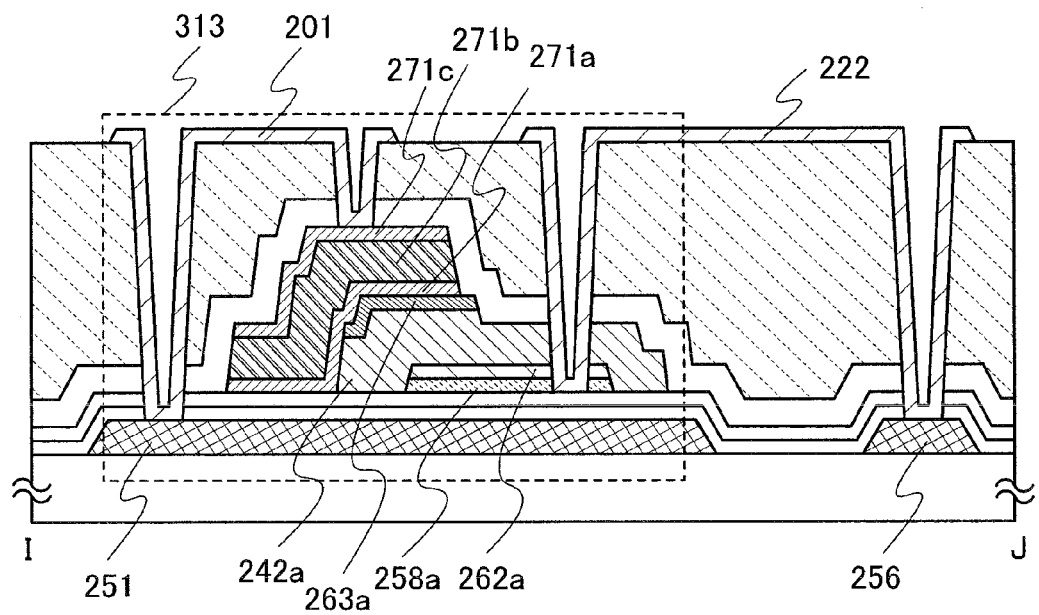
FIGS. 18A and 18B are cross-sectional views illustrating a diode of the present invention.
Figure 18B:
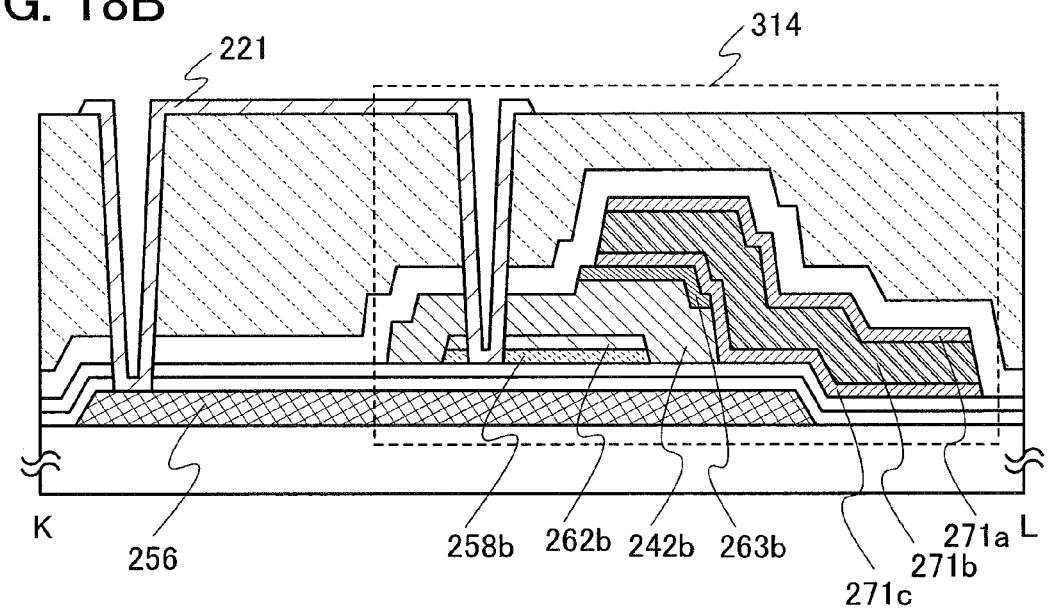

Here, FIG. 18A illustrates a cross-sectional view taken along a line I-J in FIG. 15, and FIG. 18B illustrates a cross-sectional view taken along a line K-L in FIG. 15.

As illustrated in FIG. 18A, the signal lines 271a to 271c in the diode 313 are connected to the gate electrode 251 through the conductive film 201, and in contact with the source or drain region 263a. Further, the microcrystalline semiconductor film 258a which includes the impurity element serving as a donor, the first buffer layer 262a, and the second buffer layer 242a in the diode 313 are connected to the common line 256 through the conductive film 222. Here, since the common line 256 is in contact with the first buffer layer 262a and the second buffer layer 242a which are formed with an amorphous semiconductor film to which the impurity element serving as a donor is not added and the microcrystalline semiconductor film 258a which includes the impurity element serving as a donor at a low concentration through the conductive film 222, Schottky junction is formed.

Further, as illustrated in FIG. 18B, a gate electrode in the diode 314 is formed of the common line 256, and the common line 256 is connected to the microcrystalline semiconductor film 258b which includes the impurity element serving as a donor, the first buffer layer 262b, and the second buffer layer 242b in the diode 314 through the conductive film 221. Further, the signal lines 271a to 271c in the diode 314 are in contact with the source or drain region 263b. Here, since the common line 256 is in contact with the first buffer layer 262b and the second buffer layer 242b which are formed with an amorphous semiconductor film to which the impurity element serving as a donor is not added, and the microcrystalline semiconductor film 258b which includes the impurity element serving as a donor at a low concentration through the conductive film 221, Schottky junction is formed.

Note that, in a case of a protection circuit provided in the wiring 1339 which is a scan line illustrated in FIG. 15, the signal lines 271a to 271c in FIGS. 18A and 18B function as common lines, and the common line 256 in FIGS. 18A and 18B functions as a scan line.

When high positive voltage is applied from the input terminal of the signal lines 271a to 271c, positive voltage is applied to the gate electrode 251 and the signal lines 271a to 271c in the diode 313 in FIG. 18A, and carriers are generated in the microcrystalline semiconductor film 258a which includes the impurity element serving as a donor; thus, current flows to the common line 256. Further, when negative voltage of which absolute value is large is applied from an input terminal of the signal lines 271a to 271c, negative voltage is applied to the signal lines 271a to 271c in the diode 314 in FIG. 18B, and a potential difference equal to or higher than the threshold voltage is generated between the gate electrode and the signal lines 271a to 271c; thus, carriers are generated in the microcrystalline semiconductor film 258b which includes the impurity element serving as a donor, and current flows to the common line 256. Therefore, electrostatic discharge damage of the thin film transistor provided in the pixel portion can be prevented.

Next, a manufacturing method of the diode 313 illustrated in FIG. 18A is described with reference to FIGS. 19A to 19D. Here, a manufacturing method of the diode 313 is described using Embodiment Mode 1; however, Embodiment Mode 2 can be used as appropriate.

Figure 19A:
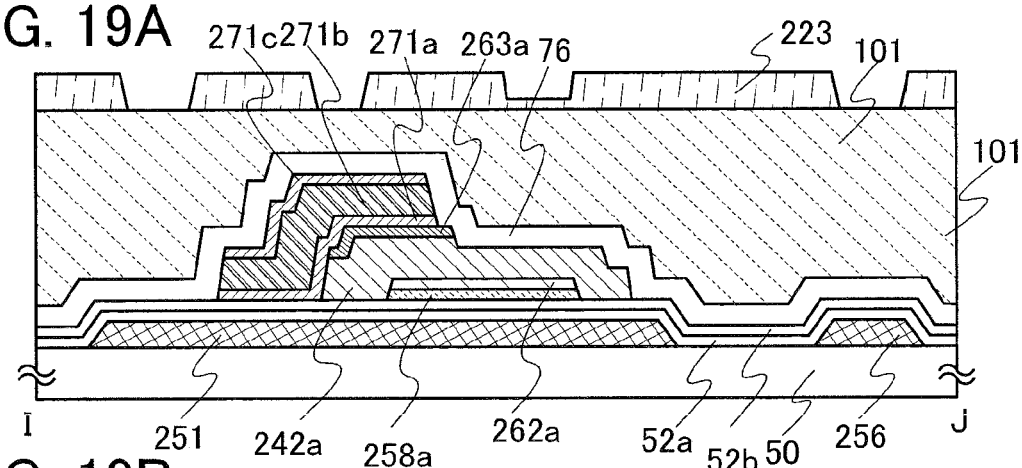
FIGS. 19A to 19D are cross-sectional views illustrating a manufacturing process of a diode of the present invention.

In the same manner as Embodiment Mode 5, as illustrated in FIG. 19A, the gate electrode 251 and the common line 256 are formed over the substrate 50. Next, the gate insulating films 52a and 52b are formed over the gate electrode 251 and the common line 256. Next, the microcrystalline semiconductor film 258a which includes the impurity element serving as a donor and the first buffer layer 262a are formed over the gate insulating film 52b. The second buffer layer 242a is formed over the first buffer layer 262a and the gate insulating film 52b. Next, the signal lines 271a to 271c and the source or drain region 263a are formed. In this case, a part of the second buffer layer 242a which is not covered with the signal lines 271a to 271c is thinner. Next, the protective insulating film 76 and the insulating film 101 are formed. Note that here, a non-photosensitive resin is preferably used for the insulating film 101.

Next, a resist is applied over the insulating film 101. Next, the resist is irradiated with light with the use of a multi-tone mask which is shown in Embodiment Mode 2, so that the resist is exposed to the light and developed to form a resist mask 223 which has a plurality of thicknesses. Here, in the formation region of contact holes which expose the gate electrode 251, the signal lines 271a to 271c, and the common line 256, the resist can be exposed to 100% light. Further, in the formation region of contact holes which expose the microcrystalline semiconductor film 258a which includes the impurity element serving as a donor, the first buffer layer 262a, and the second buffer layer 242a, the resist mask 223 which has a plurality of thicknesses can be formed with the use of a multi-tone mask that can make the resist exposed to 10 to 70% light.

Figure 19B:
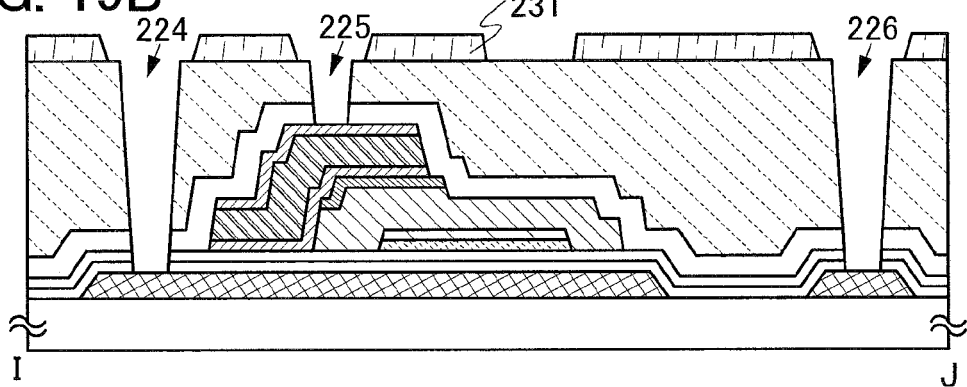

Next, as illustrated in FIG. 19B, the insulating film 101 is etched using the resist mask 223. Next, the protective insulating film 76 is etched. Next, the gate insulating films 52a and 52b are selectively etched. As a result, contact holes 224 and 226 which expose the gate electrode 251 and the common line 256 respectively, and a contact hole 225 which exposes the signal line 271c can be formed.

Figure 19C:
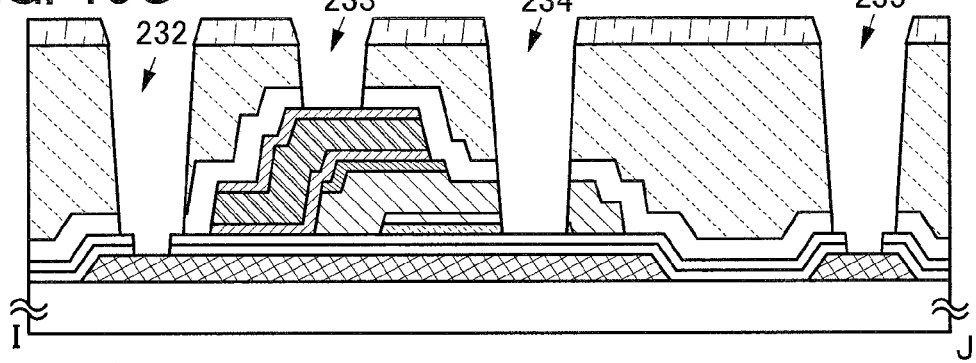
Figure 19D:
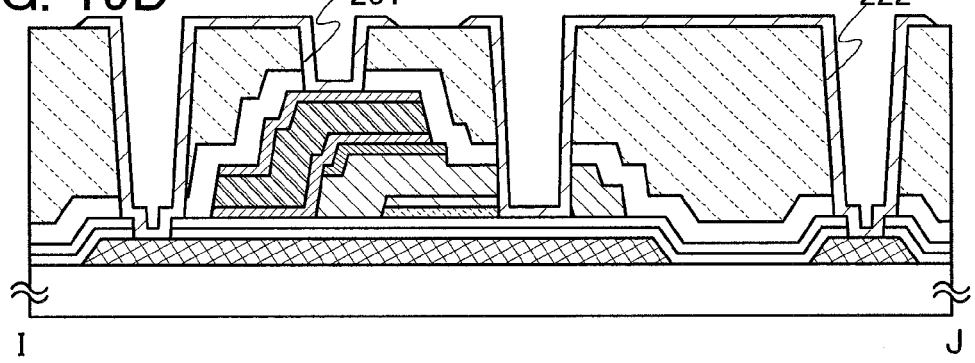

Next, ashing is conducted to the resist mask 223 so that the resist mask 223 is recessed; thus, a resist mask 231 in which a region of which the thickness is small is separated is formed. Then, the insulating film 101 and the protective insulating film 76 are etched using the mask. Then, parts of each of the microcrystalline semiconductor film 258a which includes the impurity element serving as a donor, the first buffer layer 262a, and the second buffer layer 242a are etched, so that a contact hole 234 which exposes the gate insulating film 52b as illustrated in FIG. 19C is formed. In this case, it is preferable that each of the insulating film 101, the protective insulating film 76, the microcrystalline semiconductor film 258a which includes the impurity element serving as a donor, the first buffer layer 262a, and the second buffer layer 242a is partially etched under a condition that the gate insulating film 52b is not etched. Further, by the etching process, each of the insulating film 102 and the protective insulating film 76 is partially etched also in the contact holes 224 to 226 illustrated in FIG. 19B, and contact holes 232, 234, and 235 which have top shapes with double circles are formed.

Then, in the same manner as Embodiment Mode 5, the conductive film 201 which connects the gate electrode 251 and the signal line 271c, and the conductive film 222 which connects the second buffer layer 242a and the common line 256 are formed at the same time as the pixel electrode is formed.

Through the above process, a diode can be formed. Further, by the same number of masks as that used to form the thin film transistors shown in Embodiment Modes 1 to 3, a protection circuit can be formed.

Embodiment Mode 7

In this embodiment mode, a structure and a manufacturing method of a protection circuit which are different from those of the protection circuits in Embodiment Modes 5 and 6 are described below. In this embodiment mode, a diode which forms Schottky junction of a microcrystalline semiconductor film which includes an impurity element serving as a donor, a first buffer layer, and a second buffer layer is used for description.

Figure 20:
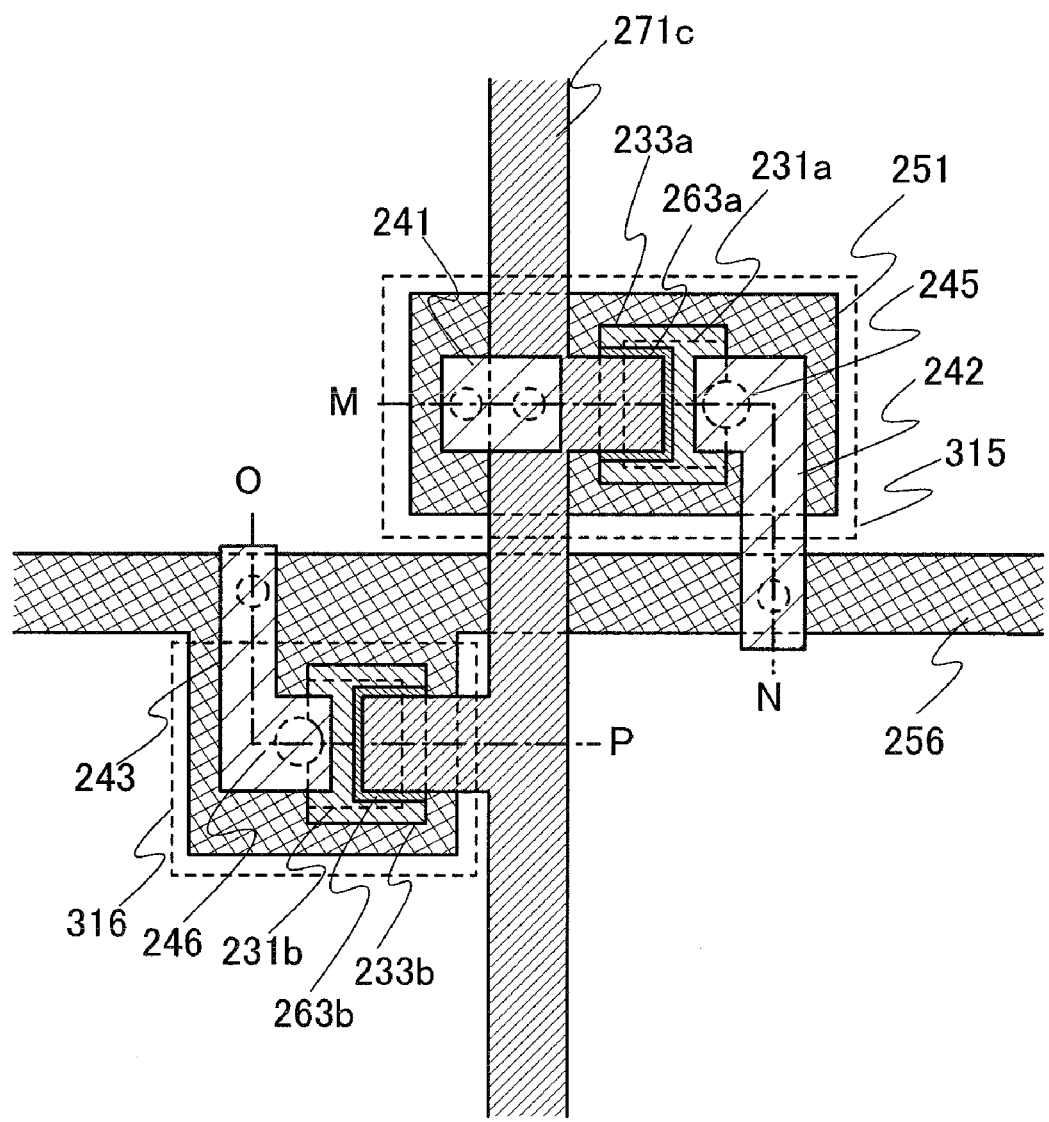
FIG. 20 is a plan view illustrating a diode of the present invention.
Figure 21A:
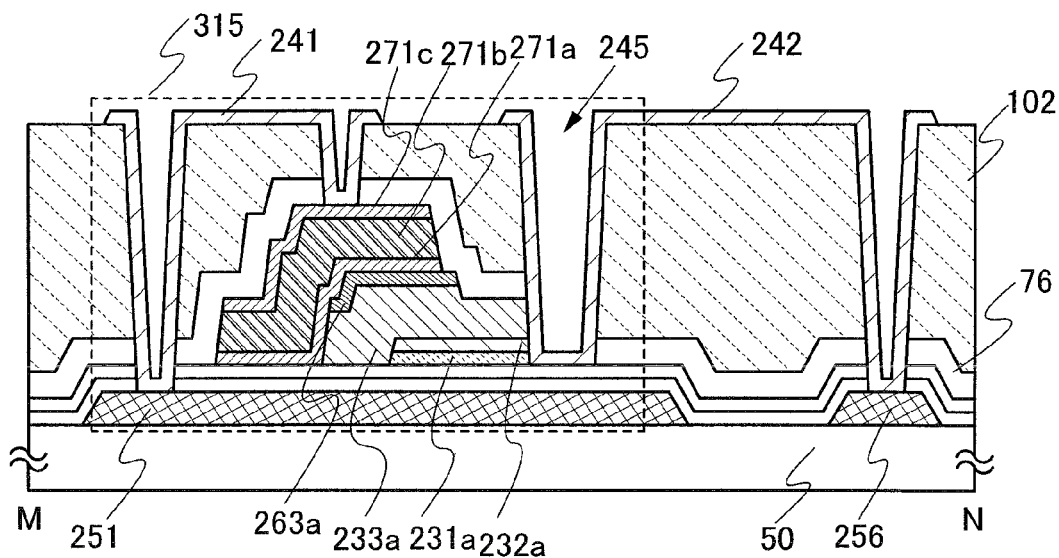
FIGS. 21A and 21B are cross-sectional views illustrating diodes of the present invention.
Figure 21B:
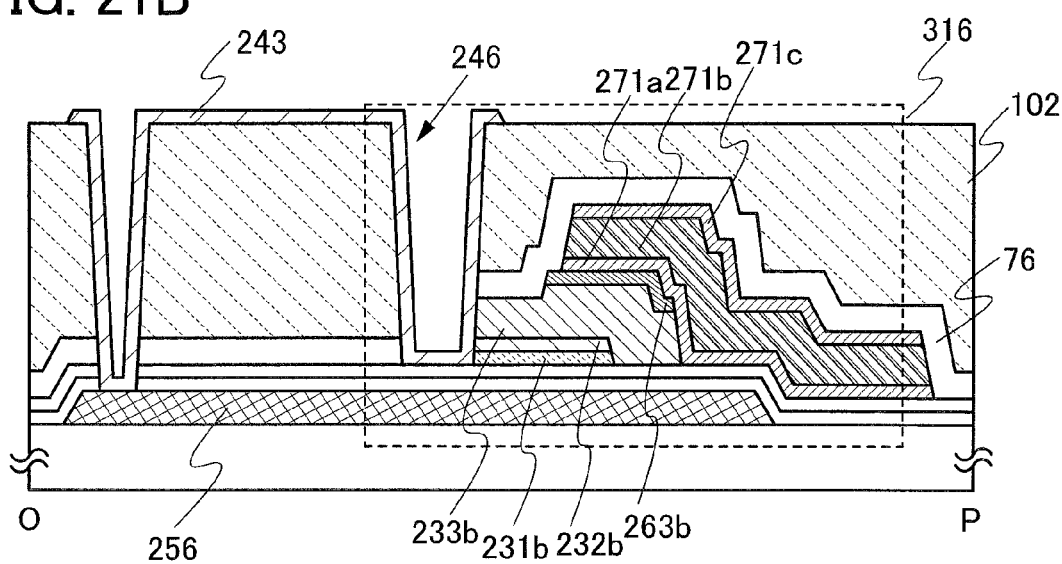

Here, FIG. 21A illustrates a cross-sectional view taken along a line M-N in FIG. 20, and FIG. 21B illustrates a cross-sectional view taken along a line O-P in FIG. 20.

As illustrated in FIG. 20, in a diode 315 of this embodiment mode, a contact hole 245 which is in contact with the common line 256, a microcrystalline semiconductor film 231a which includes an impurity element serving as a donor, a first buffer layer 232a, and a second buffer layer 233a is formed at the end portion of the microcrystalline semiconductor film 231a which includes the impurity element serving as a donor, the first buffer layer 232a, and the second buffer layer 233a, which is different from the diode in Embodiment Mode 6. Similarly, in a diode 316 in this embodiment mode, a contact hole 246 which is in contact with the common line 256, a microcrystalline semiconductor film 231b which includes an impurity element serving as a donor, a first buffer layer 232b, and a second buffer layer 233b is formed at the end portion of the microcrystalline semiconductor film 231b which includes the impurity element serving as a donor, the first buffer layer 232b, and the second buffer layer 233b, which is different from the diode in Embodiment Mode 6.

As illustrated in FIG. 21A, the signal lines 271a to 271c in the diode 315 are connected to the gate electrode 251 through the conductive film 241, and is in contact with the source or drain region 263a. Further, the microcrystalline semiconductor film 231a which includes the impurity element serving as a donor, the first buffer layer 232a, and the second buffer layer 233a in the diode 315 are connected to the common line 256 through the conductive film 242. Here, since the common line 256 is in contact with the first buffer layer 232a and the second buffer layer 233a which are formed with an amorphous semiconductor film to which an impurity element serving as a donor is not added, and the microcrystalline semiconductor film 231a which includes the impurity element serving as a donor at a low concentration, Schottky junction is formed.

Further, a gate electrode in the diode 316 is formed with the common line 256, and the common line 256 is connected to the microcrystalline semiconductor film 231b which includes the impurity element serving as a donor, the first buffer layer 232b, and the second buffer layer 233b in the diode 316 through the conductive film 243. Further, the signal lines 271a to 271c in the diode 316 are in contact with the source or drain region 263b. Here, since the common line 256 is in contact with the first buffer layer 232a and the second buffer layer 233a which are formed of an amorphous semiconductor film to which the impurity element serving as a donor is not added, and the microcrystalline semiconductor film 231b which includes the impurity element serving as a donor at a low concentration, Schottky junction is formed.

Note that in a case of a protection circuit provided in the wiring 1339 which is a scan line illustrated in FIG. 15, the signal lines 271a to 271c in FIGS. 21A and 21B function as common lines, and the common line 256 in FIGS. 21A and 21B functions as a scan line.

When high positive voltage is applied from the input terminal of the signal lines 271a to 271c, positive voltage is applied to the gate electrode 251 and the signal lines 271a to 271c in the diode 315 in FIG. 21A, and carriers are generated in the microcrystalline semiconductor film 231a which includes the impurity element serving as a donor; thus, current flows to the common line 256. Further, when negative voltage of which absolute value is large is applied from an input terminal of the signal lines 271a to 271c, negative voltage is applied to the signal lines 271a to 271c in the diode 316 in FIG. 21B, and a potential difference equal to or higher than the threshold voltage is generated between the common line 256 the signal lines 271a to 271c; thus, carriers are generated in the microcrystalline semiconductor film 231b which includes the impurity element serving as a donor, and current flows to the common line 256. Therefore, electrostatic discharge damage of the thin film transistor provided in the pixel portion can be prevented.

Next, a manufacturing process of the diode 315 illustrated in FIG. 21A is described with reference to FIGS. 22A to 22D. Here, a manufacturing method of the diode 315 is described using Embodiment Mode 1; however, Embodiment Mode 2 can be used as appropriate.

Figure 22A:
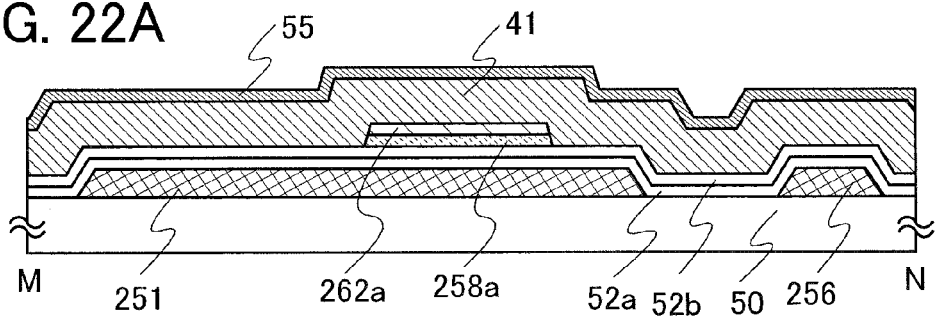
FIGS. 22A to 22D are cross-sectional views illustrating a manufacturing process of a diode of the present invention.

In the same manner as Embodiment Mode 5, as illustrated in FIG. 22A, the gate electrode 251 and the common line 256 are formed over the substrate 50. Next, the gate insulating films 52a and 52b are formed over the gate electrode 251 and the common line 256. Next, the microcrystalline semiconductor film 258a which includes the impurity element serving as a donor and the first buffer layer 262a are formed over the gate insulating film 52b. The second buffer layer 41 is formed over the first buffer layer 262a and the gate insulating film 52b. Next, the impurity semiconductor film 55 to which the impurity element imparting one conductivity is added is formed over the second buffer layer 41.

Figure 22B:
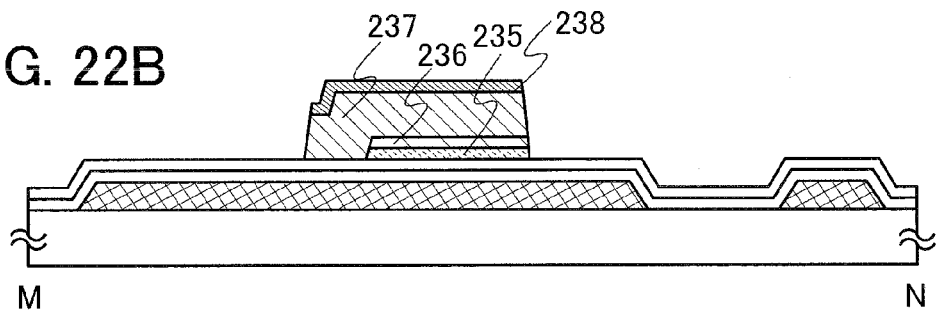
Figure 22C:
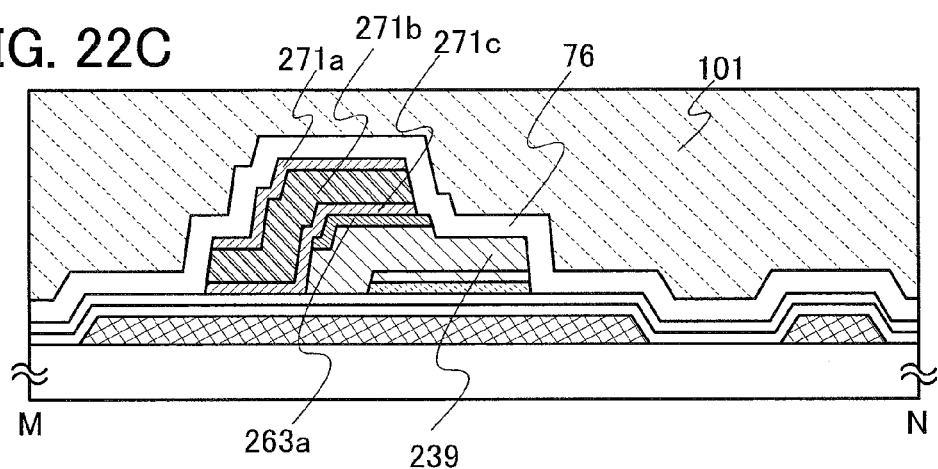
Figure 22D:
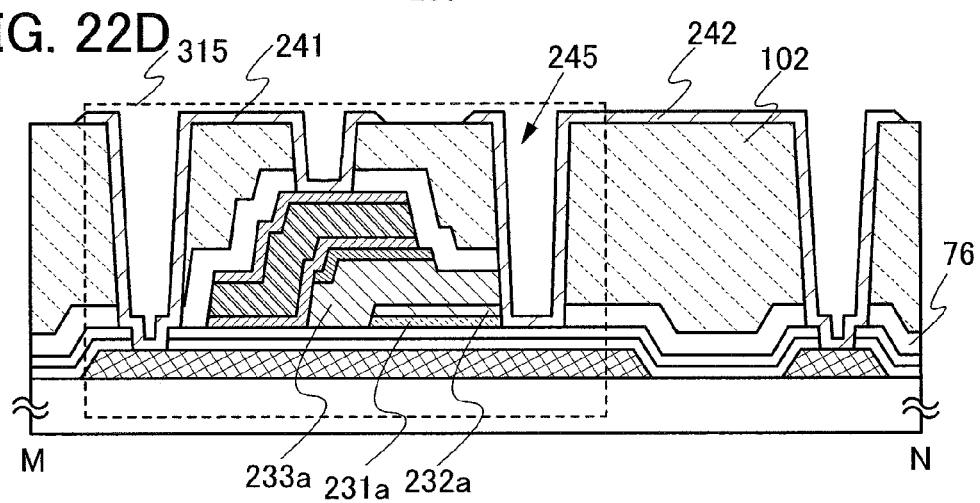

Next, after a resist is applied over the impurity semiconductor film 55 to which the impurity element imparting one conductivity is added, a resist mask is formed through a photolithography process using a photomask. Next, each of the impurity semiconductor film 55 to which the impurity element imparting one conductivity is added, the second buffer layer 44, the first buffer layer 262a, and the microcrystalline semiconductor film 258a which includes the impurity element serving as a donor is partially etched using the resist mask to form the microcrystalline semiconductor film 235 which includes the impurity element serving as a donor, the first buffer layer 236, the second buffer layer 237, and the impurity semiconductor film 238 to which the impurity element imparting one conductivity is added as illustrated in FIG. 22B. Here, the side surfaces of the microcrystalline semiconductor film 235 which includes the impurity element serving as a donor and the first buffer layer 236 have a region which is covered with the second buffer layer 237 and a region which is substantially aligned with the side surface of the second buffer layer 237.

Next, in the same manner as Embodiment Mode 6, the signal lines 271a to 271c and the source or drain region 263a are formed. In this case, a part of a second buffer layer 239 which is not covered with the signal lines 271a to 271c is thinner. Next, the protective insulating film 76 and the insulating film 101 are formed.

Next, in the same manner as Embodiment Mode 6, through the process using a multi-tone mask, contact holes which expose the gate electrode 251, the common line 256, and the signal line 271c are formed. Further, each of the microcrystalline semiconductor film 231a which includes the impurity element serving as a donor, the first buffer layer 232a, and the second buffer layer 233a is partially etched so that side surfaces of the microcrystalline semiconductor film 235 which includes the impurity element serving as a donor, the first buffer layer 236, and the second buffer layer 237 are exposed, and the contact hole 245 which exposes the gate insulating film 52b is formed.

Then, in the same manner as Embodiment Mode 5, the conductive film 241 which connects the gate electrode 251 and the signal line 271c, and the conductive film 242 which connects the microcrystalline semiconductor film 231a which includes the impurity element serving as a donor, the first buffer layer 232a, the second buffer layer 233a, and the common line 256 are formed at the same time as the pixel electrode is formed.

Through the above process, the diode 315 can be formed. Further, by the same number of masks as that used to form the thin film transistors shown in Embodiment Modes 1 to 3, a protection circuit can be formed.

Embodiment Mode 8

In this embodiment mode, a film formation apparatus that can be used for the film formation process in the above embodiment modes, and a flow of the substrate there is described below.

Next, as one example of a plasma CVD apparatus which is applied to a film formation process of this embodiment mode, one example of a structure which is suitable for formation of a gate insulating film, a microcrystalline semiconductor film which includes an impurity element serving as a donor, a buffer layer, and an impurity semiconductor film to which an impurity element imparting one conductivity is added is described.

Figure 23:
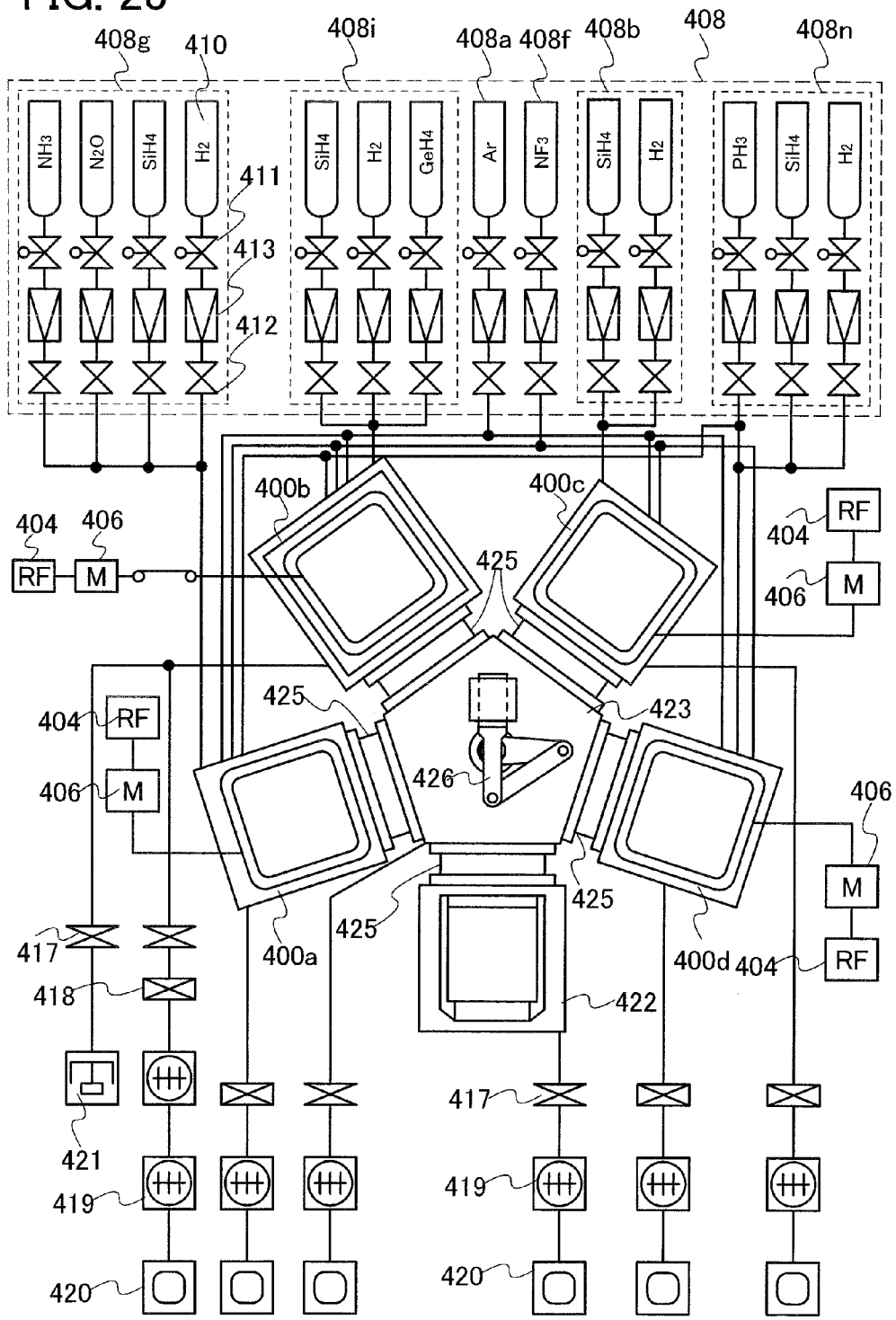
FIG. 23 is a diagram illustrating a structure of a plasma CVD apparatus applicable to the present invention.

FIG. 23 illustrates an example of a multi-chamber plasma CVD apparatus including a plurality of reaction chambers. The apparatus is provided with a common chamber 423, a load/unload chamber 422, a first reaction chamber 400a, a second reaction chamber 400b, a third reaction chamber 400c, and a fourth reaction chamber 400d. In this apparatus, a substrate is loaded by single wafer processing, and the substrate which is loaded into a cassette of the load/unload chamber 422 is transferred to each reaction chamber by a transport mechanism 426 of the common chamber 423. A gate valve 425 is provided between the common chamber 423 and each chamber such that treatments performed in chambers do not interfere each other.

Each reaction chamber is used for a different purpose depending on the kinds of thin films to be formed. For example, an insulating film such as a gate insulating film is formed in the first reaction chamber 400a, a microcrystalline semiconductor film which includes an impurity element serving as a donor is formed in the second reaction chamber 400b, a buffer layer which serves as a high resistance region of a thin film transistor is formed in the third reaction chamber 400c, and an impurity semiconductor film to which an impurity element imparting one conductivity is added for forming a source or drain is formed in the fourth reaction chamber 400d. Of course, the number of the reaction chambers is not limited thereto, and can be increased or decreased as needed.

A turbo-molecular pump 419 and a dry pump 420 are connected to each reaction chamber as exhaust means. The exhaust means is not limited to the combination of these vacuum pumps, and may be another vacuum pump as long as the evacuation can be performed to attain a degree of vacuum of about from $10^{-1}$ Pa to $10^{-5}$ Pa. A butterfly valve 417 is provided between the exhaust means and each reaction chamber, which can interrupt vacuum evacuation, and a conductance valve 418 can control exhaust velocity to adjust pressure in each reaction chamber.

Note that the second reaction chamber 400b in which a microcrystalline semiconductor film which includes an impurity element serving as a donor is formed may be connected to a cryopump 421 which performs vacuum evacuation to an ultra-high vacuum. By use of the cryopump 421, the reaction chamber can be evacuated to an ultra-high vacuum with a pressure lower than $10^{-5}$ Pa. In this embodiment mode, with an ultra-high vacuum with a pressure lower than $10^{-5}$ Pa in the reaction chamber, the oxygen concentration and the nitrogen concentration in the microcrystalline semiconductor film which includes an impurity element serving as a donor can be effectively reduced. Consequently, the oxygen concentration in the microcrystalline semiconductor film 45 which includes the impurity element serving as a donor can be set to $1\times10^{16}$ atoms/cm$^3$ or less. With the reduced oxygen concentration and nitrogen concentration in the microcrystalline semiconductor film which includes the impurity element serving as a donor, defects in the film can be reduced, whereby crystallinity can be improved and thus, carrier mobility can be improved.

A gas supply means 408 includes a cylinder 410 in which a gas used for the process, such as a rare gas or a semiconductor source gas typified by silane and germane is filled, stop valves 411 and 412, a mass flow controller 413, and the like. A gas supply means 408g is connected to the first reaction chamber 400a and supplies a gas for forming a gate insulating film. A gas supply means 408i is connected to the second reaction chamber 400b and supplies a gas for forming a microcrystalline semiconductor film which includes an impurity element serving as a donor. A gas supply means 408b is connected to the third reaction chamber 400c and supplies a gas for forming a buffer layer. A gas supply means 408n is connected to the fourth reaction chamber 400d and supplies a gas for forming an n-type semiconductor film, for example. In addition, a gas of phosphine which is one of gases which includes an impurity element serving as a donor is supplied to the first reaction chamber 400a and the second reaction chamber 400b. A gas supply means 408a supplies argon, and a gas supply means 408f supplies an etching gas used for cleaning of the reaction chambers. The gas supply means 408a and 408f are used as common lines for the reaction chambers.

A high-frequency power supply means 403 for generating plasma is connected to each reaction chamber. The high-frequency power supply means includes a high-frequency power source 404 and a matching box 406.

Each reaction chamber can be used for a different purpose depending on the kinds of thin films to be formed. Since each thin film has an optimum temperature for formation, the reaction chambers are provided separately, so that formation temperatures can be easily controlled. Further, the same kind of films can be repeatedly deposited, so that influence of residual impurities due to a film formed previously can be excluded. In particular, in a case of a microcrystalline semiconductor film which includes an impurity element serving as a donor, the impurity element serving as a donor can be prevented from mixing into the buffer layer. Consequently, the concentration of the impurity element in the buffer layer can be decreased, so that off current of the thin film transistor can be reduced.

Then, one mode of a plasma CVD apparatus for forming a gate insulating film, a microcrystalline semiconductor film which includes an impurity element serving as a donor, a buffer layer, and an impurity semiconductor film to which an impurity element imparting one conductivity successively in one reaction chamber is described with reference to FIG. 24.

The apparatus is provided with the common chamber 423, the load/unload chamber 422, a waiting chamber 401, and the first reaction chamber 400a. The apparatus is a single wafer processing type in which a substrate is loaded into a cassette of the load/unload chamber 422 and is transferred to each reaction chamber by a transport mechanism 426 of the common chamber 423. The gate valve 425 is provided between the common chamber 423 and each chamber such that treatments performed in chambers do not interfere each other.

The turbo-molecular pump 419 and the dry pump 420 are connected to the first reaction chamber 400a for exhaust means. The evacuation means is not limited to the combination of these vacuum pumps, and may be another vacuum pump as long as the evacuation can be performed to attain a degree of vacuum of about from $10^{-1}$ Pa to $10^{-5}$ Pa. The butterfly valve 417 is provided between the exhaust means 430 and each reaction chamber, which can interrupt vacuum evacuation, and a conductance valve 418 can control exhaust velocity to adjust pressure in each reaction chamber. Further, the first reaction chamber 400a may be connected to the cryopump 421.

The gas supply means 408 includes the cylinder 410 in which a gas used for the process, such as a rare gas or a semiconductor source gas typified by silane and germane is filled, the stop valves 411 and 412, the mass flow controller 413, and the like. The gas supply means 408g, 408i, 408b, and 408f are connected to the first reaction chamber 400a.

The high-frequency power supply means 403 for generating plasma is connected to a reaction chamber. The high-frequency power supply means 403 includes the high-frequency power source 404 and the matching box 406.

Figure 24:
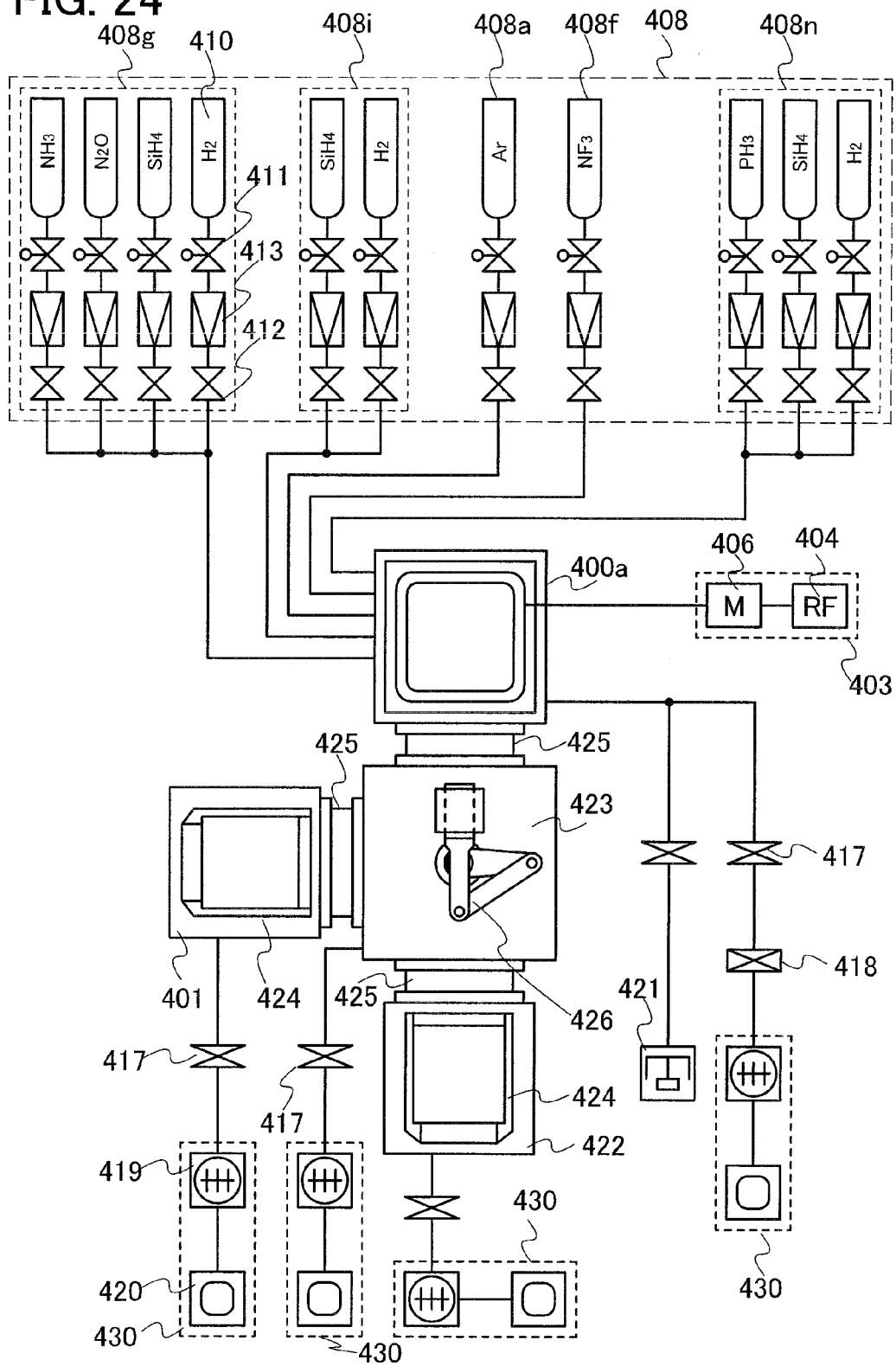
FIG. 24 is a diagram illustrating a structure of a plasma CVD apparatus applicable to the present invention.

Then, a process for forming a plurality of films successively with the plasma CVD apparatus illustrated in FIG. 24 is described with reference to FIGS. 25A to 25C.

Figure 25B:
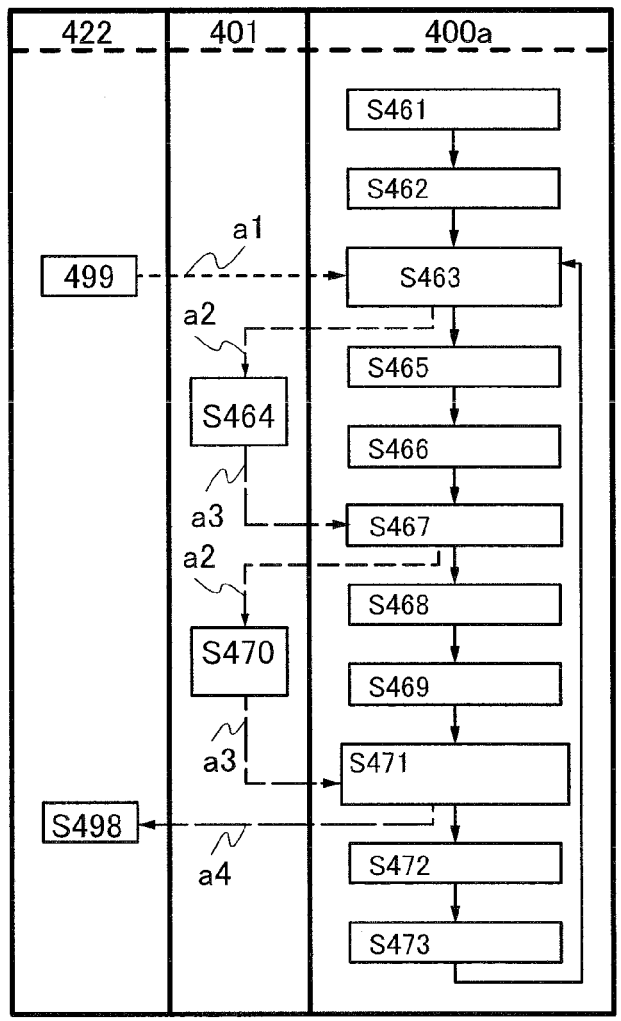
FIGS. 25A to 25C are diagrams illustrating a structure and film formation procedures of a plasma CVD apparatus applicable to the present invention.
Figure 25A:
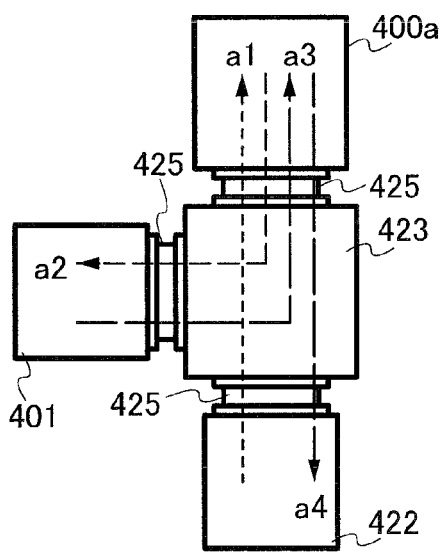

FIG. 25A illustrates the plasma CVD apparatus of FIG. 24 in a simplified manner. FIG. 25B is a schematic diagram of a process for successively forming a gate insulating film and a microcrystalline semiconductor film which includes an impurity element serving as a donor (here, referred to as an n$^-$μc-Si-film) over a substrate 499 provided with a gate electrode. An arrow of a dotted line indicates flow of the substrate and an arrow of a solid line indicates flow of the film formation process.

As illustrated in FIG. 25B, an inner wall of the first reaction chamber 400a is cleaned with fluorine radicals or the like (S461) to remove residual impurities in the first reaction chamber 400a. Then, the inner wall of the first reaction chamber 400a is coated with a film which is similar to the gate insulating film (S462). Due to this coating process, metals which form the first reaction chamber 400a can be prevented from mixing into the gate insulating film as impurities.

Then, the substrate set in a cassette in the load/unload chamber 422 is transferred to the first reaction chamber 400a by the transfer mechanism 426 in the common chamber 423 as indicated by an arrow a1. Then, a gate insulating film, which is a silicon oxynitride film here, is formed over the substrate in the first reaction chamber 400a (S463).

Then, the substrate over which the gate insulating film is formed is transferred to the waiting chamber 401 by the transfer mechanism 426 in the common chamber 423 as indicated by an arrow a2, then, the substrate is kept in a waiting state (S464). Then, the inner wall of the first reaction chamber 400a is cleaned with fluorine radicals or the like (S465) to remove residual impurities in the first reaction chamber 400a. Then, the inner wall of the first reaction chamber 400a is coated with an amorphous semiconductor film (S466). Due to this cleaning and coating, components (oxygen, nitrogen, or the like) of the gate insulating film which are deposited on the inner wall of the first reaction chamber 400a and metals which form the reaction chambers can be prevented from mixing, as impurities, into the microcrystalline semiconductor film which includes an impurity element serving as a donor, which is formed later. In addition, the crystallinity of the microcrystalline semiconductor film can be improved. Then, the substrate is transferred to the first reaction chamber 400a by the transfer mechanism 426 in the common chamber 423, as indicated by an arrow a3, to form the microcrystalline semiconductor film which includes an impurity element serving as a donor in the first reaction chamber 400a (S467). Here, as the microcrystalline semiconductor film which includes an impurity element serving as a donor, silane, hydrogen, and phosphine are used as a source gas, and a microcrystalline silicon film which includes phosphorus is formed.

Then, the substrate over which the microcrystalline semiconductor film which includes an impurity element serving as a donor is formed is transferred to the waiting chamber 401 by the transfer mechanism 426 in the common chamber 423 as indicated by the arrow a2, then, the substrate is kept in a waiting state (S470). Then, the inner wall of the first reaction chamber 400a is cleaned with fluorine radicals or the like (S468) to remove residual impurities in the first reaction chamber 400a. Then, the inner wall of the first reaction chamber 400a is coated with an amorphous semiconductor film (S469). Due to this cleaning and coating, components (phosphorus) of the microcrystalline semiconductor film which includes an impurity element serving as a donor which are deposited on the inner wall of the first reaction chamber 400a and metals which form the reaction chambers can be prevented from mixing, as impurities, into the amorphous semiconductor film which is formed later. Accordingly, the amorphous semiconductor film can serve as a high resistance region. Then, the substrate is transferred to the first reaction chamber 400a by the transfer mechanism 426 in the common chamber 423, as indicated by the arrow a3, to form an amorphous semiconductor film as a first buffer layer in the first reaction chamber 400a (S471). Here, as the amorphous semiconductor film, silane and hydrogen are used as source gases, and an amorphous silicon film is formed.

Then, the substrate over which the first buffer layer is formed is set in the cassette in the load/unload chamber 422 by the transfer mechanism 426 in the common chamber 423 (S498), as indicated by an arrow a4. Through the above process, the gate insulating film, the microcrystalline semiconductor film which includes an impurity element serving as a donor, and the first buffer layer can be successively formed over the substrate provided with a gate electrode. Then, the inner wall of the first reaction chamber 400a is cleaned with fluorine radicals or the like (S472) to remove residual impurities in the first reaction chamber 400a. Then, the inner wall of the first reaction chamber 400a is coated with a film which is similar to the gate insulating film (S473). Then, another substrate which is set in the cassette in the load/unload chamber 422 is transferred to the first reaction chamber 400a, and the process similar to the above process is performed on the substrate, starting with film formation of a gate insulating film (S463), to successively form the gate insulating film, a microcrystalline semiconductor film which includes an impurity element serving as a donor, and a first buffer layer.

After the gate insulating films, the microcrystalline semiconductor films which include an impurity element serving as a donor, and the first buffer layers are formed over all the substrates which are set in the cassette in the load/unload chamber 422, the cassette is transferred from the load/unload chamber 422 to be subjected to a next process.

Note that although the substrate over which the gate insulating film and the n⁻μc-Si-film are formed is kept in a waiting state in the waiting chamber 401, the substrate may be kept in a waiting state in the load/unload chamber 422. Thus, the plasma CVD apparatus can be simplified and cost can be reduced.

Further, as a method for forming the n⁻μc-Si-film, phosphine is used as a source gas in S467 here. However, instead of this, after the coating S466, phosphine may be fed into the reaction chamber so that phosphorus is adsorbed onto the inner wall of the reaction chamber, then, the substrate kept in a waiting state in the waiting chamber 401 is transferred to the first reaction chamber 400a and a microcrystalline silicon film is formed using silane and hydrogen as source gases. The film is formed while taking in phosphorus which is adsorbed in the reaction chamber. Thus, a microcrystalline semiconductor film which includes an impurity element serving as a donor can be formed.

Further, in formation of the gate insulating film in S463, phosphine may be mixed into a source gas. In that case, after the gate insulating film which includes phosphorus is formed, by depositing a microcrystalline silicon film using silane and hydrogen as source gases in S467, a microcrystalline silicon film which includes phosphorus can be formed.

Next, a process in which a second buffer layer and an impurity semiconductor film to which an impurity element imparting one conductivity type is added (here, referred to as an n⁺a-Si-film) are successively formed over the microcrystalline semiconductor film which includes an impurity element serving as a donor and the first buffer layer which are processed into island-shape is described with reference to FIG. 25B. An arrow of a dotted line indicates flow of the substrate and an arrow of a solid line indicates flow of the film formation process.

Figure 25C:
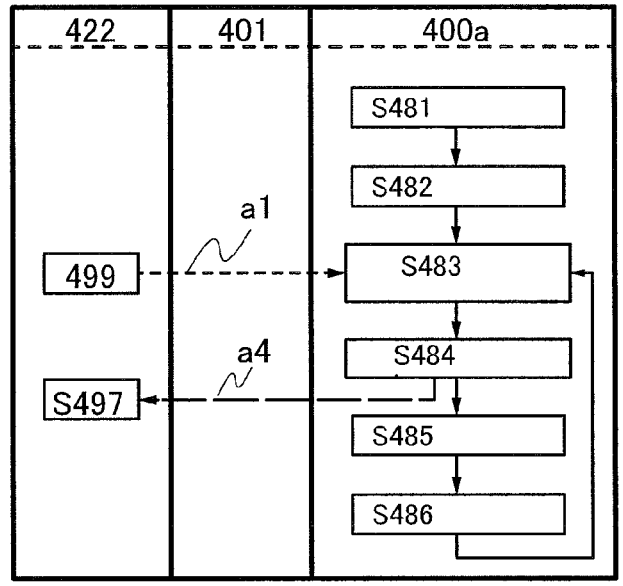

As illustrated in FIG. 25C, the inner wall of the first reaction chamber 400a is cleaned with fluorine radicals or the like (S481), to remove residual impurities in the first reaction chamber 400a. Then, the inner wall of the first reaction chamber 400a is coated with a film which is similar to a second buffer layer (S482). Here, an amorphous silicon film is formed. Due to this coating process, metals which form the first reaction chamber 400a can be prevented from mixing into the gate insulating film as impurities.

Then, the substrate set in the cassette in the load/unload chamber 422 is transferred to the first reaction chamber 400a by the transfer mechanism 426 in the common chamber 423 as indicated by the arrow a1. Then, the second buffer layer, which is an amorphous silicon film here, is formed over the substrate in the first reaction chamber 400a (S483).

Then, an impurity semiconductor film to which an impurity element imparting one conductivity type is added (here, referred to as an n⁺a-Si-film) is formed over the substrate over which the second buffer layer is formed (S484). Here, a coating process is not necessarily performed before forming the n⁺a-Si-film because the main components in the amorphous silicon film and the n⁺a-Si-film are the same, and moreover, amorphous silicon does not contain any substance which becomes contaminants of the n⁺a-Si-film film.

Then, the substrate over which the n⁺a-Si-film is formed is set in the cassette in the load/unload chamber 422 by the transfer mechanism 426 in the common chamber 423 (S497) as indicated by the arrow a4. Through the above process, the second buffer layer and the n⁺a-Si-film can be formed successively over the substrate over which the island-shaped n⁻μc-Si-film and the first buffer layer are formed. Then, the inner wall of the first reaction chamber 400a is cleaned with fluorine radicals or the like (S485) to remove residual impurities in the reaction chamber 400a. Then, the inner wall of the first reaction chamber 400a is coated with a film which is similar to the second buffer layer (S486). Then, another substrate which is set in the cassette in the load/unload chamber 422 is transferred to the first reaction chamber 400a, and the process similar to the above process is performed on the substrate, starting with film formation of the second buffer layer (S483), to successively form the second buffer layer and the n⁺a-Si-film.

After the second buffer layers and the n⁺a-Si-films are formed over all the substrates which are set in the cassette in the load/unload chamber 422, the cassette is transferred from the load/unload chamber 422 to be subjected to a next process.

Through the above process, a plurality of films can be successively formed without being exposed to the atmosphere. In addition, the films can be formed without contaminants mixing into the films.

Embodiment Mode 9

In this embodiment mode, a thin film transistor and a diode each having a different structure than that of the thin film transistor and the diode in any of the above embodiment modes are described.

In Embodiment Modes 1 to 8, the first buffer layer 62 is formed over the microcrystalline semiconductor film 58 which includes the impurity element serving as a donor; however, the first buffer layer 62 is not necessarily provided. That is, a structure in which top and side surfaces of the microcrystalline semiconductor film 58 which includes the impurity element serving as a donor are covered with the second buffer layer 42, and the second buffer layer 42 is in contact with outer ends of the gate insulating film 52*b* and the microcrystalline semiconductor film 58 which includes the impurity element serving as a donor may be employed. With this structure, the number of film formation processes can be reduced, and cost can be reduced.

Embodiment Mode 10

Figure 26:
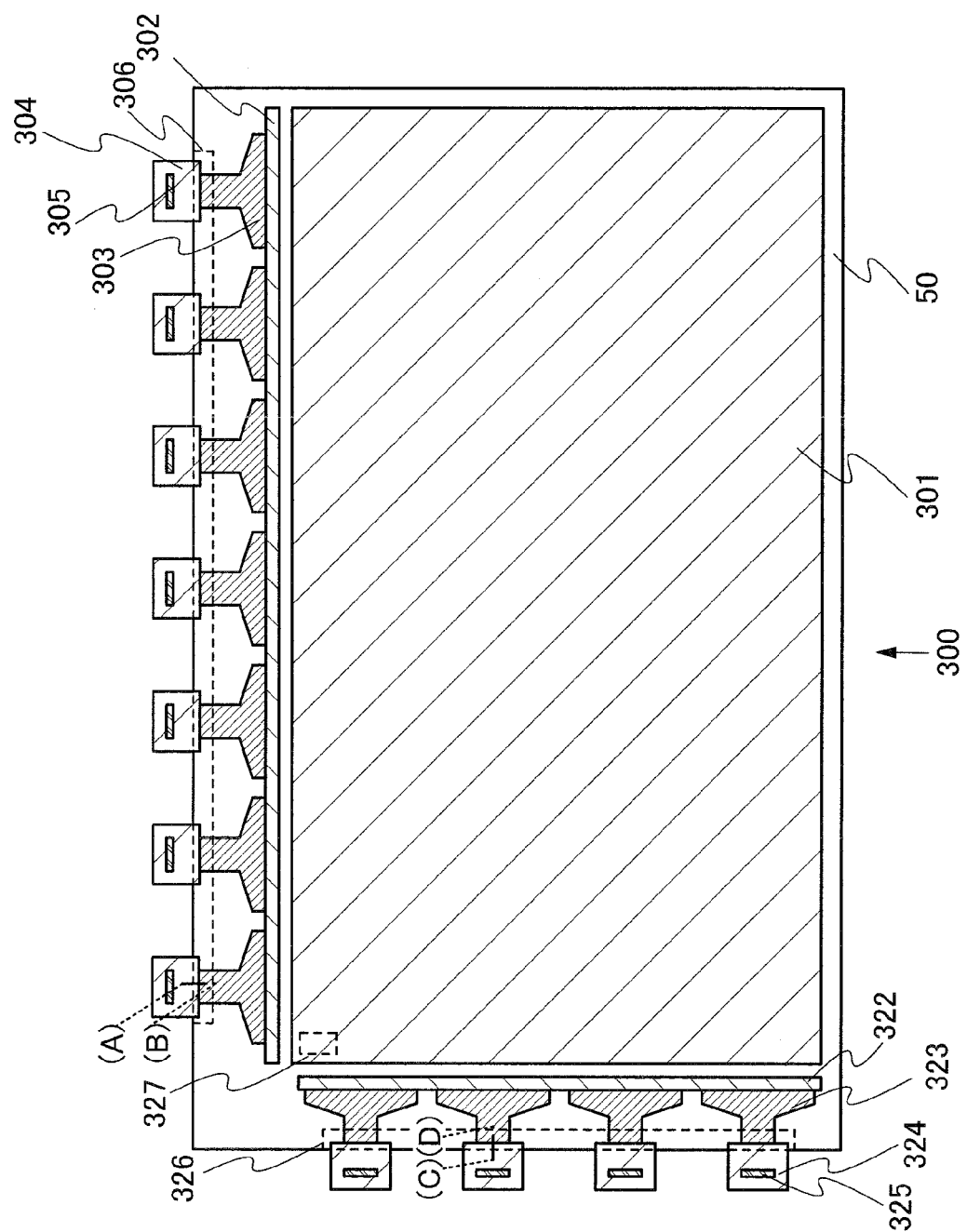
FIG. 26 is a plan view illustrating a display device of the present invention.
Figure 27A:
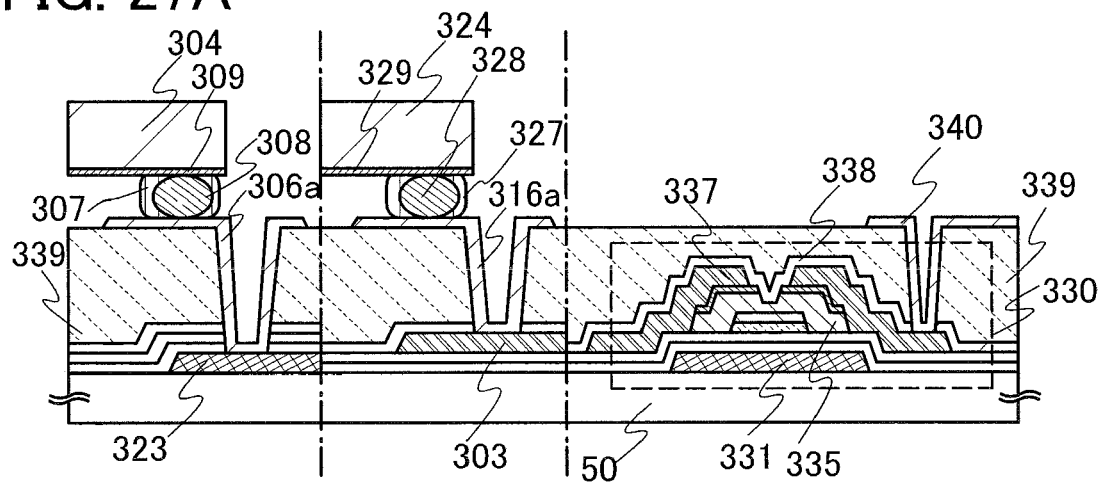
FIGS. 27A to 27C are cross-sectional views illustrating end portions and a pixel portion of a display device of the present invention.
Figure 27B:
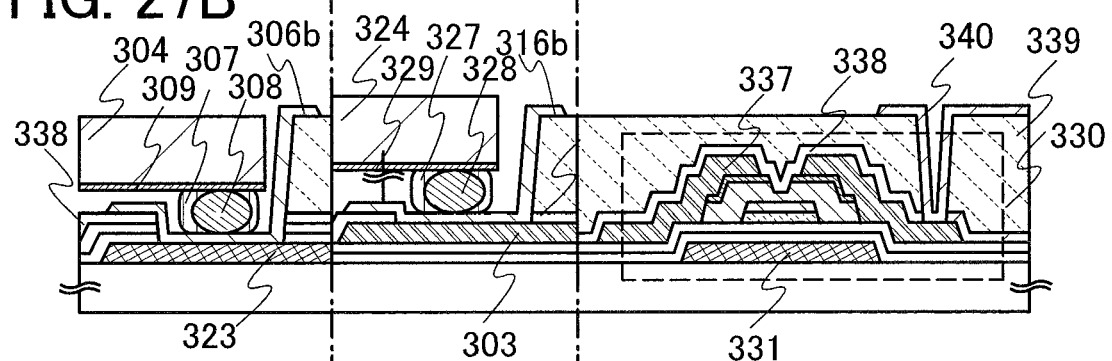
Figure 27C:
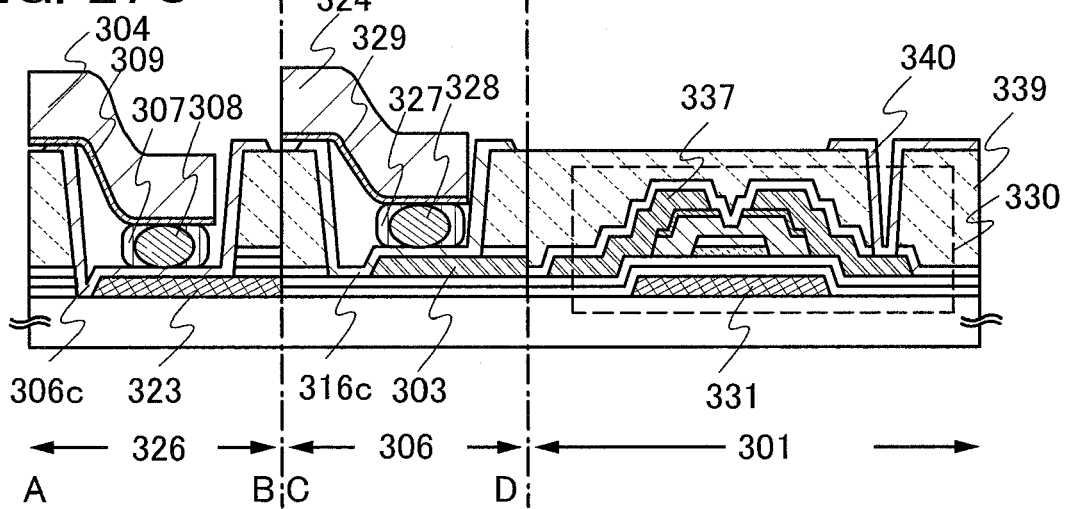

In this embodiment mode, structures of a scan line (gate wiring) input terminal portion and a signal line (source wiring) input terminal portion provided in a peripheral portion of the substrate 50 illustrated in FIG. 26 are described with reference to FIGS. 27A to 27C. FIGS. 27A to 27C illustrate cross-sectional views of thin film transistors in scan line input terminal portions, signal line input terminal portions, and pixel portions provided in a peripheral portion of the substrate 50.

In a display device 300 illustrated in FIG. 26, a pixel portion 301 is provided, and protection circuits 302 and 322, a signal line 303, and a scan line 323 are provided between the pixel portion 301 and the peripheral portion of the substrate 50. Further, although not illustrated, the signal line 303 and the scan line 323 are formed between the pixel portion 301 and the protection circuits 302 and 322, and the peripheral portions. A signal line input terminal portion 306 and a scan line input terminal portion 326 are provided in the end portions of the signal line 303 and the scan line 323. FPCs 304 and 324 are connected to the terminals of the signal line input terminal portion 306 and the scan line input terminal portion 326 respectively, and a signal line driver circuit 305 and a scan line driver circuit 325 are provided in the FPCs 304 and 324. Further, although not illustrated, a pixel 327 is arranged in matrix in the pixel portion 301.

In FIG. 27A, a scan line input terminal 306*a* is connected to the scan line 323 which is formed in the same layer as a gate electrode 331 of a thin film transistor 330. Note that the gate electrode 331 of the thin film transistor 330 may be formed using the scan line 323. Further, a signal line input terminal 316*a* is connected to the signal line 303 which is formed in the same layer as a source or drain electrode 337 of the thin film transistor 330. Note that the source or drain electrode 337 of the thin film transistor 330 may be formed using the signal line 303.

The scan line input terminal 306*a* and the signal line input terminal 316*a* are formed in the same layer as a pixel electrode 340 of the thin film transistor 330 in pixel portion. Further, the scan line input terminal 306*a* and the signal line input terminal 316*a* are formed over an insulating film 339 which is formed over the signal line 303. Further, the scan line input terminal 306*a* and the signal line input terminal 316*a* are connected to wirings 309 and 329 of the FPCs 304 and 324 through conductive particles 308 and 328 in anisotropic conductive adhesives 307 and 327 over the insulating film 339.

Note that here, the scan line 323 and the scan line input terminal 306*a* are connected; however, a conductive film which is formed in the same layer as the signal line 303 may be provided between the scan line 323 and the scan line input terminal 306*a*. Further, the signal line 303 and the signal line input terminal 316*a* are connected; however, a conductive film which is formed in the same layer as the scan line 323 may be provided between the signal line 303 and the signal line input terminal 316*a*.

In FIG. 27B, a scan line input terminal 306*b* is connected to the scan line 323 which is formed in the same layer as the gate electrode 331 of the thin film transistor 330. Note that the gate electrode 331 of the thin film transistor 330 may be formed using the scan line 323. Further, a signal line input terminal 316*b* is connected to the signal line 303 which is formed in the same layer as the source or drain electrode 337 of the thin film transistor 330. Note that the source or drain electrode 337 of the thin film transistor 330 may be formed using the signal line 303.

The scan line input terminal 306*b* and the signal line input terminal 316*b* are formed in the same layer as the pixel electrode 340 of the thin film transistor 330 in the pixel portion. Further, the scan line input terminal 306*b* and the signal line input terminal 316*b* are formed over the insulating film 339 and a protective insulating film 338. Further, the scan line input terminal 306*b* and the signal line input terminal 316*b* are connected to the wirings 309 and 329 of the FPCs 304 and 324 through the conductive particles 308 and 328 in the anisotropic conductive adhesives 307 and 327 over the substrate 50.

Note that here, the scan line 323 is connected to the scan line input terminal 306*b*; however, a conductive film which is formed in the same layer as the signal line 303 may be provided between the scan line 323 and the scan line input terminal 306*b*. Further, the signal line 303 is connected to the signal line input terminal 316*b*; however, a conductive film which is formed in the same layer as the scan line 323 may be provided between the signal line 303 and the signal line input terminal 316*b*.

In FIG. 27C, a scan line input terminal 306*c* is connected to the scan line 323 which is formed in the same layer as the gate electrode 331 of the thin film transistor 330. Note that the gate electrode 331 may be formed using the scan line 323 of the thin film transistor 330. Further, a signal line input terminal 316*c* is connected to the signal line 303 which is formed in the same layer as the source or drain electrode 337 of the thin film transistor 330. Note that the source or drain electrode 337 of the thin film transistor 330 may be formed using the signal line 303.

The scan line input terminal 306*c* and the signal line input terminal 316*c* are formed in the same layer as the pixel electrode 340 of the thin film transistor 330 in the pixel portion. Further, the scan line input terminal 306*b* and the signal line input terminal 316*b* are formed over the insulating film 339. Note that in FIG. 27C, opening portions of the insulating film 339 expose end portions of the scan line input terminal 306*b* and the signal line input terminal 316*b*. Further, in the opening portions of the insulating film 339, the scan line input terminal 306b is connected to the wirings 309 and 329 of the FPCs 304 and 324 through the conductive particles 308 and 328 in the anisotropic conductive adhesives 307 and 327 over the scan line 323.

Note that here, the scan line 323 is connected to the scan line input terminal 306b; however, a conductive film which is formed in the same layer as the signal line 303 may be provided between the scan line 323 and the scan line input terminal 306b. Further, the signal line 303 is connected to the signal line input terminal 316b; however, a conductive film which is formed in the same layer as the scan line 323 may be provided between the signal line 303 and the signal line input terminal 316b.

Embodiment Mode 11

In this embodiment mode, a liquid crystal display device including a thin film transistor described in any of the above embodiment modes, as one mode of a display device is described below. Here, a vertical alignment (VA) liquid crystal display device will be described with reference to FIG. 28, FIG. 29, and FIG. 30. The VA liquid crystal display device is a kind of mode in which alignment of liquid crystal molecules of a liquid crystal panel is controlled. The VA liquid crystal display device is a mode in which liquid crystal molecules are vertical to a panel surface when voltage is not applied. In this embodiment mode, it is devised that pixels are divided separated into some regions (sub-pixels) and molecules are aligned in different directions in the respective regions. This is referred to as multi-domain or multi-domain design. In the following description, a liquid crystal display device with multi-domain design is described.

Figure 29:
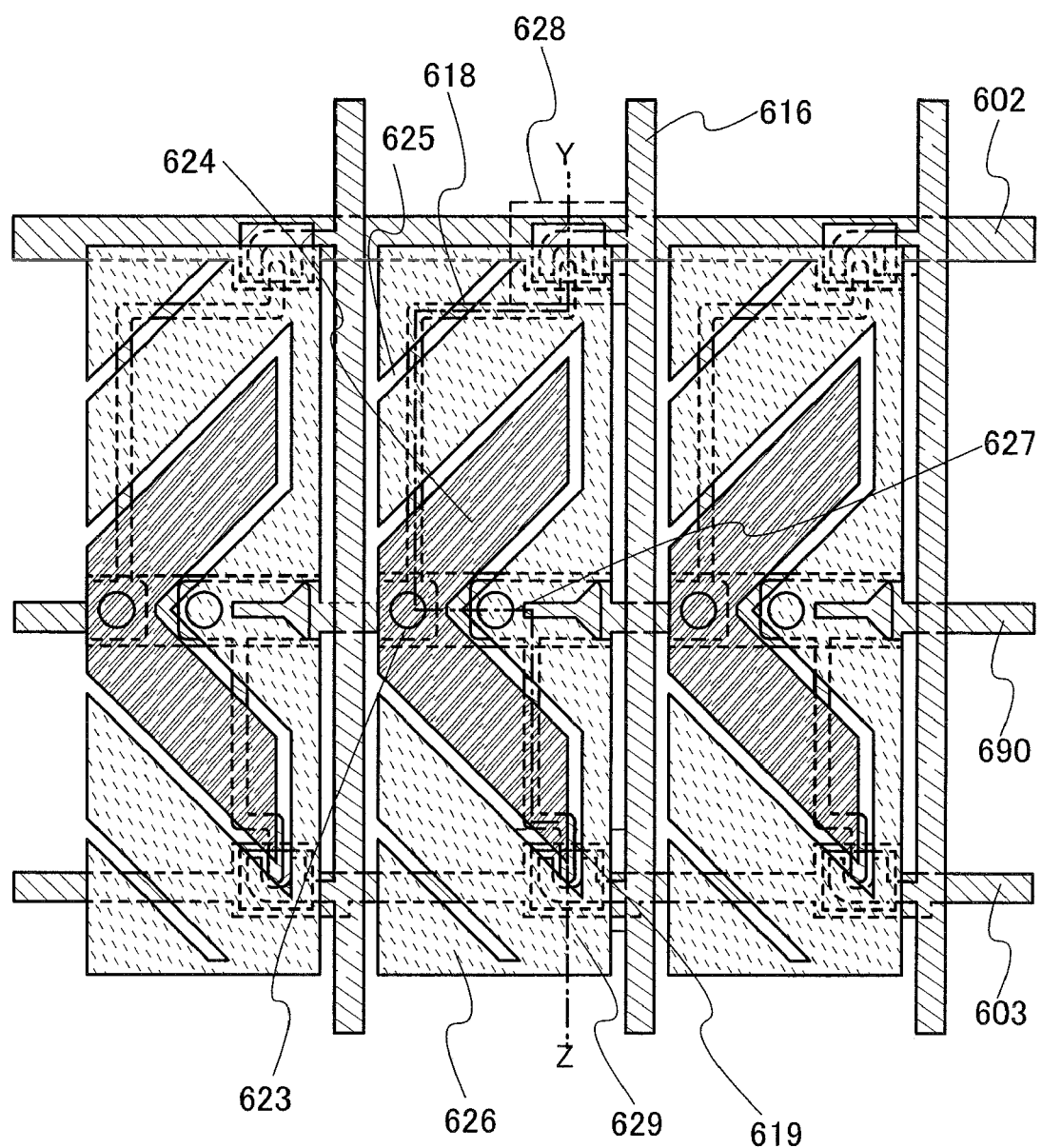
FIG. 29 is a top view illustrating a display device of the present invention.

FIG. 28 and FIG. 29 each illustrate a pixel structure of a VA liquid crystal panel. FIG. 29 is a plane view of a substrate 600. FIG. 28 illustrates a cross-sectional structure taken along a line Z-Y in FIG. 28. The following explanation will be made with reference to both the figures.

In this pixel structure, a plurality of pixel electrodes 624 and 626 are included in one pixel, and thin film transistors 628 and 629 are connected to the pixel electrodes 624 and 626, respectively, through a planarization film 622. The thin film transistors 628 and 629 are driven by different gate signals. That is, a pixel of multi-domain design has a structure in which a signal applied to each of the pixel electrodes 624 and 626 is independently controlled.

The pixel electrode 624 is connected to the thin film transistor 628 through a wiring 618 in a contact hole 623. In a contact hole 627, the pixel electrode 626 is connected to the thin film transistor 629 through a wiring 619. A gate wiring 602 of the thin film transistor 628 and a gate wiring 603 of the thin film transistor 629 are separated so that different gate signals can be given thereto. In contrast, a wiring 616 functioning as a data line is used in common for the thin film transistors 628 and 629. The thin film transistors 628 and 629 can be manufactured by the methods described in any of the above embodiment modes.

The shape of the pixel electrode 624 is different from that of the pixel electrode 626, and the pixel electrodes are separated by a slit 625. The pixel electrode 626 is formed so as to surround the outside of the pixel electrode 624 which is expanded in a V-shape. Timings of voltage application are varied between the pixel electrode 624 and the pixel electrode 626 by the thin film transistor 628 and the thin film transistor 629, so that alignment of liquid crystals is controlled. When different gate signals are supplied to the gate wiring 602 and the gate wiring 603, operation timings of the thin film transistor 628 and the thin film transistor 629 can be varied. Further, an alignment film 648 is formed over the pixel electrodes 624 and 626.

Figure 30:
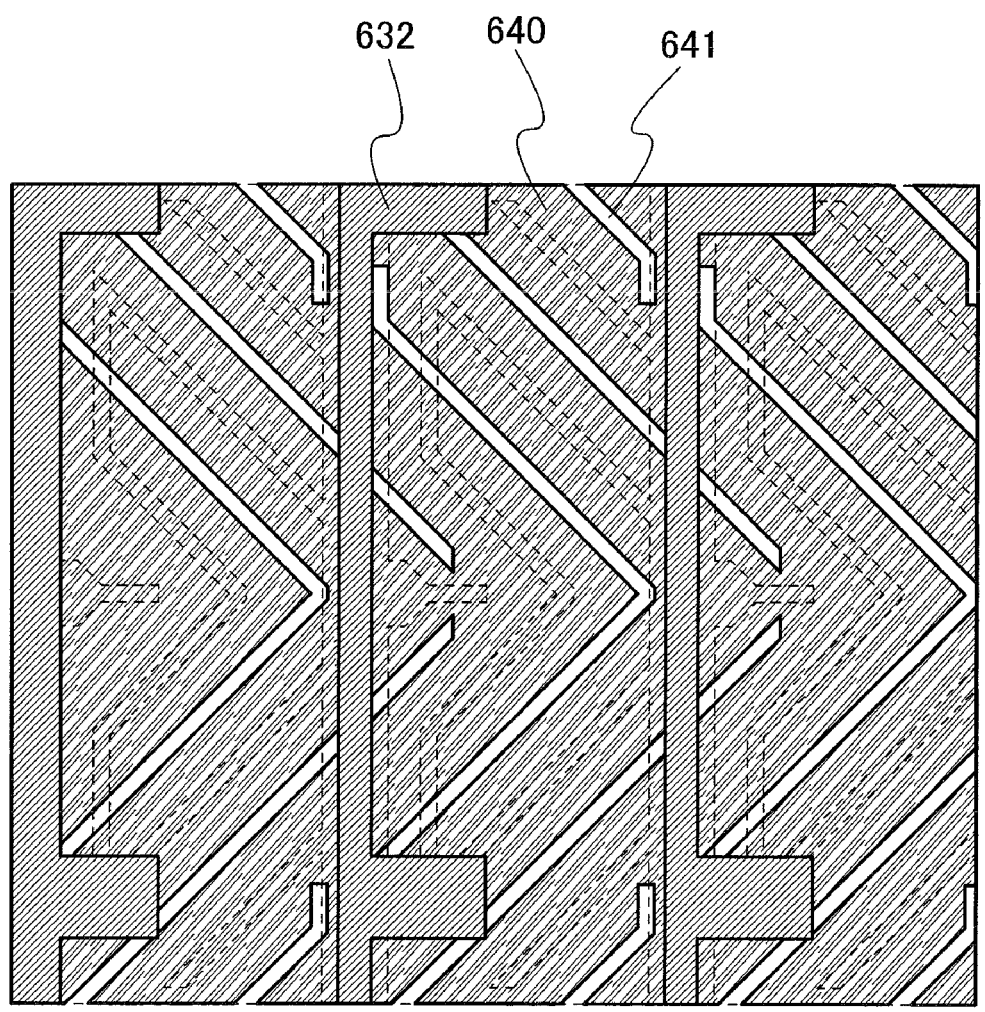
FIG. 30 is a top view illustrating a display device of the present invention.

A counter substrate 601 is provided with a light-blocking film 632, a coloring film 636, and a counter electrode 640. A planarization film 637 is formed between the coloring film 636 and the counter electrode 640 to prevent alignment disorder of liquid crystal. Further, an alignment film 646 is formed on the counter electrode 640. FIG. 30 illustrates a structure of the counter substrate side. Although the counter electrode 640 is an electrode shared by different pixels, a slit 641 is formed. The slit 641 and the slit 625 on the side of the pixel electrodes 624 and 626 are alternately arranged in an engaging manner; thus, an oblique electric field is effectively generated, and the alignment of liquid crystals can be controlled. Accordingly, the direction in which liquid crystals are oriented is made different depending on a place, and a viewing angle of the liquid crystal panel is expanded.

Here, a substrate, a coloring film, a light-blocking film, and a planarization film form a color filter. Note that either the light-blocking film or the planarization film, or both of them is/are not necessarily formed over the substrate.

The coloring film has a function of preferentially transmitting light of a predetermined wavelength range, among light of the wavelength range of visible light. In general, a coloring film which preferentially transmits light of a wavelength range of red light, a coloring film which preferentially transmits light of a wavelength range of blue light, and a coloring film which preferentially transmits light of a wavelength range of green light are combined to be used for the color filter. However, the combination of the coloring films is not limited to the above combination.

A first liquid crystal element is formed by overlapping of the pixel electrode 624, a liquid crystal layer 650, and the counter electrode 640. A second liquid crystal element is formed by overlapping of the pixel electrode 626, the liquid crystal layer 650, and the counter electrode 640. Further, the multi-domain structure is employed in which the first liquid crystal element and the second liquid crystal element are provided for one pixel.

Although a vertical alignment (VA) liquid crystal display device is described here as a liquid crystal display device, the element substrate formed in accordance with any of the above embodiment modes can also be applied to an FFS mode liquid crystal display device, an IPS mode liquid crystal display device, a TN mode liquid crystal display device, and other liquid crystal display devices.

Through the above process, the liquid crystal display device can be manufactured. Since an inverted staggered thin film transistor with a small amount of off current and excellent electric characteristics is used for the liquid crystal display device of this embodiment mode, the liquid crystal display device which has high contrast and high visibility can be manufactured.

Embodiment Mode 12

In this embodiment mode, a light-emitting device including the thin film transistor shown in any of the above embodiment modes is described below as one mode of a display device. Here, a structure of a pixel included in the light-emitting device will be described. FIG. 31A illustrates one mode of a top view of the pixel, and FIG. 31B illustrates one mode of a cross-sectional structure of the pixel corresponding to a line A-B in FIG. 31A.

Here, a display device including a light-emitting element utilizing electroluminescence is shown as a light-emitting device. Light-emitting elements utilizing electroluminescence are classified according to whether a light-emitting material is an organic compound or an inorganic compound. In general, the former is referred to as an organic EL element, and the latter is referred to as an inorganic EL element. Here, the process shown in any of the above embodiment modes can be used as a manufacturing process of the thin film transistor.

In an organic EL element, by application of voltage to a light-emitting element, electrons and holes are injected from a pair of electrodes into a layer containing a light-emitting organic compound, whereby current flows. Then, the carriers (electrons and holes) are recombined, so that the light-emitting organic compound forms an excited state, and when the excited state returns to a ground state, light is emitted. From such a mechanism, such a light-emitting element is referred to as a current excitation type light-emitting element.

The inorganic EL element is classified into a disperse type inorganic EL element and a thin film type inorganic EL element depending on the element structure. A dispersion type inorganic EL element has a light-emitting layer where particles of a light-emitting material are dispersed in a binder, and its light emission mechanism is donor-acceptor recombination type light emission that utilizes a donor level and an acceptor level. A thin film type inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made here using an organic EL element as a light-emitting element. In addition, the description is made using channel etched thin film transistors as a switching thin film transistor for controlling input of a signal to a first electrode and a driving thin film transistor which controls driving of a light-emitting element, but a channel protective thin film transistor can also be used as appropriate.

In FIGS. 31A and 31B, a first thin film transistor 74a is a switching thin film transistor for controlling input of a signal to a first electrode, and a second thin film transistor 74b is a driving thin film transistor for controlling current or voltage supply to a light-emitting element 94.

A gate electrode of the first thin film transistor 74a is connected to a scan line 51a, one of a source and a drain of the first thin film transistor 74a is connected to the wirings 71a to 71c which function as signal lines, and the other of the source and the drain is connected to a gate electrode 51b of the second thin film transistor 74b. One of a source and a drain of the second thin film transistor 74b is connected to power source lines 93a to 93c, and the other of the source and the drain is connected to a first electrode 79 of a display device. A gate electrode, a gate insulating film, and the power source line 93a of the second thin film transistor 74b form a capacitor element 96, and the other of the source and the drain of the first thin film transistor 74a is connected to the capacitor element 96.

Note that the capacitor element 96 corresponds to a capacitor element for holding a voltage between the gate and the source or between the gate and the drain (hereinafter referred to as a gate voltage) of the second thin film transistor 74b when the first thin film transistor 74a is turned off, and is not necessarily provided.

In this embodiment mode, the first thin film transistor 74a and the second thin film transistor 74b can be each formed using the thin film transistor shown in any of the above embodiment modes. In addition, although each of the first thin film transistor 74a and the second thin film transistor 74b is an n-channel thin film transistor, the first thin film transistor 74a and the second thin film transistor 74b may also be formed using an n-channel thin film transistor and a p-channel thin film transistor, respectively. Furthermore, both the first thin film transistor 74a and the second thin film transistor 74b may be formed using p-channel thin film transistors.

The protective insulating film 76 is formed over the first thin film transistor 74a and the second thin film transistor 74b, and a planarization film 78 is formed over the protective insulating film 76, and then the first electrode 79 is formed to be connected to a wiring 93f in a contact hole formed in the planarization film 78 and a protective insulating film 67. The planarization film 78 is preferably formed using an organic resin such as acrylic, polyimide, or polyamide, or a siloxane polymer. Since the first electrode 79 is uneven in the contact hole, a partition wall 91 having an opening portion and covering the uneven portion of the first electrode 79 is provided. In the opening portion of the partition wall 91, an EL layer 92 is formed so as to be in contact with the first electrode 79, and a second electrode 93 is formed so as to cover the EL layer 92. A protective insulating film 95 is formed so as to cover the second electrode 93 and the partition wall 91.

Here, the light-emitting element 94 with a top emission structure is shown as a light-emitting element. Note that the light-emitting element 94 with a top emission structure can emit light even in a case where it is over the first thin film transistor 74a or the second thin film transistor 74b; thus, a light emission area can be increased. However, if a base film of the EL layer 92 is uneven, the thickness is nonuniform due to unevenness, and the second electrode 93 and the first electrode 79 are short-circuited, so that a display defect is caused. Therefore, it is preferable to provide the planarization film 78.

The light-emitting element 94 corresponds to a region where the first electrode 79 and the second electrode 93 sandwich the EL layer 92. In a case of the pixel shown in FIG. 31B, light from the light-emitting element 94 is emitted to the second electrode 93 side as shown by an outline arrow.

As the first electrode 79 functioning as a cathode, a known material can be used as long as it has a low work function and reflects light. For example, Ca, Al, CaF, MgAg, AlLi, or the like is preferably used. The EL layer 92 may be formed using a single layer or by stacking a plurality of layers. When the EL layer 92 is formed using a plurality of layers, an electron-injecting layer, an electron-transporting layer, a light-emitting layer, a hole-transporting layer, and a hole-injecting layer are stacked in this order over the first electrode 79 functioning as a cathode. Note that all of these layers are not necessarily provided. The second electrode 93 functioning as an anode is formed using a light-transmitting conductive material which transmits light, for example, a light-transmitting conductive film of indium oxide including tungsten oxide, indium zinc oxide including tungsten oxide, indium oxide including titanium oxide, indium tin oxide including titanium oxide, ITO, indium zinc oxide, or indium tin oxide to which silicon oxide is added may be used.

Here, a light-emitting element with a top emission structure in which light emission is extracted through a surface opposite a substrate side is described; however, a light-emitting element with a bottom emission structure in which light emission is extracted through a surface on the substrate side, or a light-emitting element with a dual emission structure in which light emission is extracted through the surface opposite the substrate side and the surface on the substrate side can be employed as appropriate.

Although an organic EL element is described here as a light-emitting element, an inorganic EL element can also be provided as a light-emitting element.

Note that, in this embodiment mode, an example in which a thin film transistor for controlling the driving of a light-emitting element (the driving thin film transistor) is electrically connected to the light-emitting element is described; however, a thin film transistor for controlling current may be connected between the driving thin film transistor and the light-emitting element.

Through the above process, a light-emitting device can be manufactured. Since an inverted staggered thin film transistor with a small amount of off current and excellent electric characteristics is used in the light-emitting device of this embodiment mode, a light-emitting device with high contrast and high visibility can be manufactured.

Embodiment Mode 13

Next, a structure of a display panel, which is one mode of a display device of the present invention, is described below.

Figure 32A:
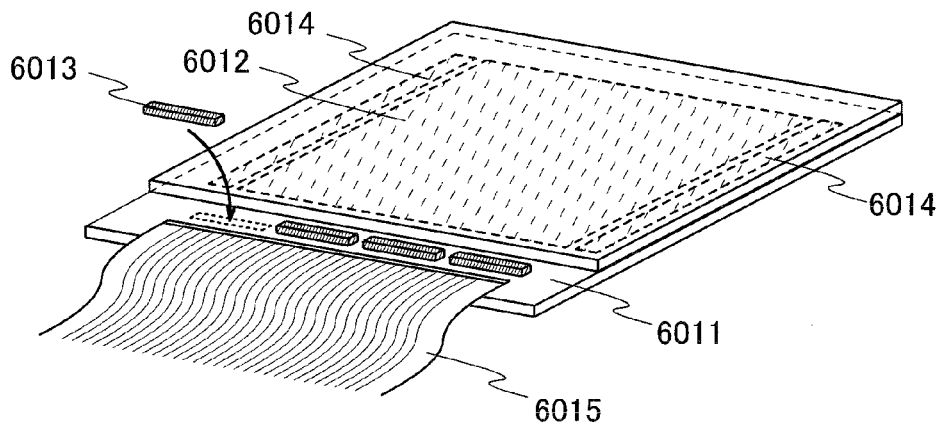
FIGS. 32A to 32C are perspective views illustrating display panels of the present invention.
Figure 32B:
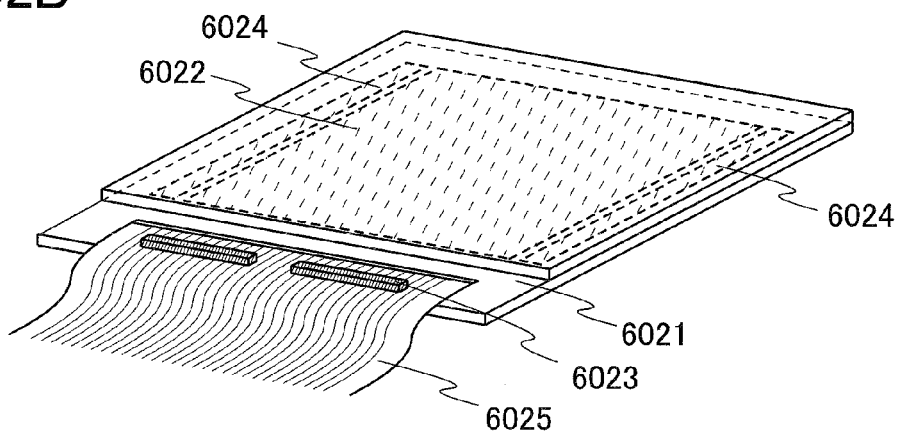
Figure 32C:
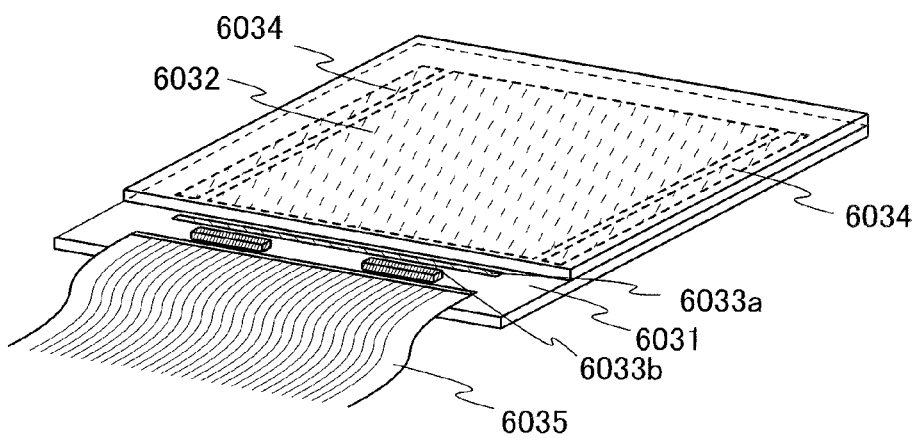

FIGS. 32A to 32C illustrate a mode of a display panel, in which a signal line driver circuit 6013 is formed separately and a pixel portion 6012 formed over a substrate 6011 is connected to the signal line driver circuit 6013. The pixel portion 6012 and a scan line driver circuit 6014 are each formed using a thin film transistor in which a microcrystalline semiconductor film is used for a channel formation region. When the signal line driver circuit is formed using a transistor which has higher field effect mobility compared with the thin film transistor in which the microcrystalline semiconductor film is used for the channel formation region, an operation of the signal line driver circuit which demands higher driving frequency than that of the scan line driver circuit can be stabilized. The signal line driver circuit 6013 may be formed using a transistor in which a single crystal semiconductor is used for a channel formation region, a thin film transistor in which a polycrystalline semiconductor is used for a channel formation region, or a transistor in which SOI is used for a channel formation region. The pixel portion 6012, the signal line driver circuit 6013, and the scan line driver circuit 6014 are each provided with potential of a power source, various signals, and the like through an FPC 6015. Further, a protection circuit may be provided between the signal line driver circuit 6013 and the FPC 6015 or between the signal line driver circuit 6013 and the pixel portion 6012. The protection circuit includes one or more elements selected from a thin film transistor, a diode, a resistor element, a capacitor element, and the like. Further, as a diode, the diode which forms Schottky junction shown in any of the above embodiment modes can be used.

Note that both the signal line driver circuit and the scan line driver circuit may be formed over the same substrate as that of the pixel portion.

Further, when the driver circuit is separately formed, a substrate provided with the driver circuit is not always required to be attached to a substrate provided with the pixel portion, and may be attached to, for example, the FPC. FIG. 32B illustrates a mode of a panel of a display device in which a signal line driver circuit 6023 is formed separately and a pixel portion 6022 and a scan line driver circuit 6024 that are formed over a substrate 6021 are connected to the signal line driver circuit 6023. The pixel portion 6022 and the scan line driver circuit 6024 are each formed using a thin film transistor in which a microcrystalline semiconductor film is used for a channel formation region. The signal line driver circuit 6023 is connected to the pixel portion 6022 through an FPC 6025. The pixel portion 6022, the signal line driver circuit 6023, and the scan line driver circuit 6024 are each provided with potential of a power source, a variety of signals, and the like through the FPC 6025. Further, a protection circuit may be provided between the signal line driver circuit 6023 and the FPC 6025 or between the signal line driver circuit 6023 and the pixel portion 6022.

Furthermore, only a part of the signal line driver circuit or only a part of the scan line driver circuit may be formed over the same substrate as that of the pixel portion with use of a thin film transistor in which a microcrystalline semiconductor film is used for a channel formation region, and the rest may be formed separately and electrically connected to the pixel portion. FIG. 32C illustrates a mode of a panel of a display device in which an analog switch 6033a included in the signal driver circuit is formed over a substrate 6031, over which a pixel portion 6032 and a scan line driver circuit 6034 are formed, and a shift register 6033b included in the signal line driver circuit is formed separately over a different substrate and then attached to the substrate 6031. The pixel portion 6032 and the scan line driver circuit 6034 are each formed using a thin film transistor in which a microcrystalline semiconductor film is used for a channel formation region. The shift resister 6033b included in the signal line driver circuit is connected to the pixel portion 6032 through an FPC 6035. The pixel portion 6032, the signal line driver circuit, and the scan line driver circuit 6034 are each provided with potential of a power source, a variety of signals, and the like through the FPC 6035. Further, a protection circuit may be provided between the signal line driver circuit 6033 and the FPC 6035 or between the signal line driver circuit 6033 and the pixel portion 6032.

As illustrated in FIGS. 32A to 32C, in the display device of this embodiment mode, an entire driver circuit or a part thereof can be formed over the same substrate as that of a pixel portion, using a thin film transistor in which a microcrystalline semiconductor films is used for a channel formation region.

Note that a connection method of a substrate formed separately is not particularly limited, and a known COG method, wire bonding method, TAB method, or the like can be used. Further, a connection position is not limited to the position illustrated in FIG. 28, as long as electrical connection is possible. Further, a controller, a CPU, a memory, or the like may be formed separately and connected.

Note that the signal line driver circuit used in the present invention includes a shift register and an analog switch. In addition to the shift register and the analog switch, another circuit such as a buffer, a level shifter, or a source follower may be included. Moreover, the shift register and the analog switch are not necessarily provided. For example, a different circuit such as a decoder circuit by which a signal line can be selected may be used instead of the shift register, or a latch or the like may be used instead of the analog switch.

Embodiment Mode 14

The display device obtained by the present invention or the like can be used for an active matrix display panel. That is, the present invention can be applied to all electronic devices incorporating them in display portions.

As examples of such electronic devices, the following can be given: cameras such as video cameras and digital cameras, head-mounted displays (goggle-type displays), car navigation systems, projectors, car stereos, personal computers, and portable information terminals (e.g., mobile computers, cellular phones, and e-book readers). FIGS. 33A to 33D show examples of such electronic devices.

Figure 33A:
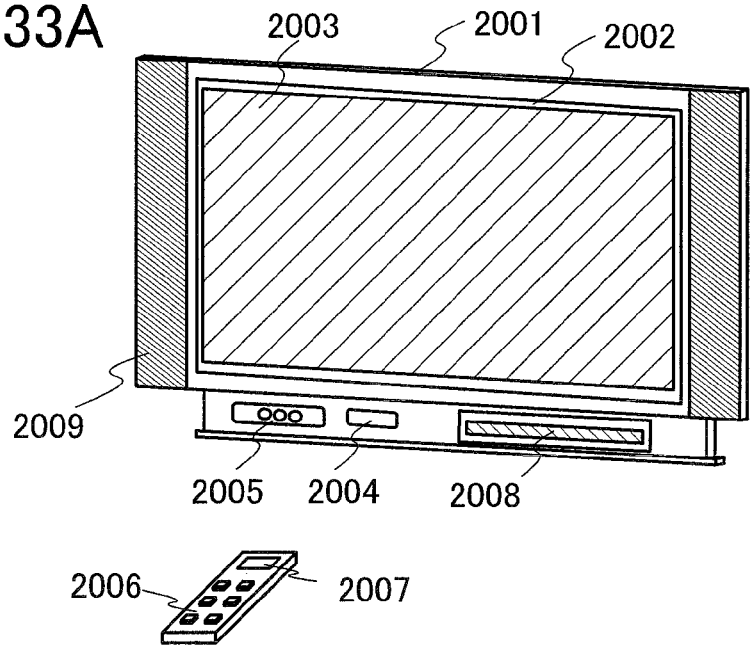
FIGS. 33A to 33D are perspective views each illustrating an electronic device using a display device of the present invention.

FIG. 33A illustrates a television device. A television device can be completed by incorporating a display panel into a housing as illustrated in FIG. 33A. A main screen 2003 is formed using the display panel, and a speaker portion 2009, operation switches, and the like are provided as other additional accessories. In such a manner, a television device can be completed.

As illustrated in FIG. 33A, a display panel 2002 using display elements is incorporated into a housing 2001, and in addition to reception of general television broadcast by a receiver 2005, communication of information in one direction (from a transmitter to a receiver) or in two directions (between a transmitter and a receiver or between receivers) can be performed by connection to a wired or wireless communication network via a modem 2004. The television device can be operated by using a switch incorporated in the housing or a separate remote control operator 2006. The remote control operator may be provided with a display portion 2007 which displays outputted data.

Further, the television device may include a sub-screen 2008 formed using a second display panel for displaying channels, volume, and the like, in addition to the main screen 2003. In this structure, the main screen 2003 may be formed with a liquid crystal display panel, and the sub-screen 2008 may be formed with a light-emitting display panel. In addition, the main screen 2003 may be formed with a light-emitting display panel, the sub-screen 2008 may be formed with a light-emitting display panel, and the sub-screen 2008 may be configured to be capable of flashing on and off.

Figure 34:
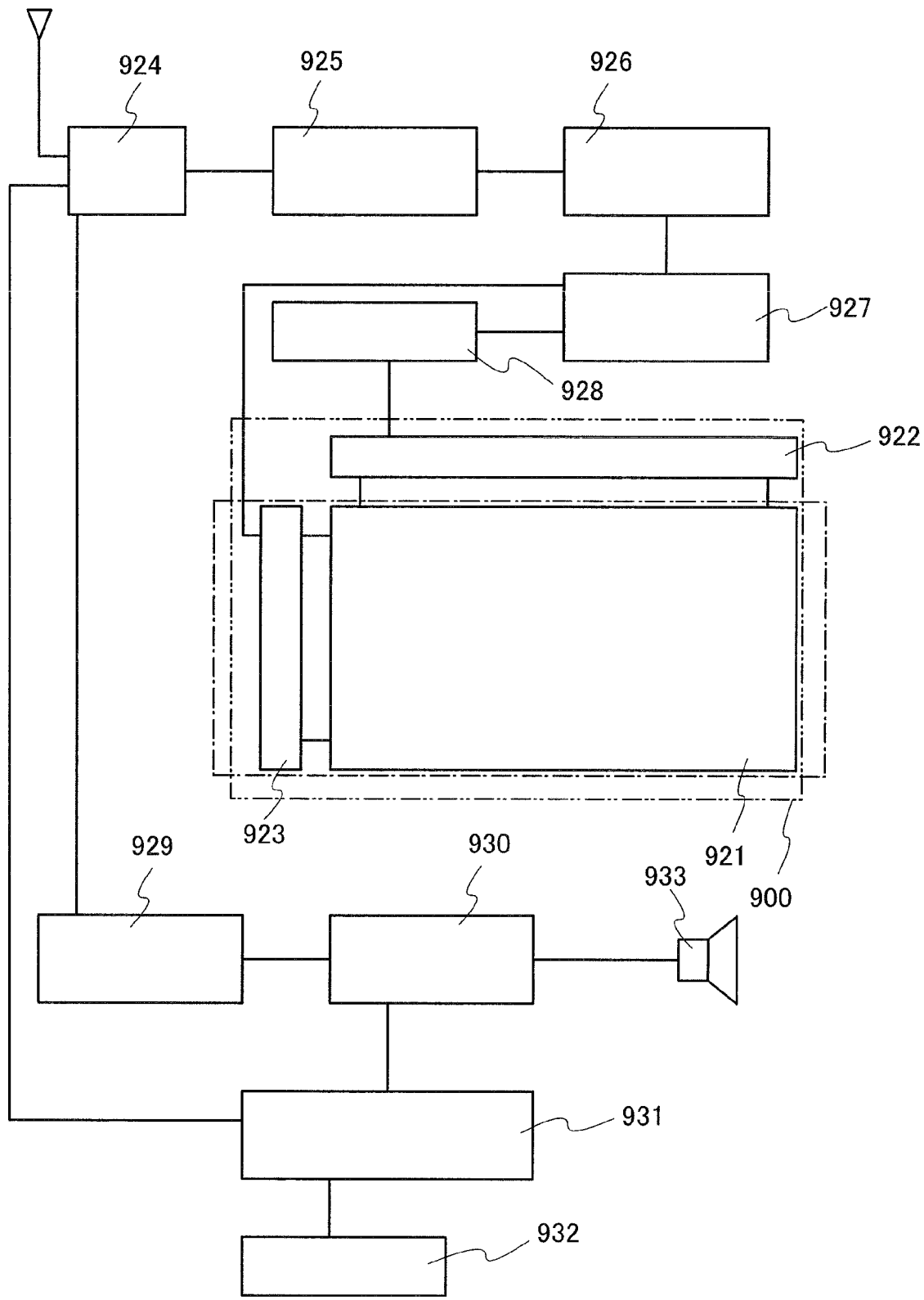
FIG. 34 is a diagram illustrating an electronic device using a display device of the present invention.

FIG. 34 is a block diagram showing the main structure of a television device. A display panel 900 is provided with a pixel portion 921. A signal line driver circuit 922 and a scan line driver circuit 923 may be mounted on the display panel 900 by a COG method.

As structures of other external circuits, a video signal amplifier circuit 925 amplifying a video signal among signals received by a tuner 924, a video signal processing circuit 926 converting signals output from the video signal amplifier circuit 925 into chrominance signals corresponding to red, green, and blue, a control circuit 927 for converting the video signal into a signal which meets input specifications of a driver IC, and the like are provided on an input side of the video signal. The control circuit 927 outputs signals to each of the scan line side and the signal line side. When digital driving is performed, a structure may be employed in which a signal dividing circuit 928 is provided on the signal line side and an input digital signal is divided into m signals to be supplied.

Among the signals received by the tuner 924, an audio signal is transmitted to an audio signal amplifier circuit 929, and an output thereof is supplied to a speaker 933 through an audio signal processing circuit 930. A control circuit 931 receives control information on receiving station (receiving frequency) and volume from an input portion 932 and transmits a signal to the tuner 924 and the audio signal processing circuit 930.

It is needless to say that the present invention is not limited to a use for a television device and the present invention can be used for various applications as a large display medium such as an information display board at train stations, airports, and the like, and an advertisement board on street as well as a monitor of a personal computer.

The display device described in any of the above embodiment modes is applied to the main screen 2003 and the sub-screen 2008, so that mass productivity of the television device in which an image quality of contrast or the like is improved can be increased.

Figure 33B:
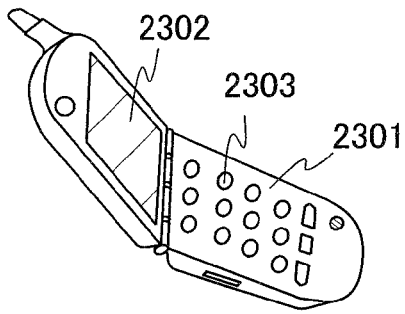

FIG. 33B illustrates one mode of a cellular phone 2301. The cellular phone 2301 includes a display portion 2302, an operation portion 2303, and the like. The display device described in any of the above embodiment modes is applied to the display portion 2302, so that mass productivity of the cellular phone in which an image quality of contrast or the like is improved can be increased.

Figure 33C:
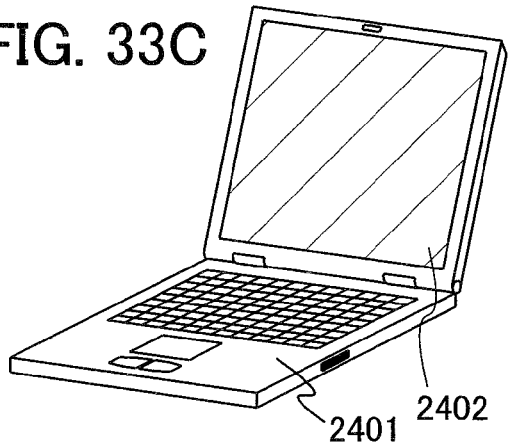

A portable computer illustrated in FIG. 33C includes a main body 2401, a display portion 2402, and the like. The display device described in any of the above embodiment modes is applied to the display portion 2402, so that mass productivity of the computer in which an image quality of contrast or the like can be increased.

Figure 33D:
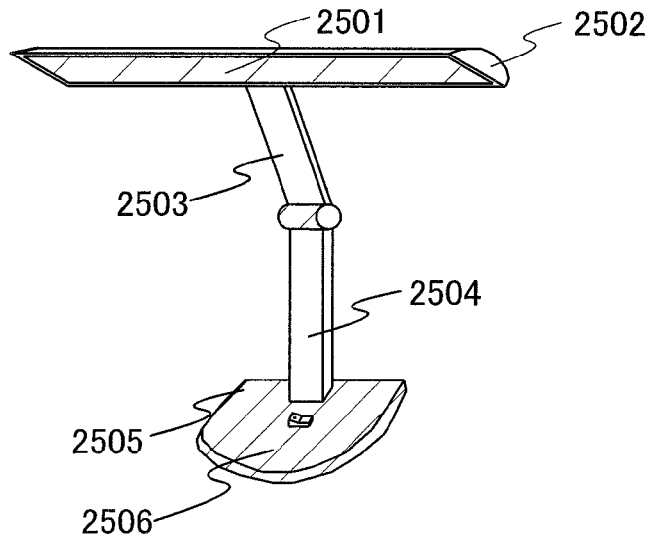

FIG. 33D illustrates a desk lamp including a lighting portion 2501, a shade 2502, an adjustable arm 2503, a support 2504, a base 2505, and a power source switch 2506. The desk lamp can be manufactured by applying the light-emitting device of the present invention to the lighting portion 2501. Note that a lamp includes a ceiling light, a wall light, and the like in its category. Use of the display device shown in any of the above embodiment modes can increase mass productivity and provide inexpensive desk lamps.

This application is based on Japanese Patent Application Serial No. 2007-330944 filed with Japan Patent Office on Dec. 21, 2007, the entire contents of which are hereby incorporated by reference.

What is claimed is:

1. A diode comprising:
    a microcrystalline semiconductor film containing an impurity element serving as a donor therein and provided over a gate electrode with a gate insulating film interposed therebetween in such a manner that the microcrystalline semiconductor film is provided in an inside of an edge portion of the gate electrode;
    an amorphous semiconductor film which covers top and side surfaces of the microcrystalline semiconductor film;
    an impurity semiconductor film containing an impurity element imparting one conductivity therein and provided over the amorphous semiconductor film; and
    a wiring which is in contact with a source region or a drain region of the impurity semiconductor film,
    wherein the gate electrode and the wiring are connected with each other through a conductive film.

2. A diode according to claim 1 wherein the amorphous semiconductor film or the microcrystalline semiconductor film and a common line are connected with each other through a second conductive film.

3. A diode according to claim 1,
    wherein an edge portion of the microcrystalline semiconductor film is overlapped with the amorphous semiconductor film and the impurity semiconductor film.

4. A diode according to claim 1,
    wherein a part of an edge portion of the amorphous semiconductor film is covered with a source electrode or a drain electrode.

5. A diode according to claim 1,
    wherein an edge portion of the amorphous semiconductor film is exposed to an outside of a source electrode and a drain electrode.

6. A diode according to claim 1,
    wherein the amorphous semiconductor film is provided to overlap with the microcrystalline semiconductor film.

7. A diode according to claim 1,
    wherein the microcrystalline semiconductor film is formed with a microcrystalline silicon film, a microcrystalline germanium film, or a microcrystalline silicon germanium film.

8. A diode according to claim 1,
wherein the microcrystalline semiconductor film has a stacked-layer structure of a microcrystalline silicon film and a microcrystalline germanium film.

9. A diode according to claim 1,
wherein the microcrystalline semiconductor film includes a crystal grain to which an impurity element serving as a donor is added and a germanium which covers the crystal grain.

10. A diode according to claim 1,
wherein an amorphous germanium film or an amorphous silicon germanium film is used instead of the microcrystalline semiconductor film.

11. A diode according to claim 1,
wherein the impurity element serving as a donor is phosphorus, arsenic, or antimony.

12. A display device including the diode according to claim 1.

13. A diode comprising:
a microcrystalline semiconductor film containing an impurity element serving as a donor therein and provided over a gate electrode with a gate insulating film interposed therebetween in such a manner that the microcrystalline semiconductor film is provided in an inside of an edge portion of the gate electrode;
an amorphous semiconductor film which covers top and side surfaces of the microcrystalline semiconductor film;
a pair of impurity semiconductor layers containing an impurity element imparting one conductivity therein and provided over the amorphous semiconductor film; and
a pair of wirings which are in contact with the pair of impurity semiconductor layers, respectively,
wherein the gate electrode and one of the wirings are connected with each other through a conductive film.

* * * * *